US008324626B2

(12) United States Patent
Kimura et al.

(10) Patent No.: US 8,324,626 B2
(45) Date of Patent: Dec. 4, 2012

(54) SEMICONDUCTOR DEVICE AND METHOD FOR MANUFACTURING THE SAME

(75) Inventors: Hajime Kimura, Kanagawa (JP); Hiroki Ohara, Kanagawa (JP); Masayo Kayama, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 187 days.

(21) Appl. No.: 12/851,006

(22) Filed: Aug. 5, 2010

(65) Prior Publication Data

US 2011/0031498 A1  Feb. 10, 2011

(30) Foreign Application Priority Data

Aug. 7, 2009  (JP) ................ 2009-184323

(51) Int. Cl.
*H01L 29/10* (2006.01)
*H01L 21/00* (2006.01)
(52) U.S. Cl. ........... 257/59; 257/E27.704; 257/E27.111; 438/34
(58) Field of Classification Search .......... 257/59, 257/71, 43, E21.704, E27.111; 438/34, 22, 438/671, 778
See application file for complete search history.

(56) References Cited

U.S. PATENT DOCUMENTS

| 5,731,856 | A  | 3/1998  | Kim et al.       |
|-----------|-----|---------|------------------|
| 5,744,864 | A  | 4/1998  | Cillessen et al. |
| 6,294,274 | B1 | 9/2001  | Kawazoe et al.   |
| 6,563,174 | B2 | 5/2003  | Kawasaki et al.  |
| 6,727,522 | B1 | 4/2004  | Kawasaki et al.  |
| 7,049,190 | B2 | 5/2006  | Takeda et al.    |
| 7,061,014 | B2 | 6/2006  | Hosono et al.    |
| 7,064,346 | B2 | 6/2006  | Kawasaki et al.  |
| 7,105,868 | B2 | 9/2006  | Nause et al.     |
| 7,211,825 | B2 | 5/2007  | Shih et al       |
| 7,282,782 | B2 | 10/2007 | Hoffman et al.   |
| 7,297,977 | B2 | 11/2007 | Hoffman et al.   |
| 7,323,356 | B2 | 1/2008  | Hosono et al.    |
| 7,385,224 | B2 | 6/2008  | Ishii et al.     |
| 7,402,506 | B2 | 7/2008  | Levy et al.      |
| 7,411,209 | B2 | 8/2008  | Endo et al.      |

(Continued)

FOREIGN PATENT DOCUMENTS

EP  1 737 044 A1  12/2006

(Continued)

OTHER PUBLICATIONS

SYRO booklet, Jul. 2001.*

(Continued)

*Primary Examiner* — A. Sefer
*Assistant Examiner* — Nikolay Yushin
(74) *Attorney, Agent, or Firm* — Fish & Richardson P.C.

(57) ABSTRACT

A semiconductor device includes a pixel portion having a first thin film transistor and a driver circuit having a second thin film transistor. Each of the first thin film transistor and the second thin film transistor includes a gate electrode layer, a gate insulating layer, a semiconductor layer, a source electrode layer, and a drain electrode layer. Each of the layers of the first thin film transistor has a light-transmitting property. Materials of the gate electrode layer, the source electrode layer and the drain electrode layer of the first thin film transistor are different from those of the second transistor, and each of the resistances of the second thin film transistor is lower than that of the first thin film transistor.

22 Claims, 32 Drawing Sheets

U.S. PATENT DOCUMENTS

| | | |
|---|---|---|
| 7,453,065 B2 | 11/2008 | Saito et al. |
| 7,453,087 B2 | 11/2008 | Iwasaki |
| 7,462,862 B2 | 12/2008 | Hoffman et al. |
| 7,468,304 B2 | 12/2008 | Kaji et al. |
| 7,501,293 B2 | 3/2009 | Ito et al. |
| 7,674,650 B2 | 3/2010 | Akimoto et al. |
| 7,732,819 B2 | 6/2010 | Akimoto et al. |
| 2001/0046027 A1 | 11/2001 | Tai et al. |
| 2002/0056838 A1 | 5/2002 | Ogawa |
| 2002/0132454 A1 | 9/2002 | Ohtsu et al. |
| 2003/0189401 A1 | 10/2003 | Kido et al. |
| 2003/0218222 A1 | 11/2003 | Wager et al. |
| 2004/0038446 A1 | 2/2004 | Takeda et al. |
| 2004/0127038 A1 | 7/2004 | Carcia et al. |
| 2005/0017302 A1 | 1/2005 | Hoffman |
| 2005/0199959 A1 | 9/2005 | Chiang et al. |
| 2006/0035452 A1 | 2/2006 | Carcia et al. |
| 2006/0043377 A1 | 3/2006 | Hoffman et al. |
| 2006/0091793 A1 | 5/2006 | Baude et al. |
| 2006/0108529 A1 | 5/2006 | Saito et al. |
| 2006/0108636 A1 | 5/2006 | Sano et al. |
| 2006/0110867 A1 | 5/2006 | Yabuta et al. |
| 2006/0113536 A1 | 6/2006 | Kumomi et al. |
| 2006/0113539 A1 | 6/2006 | Sano et al. |
| 2006/0113549 A1 | 6/2006 | Den et al. |
| 2006/0113565 A1 | 6/2006 | Abe et al. |
| 2006/0169973 A1 | 8/2006 | Isa et al. |
| 2006/0170111 A1 | 8/2006 | Isa et al. |
| 2006/0197092 A1 | 9/2006 | Hoffman et al. |
| 2006/0208977 A1 | 9/2006 | Kimura |
| 2006/0228974 A1 | 10/2006 | Thelss et al. |
| 2006/0231882 A1 | 10/2006 | Kim et al. |
| 2006/0238135 A1 | 10/2006 | Kimura |
| 2006/0244107 A1 | 11/2006 | Sugihara |
| 2006/0284171 A1 | 12/2006 | Levy et al. |
| 2006/0284172 A1 | 12/2006 | Ishii |
| 2006/0292777 A1 | 12/2006 | Dunbar |
| 2007/0024187 A1 | 2/2007 | Shin et al. |
| 2007/0046191 A1 | 3/2007 | Saito |
| 2007/0052025 A1 | 3/2007 | Yabuta |
| 2007/0054507 A1 | 3/2007 | Kaji et al. |
| 2007/0057261 A1 | 3/2007 | Jeong et al. |
| 2007/0072439 A1* | 3/2007 | Akimoto et al. ............ 438/795 |
| 2007/0090365 A1 | 4/2007 | Hayashi et al. |
| 2007/0108446 A1 | 5/2007 | Akimoto |
| 2007/0146592 A1 | 6/2007 | Kimura |
| 2007/0152217 A1 | 7/2007 | Lai et al. |
| 2007/0172591 A1 | 7/2007 | Seo et al. |
| 2007/0187678 A1 | 8/2007 | Hirao et al. |
| 2007/0187760 A1 | 8/2007 | Furuta et al. |
| 2007/0194379 A1 | 8/2007 | Hosono et al. |
| 2007/0252928 A1 | 11/2007 | Ito et al. |
| 2007/0272922 A1 | 11/2007 | Kim et al. |
| 2007/0287296 A1 | 12/2007 | Chang |
| 2008/0006877 A1 | 1/2008 | Mardilovich et al. |
| 2008/0038882 A1 | 2/2008 | Takechi et al. |
| 2008/0038929 A1 | 2/2008 | Chang |
| 2008/0050595 A1 | 2/2008 | Nakagawara et al. |
| 2008/0073653 A1 | 3/2008 | Iwasaki |
| 2008/0083950 A1 | 4/2008 | Pan et al. |
| 2008/0106191 A1 | 5/2008 | Kawase |
| 2008/0128689 A1 | 6/2008 | Lee et al. |
| 2008/0129195 A1 | 6/2008 | Ishizaki et al. |
| 2008/0166834 A1 | 7/2008 | Kim et al. |
| 2008/0182358 A1 | 7/2008 | Cowdery-Corvan et al. |
| 2008/0224133 A1 | 9/2008 | Park et al. |
| 2008/0254569 A1 | 10/2008 | Hoffman et al. |
| 2008/0258139 A1 | 10/2008 | Ito et al. |
| 2008/0258140 A1 | 10/2008 | Lee et al. |
| 2008/0258141 A1 | 10/2008 | Park et al. |
| 2008/0258143 A1 | 10/2008 | Kim et al. |
| 2008/0296568 A1 | 12/2008 | Ryu et al. |
| 2009/0068773 A1 | 3/2009 | Lai et al. |
| 2009/0073325 A1 | 3/2009 | Kuwabara et al. |
| 2009/0104723 A1 | 4/2009 | Hosoya et al. |
| 2009/0114910 A1 | 5/2009 | Chang |
| 2009/0134399 A1 | 5/2009 | Sakakura et al. |
| 2009/0140438 A1 | 6/2009 | Yamazaki et al. |
| 2009/0148970 A1 | 6/2009 | Hosoya et al. |
| 2009/0152506 A1 | 6/2009 | Umeda et al. |
| 2009/0152541 A1 | 6/2009 | Maekawa et al. |
| 2009/0227076 A1 | 9/2009 | Miyairi |
| 2009/0278122 A1 | 11/2009 | Hosono et al. |
| 2009/0280600 A1 | 11/2009 | Hosono et al. |
| 2010/0065844 A1 | 3/2010 | Tokunaga |
| 2010/0092800 A1 | 4/2010 | Itagaki et al. |
| 2010/0102315 A1 | 4/2010 | Suzawa et al. |
| 2010/0109002 A1 | 5/2010 | Itagaki et al. |

FOREIGN PATENT DOCUMENTS

| | | | |
|---|---|---|---|
| EP | 2 226 847 A2 | 9/2010 | |
| JP | 60-198861 A | 10/1985 | |
| JP | 63-210022 A | 8/1988 | |
| JP | 63-210023 A | 8/1988 | |
| JP | 63-210024 A | 8/1988 | |
| JP | 63-215519 A | 9/1988 | |
| JP | 63-239117 A | 10/1988 | |
| JP | 63-265818 A | 11/1988 | |
| JP | 05-251705 A | 9/1993 | |
| JP | 08-264794 A | 10/1996 | |
| JP | 11-505377 A | 5/1999 | |
| JP | 2000-044236 A | 2/2000 | |
| JP | 2000-150900 A | 5/2000 | |
| JP | 2002-076356 A | 3/2002 | |
| JP | 2002-289859 A | 10/2002 | |
| JP | 2003-086000 A | 3/2003 | |
| JP | 2003-086808 A | 3/2003 | |
| JP | 2004-103957 A | 4/2004 | |
| JP | 2004-273614 A | 9/2004 | |
| JP | 2004-273732 A | 9/2004 | |
| JP | 2007-081362 A | 3/2007 | |
| JP | 2007-123700 A | 5/2007 | |
| WO | 2004/114391 A1 | 12/2004 | |

OTHER PUBLICATIONS

Ohara, H et al., "Amorphous In-Ga-Zn-Oxide TFTs with Suppressed Variation for 4.0 inch QVGA AMOLED Display," AM-FPD '09 Digest of Technical Papers, Jul. 1, 2009, pp. 227-230, The Japan Society of Applied Physics.

Orita, M et al., "Amorphous transparent conductive oxide InGaO3(ZnO)m (m<4):a Zn4s conductor," Philosophical Magazine, 2001, vol. 81, No. 5, pp. 501-515.

Orita, M et al., "Mechanism of Electrical Conductivity of Transparent InGaZnO4," Phys. Rev. B (Physical Review B), Jan. 15, 2000, vol. 61, No. 3, pp. 1811-1816.

Osada, T et al., "15.2: Development of Driver-Integrated Panel using Amorphous In-Ga-Zn-Oxide TFT," SID Digest '09 : SID International Symposium Digest of Technical Papers, May 31, 2009, pp. 184-187.

Osada, T et al., "Development of Driver-Integrated Panel Using Amorphous In-Ga-Zn-Oxide TFT," AM-FPD '09 Digest of Technical Papers, Jul. 1, 2009, pp. 33-36.

Park, J et al., "Dry etching of ZnO films and plasma-induced damage to optical properties," J. Vac. Sci. Technol. B (Journal of Vacuum Science & Technology B), Mar. 1, 2003, vol. 21, No. 2, pp. 800-803.

Park, J et al., "Improvements in the Device Characteristics of Amorphous Indium Gallium Zinc Oxide Thin-Film Transistors by Ar Plasma Treatment," Appl. Phys. Lett. (Applied Physics Letters), Jun. 26, 2007, vol. 90, No. 26, pp. 262106-1-262106-3.

Park, J et al., "Electronic Transport Properties of Amorphous Indium-Gallium-Zinc Oxide Semiconductor Upon Exposure to Water," Appl. Phys. Lett. (Applied Physics Letters), 2008, vol. 92, pp. 072104-1-072104-3.

Park, J et al., "High performance amorphous oxide thin film transistors with self-aligned top-gate structure," IEDM 09: Technical Digest of International Electron Devices Meeting, Dec. 7, 2009, pp. 191-194.

Park, Sang-Hee et al., "42.3: Transparent ZnO Thin Film Transistor for the Application of High Aperture Ratio Bottom Emission AM-OLED Display," SID Digest '08 : SID International Symposium Digest of Technical Papers, May 20, 2008, vol. 39, pp. 629-632.

Park, J et al., "Amorphous Indium-Gallium-Zinc Oxide TFTS and Their Application for Large Size AMOLED," AM-FPD '08 Digest of Technical Papers, Jul. 2, 2008, pp. 275-278.

Park, S et al., "Challenge to Future Displays: Transparent AM-OLED Driven by Peald Grown ZnO TFT," IMID '07 Digest, 2007, pp. 1249-1252.

Prins, M et al., "A Ferroelectric Transparent Thin-Film Transistor," Appl. Phys. Lett. (Applied Physics Letters), Jun. 17, 1996, vol. 68, No. 25, pp. 3650-3652.

Sakata, J et al., "Development of 4.0-in. AMOLED Display With Driver Circuit Using Amorphous In-Ga-Zn-Oxide TFTS," IDW '09 : Proceedings of the 16th International Display Workshops, 2009, pp. 689-692.

Son, K et al., "42.4L: Late-News Paper: 4 Inch QVGA AMOLED Driven by the Threshold Voltage Controlled Amorphous Gizo (Ga2O3-In2O3-ZnO) TFT," SID Digest '08 : SID International Symposium Digest of Technical Papers, May 20, 2008, vol. 39, pp. 633-636.

Takahashi, M et al., "Theoretical Analysis of IGZO Transparent Amorphous Oxide Semiconductor," IDW '08 : Proceedings of the 15th International Display Workshops, Dec. 3, 2008, pp. 1637-1640.

Tsuda K et al., "Ultra Low Power Consumption Technologies for Moblie TFT-LCDs," IDW '02 : Proceedings of the 9th International Display Workshops, Dec. 4, 2002, pp. 295-298.

Ueno, K et al., "Field-Effect Transistor on SrTiO3 With Sputtered Al2O3 Gate Insulator," Appl. Phys. Lett. (Applied Physics Letters), Sep. 1, 2003, vol. 83, No. 9, pp. 1755-1757.

Van De Walle, C, "Hydrogen as a Cause of Doping in Zinc Oxide," Phys. Rev. Lett. (Physical Review Letters), Jul. 31, 2000, vol. 85, No, 5, pp. 1012-1015.

Asakuma, N et al., "Crystallization and Reduction of Sol-Gel-Derived Zinc Oxide Films by Irradiation With Ultraviolet Lamp," Journal of Sol-Gel Science and Technology, 2003, vol. 26, pp. 181-184.

Asaoka, Y et al., "29.1: Polarizer-Free Reflective LCD Combined With Ultra Low-Power Driving Technology," SID Digest '09 : SID International Symposium Digest of Technical Papers, 2009, pp. 395-398.

Chern, H et al., "An Analytical Model for the Above-Threshold Characteristics of Polysilicon Thin-Film Transistors," IEEE Transactions on Electron Devices, Jul. 1, 1995, vol. 42, No. 7, pp. 1240-1246.

Cho, D et al., "21.2: Al and Sn-Doped Zinc Indium Oxide Thin Film Transistors for AMOLED Back-Plane," SID Digest '09 : SID International Symposium Digest of Technical Papers, May 31, 2009, pp. 280-283.

Clark, S et al., "First Principles Methods Using CASTEP," Zeitschrift fur Kristallographie, 2005, vol. 220, pp. 567-570.

Coates. D et al., "Optical Studies of the Amorphous Liquid-Cholesteric Liquid Crystal Transition: The Blue Phase," Physics Letters, Sep. 10, 1973, vol. 45A, No. 2, pp. 115-116.

Costello, M et al., "Electron Microscopy of a Cholesteric Liquid Crystal and Its Blue Phase," Phys. Rev. A (Physical Review. A), May 1, 1984, vol. 29, No. 5, pp. 2957-2959.

Dembo, H et al., "RFCPUS on Glass and Plastic Substrates Fabricated by TFT Transfer Technology," IEDM 05: Technical Digest of International Electron Devices Meeting, Dec. 5, 2005, pp. 1067-1069.

Fortunato, E et al., "Wide-Bandgap High-Mobility ZNO Thin-Film Transistors Produced At Room Temperature," Appl. Phys. Lett. (Applied Physics Letters), Sep. 27, 2004, vol. 85, No. 13, pp. 2541-2543.

Fung, T et al., "2-D Numerical Simulation of High Performance Amorphous In-Ga-Zn-O TFTs for Flat Panel Displays," AM-FPD '08 Digest of Technical Papers, Jul. 2, 2008, pp. 251-252, The Japan Society of Applied Physics.

Godo, H et al., "P-9: Numerical Analysis on Temperature Dependence of Characteristics of Amorphous In-Ga-Zn-Oxide TFT," SID Digest '09 : SID International Symposium Digest of Technical Papers, May 31, 2009, pp. 1110-1112.

Godo, H et al., "Temperature Dependence of Characteristics and Electronic Structure for Amorphous In-Ga-Zn-Oxide TFT," AM-FPD '09 Digest of Technical Papers, Jul. 1, 2009, pp. 41-44.

Hayashi, R et al., "42.1: Invited Paper: Improved Amorphous In-Ga-Zn-O TFTS," SID Digest '08 : SID International Symposium Digest of Technical Papers, May 20, 2008, vol. 39, pp. 621-624.

Hirao, T et al., "Novel Top-Gate Zinc Oxide Thin-Film Transistors (ZnO TFTS) for AMLCDS," Journal of the SID , 2007, vol. 15, No. 1, pp. 17-22.

Hosono, H et al., "Working hypothesis to explore novel wide band gap electrically conducting amorphous oxides and examples," J. Non-Cryst. Solids (Journal of Non-Crystalline Solids), 1996, vol. 198-200, pp. 165-169.

Hosono, H, "68.3: Invited Paper:Transparent Amorphous Oxide Semiconductors for High Performance TFT," SID Digest '07 : SID International Symposium Digest of Technical Papers, 2007, vol. 38, pp. 1830-1833.

Hsieh, H et al., "P-29: Modeling of Amorphous Oxide Semiconductor Thin Film Transistors and Subgap Density of States," SID Digest '08 : SID International Symposium Digest of Technical Papers, 2008, vol. 39, pp. 1277-1280.

Ikeda., T et al., "Full-Functional System Liquid Crystal Display Using CG-Silicon Technology," SID Digest '04 : SID International Symposium Digest of Technical Papers, 2004, vol. 35, pp. 860-863.

Janotti, A et al., "Native Point Defects in ZnO," Phys. Rev. B (Physical Review. B), 2007, vol. 76, No. 16, pp. 165202-1-165202-22.

Janotti, A et al., "Oxygen Vacancies in ZnO," Appl. Phys. Lett. (Applied Physics Letters), 2005, vol. 87, pp. 122102-1-122102-3.

Jeong, J et al., "3.1: Distinguished Paper: 12.1-Inch WXGA AMOLED Display Driven by Indium-Gallium-Zinc Oxide TFTs Array," SID Digest '08 : SID International Symposium Digest of Technical Papers, May 20, 2008, vol. 39, No. 1, pp. 1-4.

Jin, D et al., "65.2: Distinguished Paper:World-Largest (6.5") Flexible Full Color Top Emission AMOLED Display on Plastic Film and Its Bending Properties," SID Digest '09 : SID International Symposium Digest of Technical Papers, May 31, 2009, pp. 983-985.

Kanno, H et al., "White Stacked Electrophosphorecent Organic Light-Emitting Devices Employing MOO3 as a Charge-Generation Layer," Adv. Mater. (Advanced Materials), 2006, vol. 18, No. 3, pp. 339-342.

Kikuchi, H et al., "39.1: Invited Paper: Optically Isotropic Nano-Structured Liquid Crystal Composites for Display Applications," SID Digest '09 : SID International Symposium Digest of Technical Papers, May 31, 2009, pp. 578-581.

Kikuchi, H et al., "62.2: Invited Paper: Fast Electro-Optical Switching in Polymer-Stabilized Liquid Crystalline Blue Phases for Display Application," SID Digest '07 : SID International Symposium Digest of Technical Papers, 2007, vol. 38, pp. 1737-1740.

Kikuchi, H et al., "Polymer-Stabilized Liquid Crystal Blue Phases,", Nature Materials, Sep. 1, 2002, vol. 1, pp. 64-68.

Kim, S et al., "High-Performance oxide thin film transistors passivated by various gas plasmas," The Electrochemical Society, 214th ECS Meeting, 2008, No. 2317, 1 page.

Kimizuka, N et al., "SPINEL, YBFE2O4, and YB2FE3O7 Types of Structures for Compounds in the IN2O3 and SC2O3-A2O3-BO Systems [A; Fe, Ga, or Al; B: Mg, Mn, Fe, Ni, Cu,or Zn] at Temperatures Over 1000° C.," Journal of Solid State Chemistry, 1985, vol. 60, pp. 382-384.

Kimizuka, N et al., "Syntheses and Single-Crystal Data of Homologous Compounds, In2O3(ZnO)m (m = 3, 4, and 5), InGaO3(ZnO)3, and Ga2O3(ZnO)m (m = 7, 8, 9, and 16) in the In2O3-ZnGa2O4-ZnO System," Journal of Solid State Chemistry, Apr. 1, 1995, vol. 116, No. 1, pp. 170-178.

Kitzerow, H et al., "Observation of Blue Phases in Chiral Networks," Liquid Crystals, 1993, vol. 14, No. 3, pp. 911-916.

Kurokawa, Y et al., "UHF RFCPUS on Flexible and Glass Substrates for Secure RFID Systems," Journal of Solid-State Circuits , 2008, vol. 43, No. 1, pp. 292-299.

Lany, S et al., "Dopability, Intrinsic Conductivity, and Nonstoichiometry of Transparent Conducting Oxides," Phys. Rev. Lett. (Physical Review Letters), Jan. 26, 2007, vol. 98, pp. 045501-1-045501-4.

Lee, H et al., "Current Status of, Challenges to, and Perspective View of AM-OLED," IDW '06 : Proceedings of the 13th International Display Workshops, Dec. 7, 2006, pp. 663-666.

Lee, J et al., "World's Largest (15-Inch) XGA AMLCD Panel Using IGZO Oxide TFT," SID Digest '08 : SID International Symposium Digest of Technical Papers, May 20, 2008, vol. 39, pp. 625-628.

Lee, M et al., "15.4: Excellent Performance of Indium-Oxide-Based Thin-Film Transistors by DC Sputtering," SID Digest '09 : SID International Symposium Digest of Technical Papers, May 31, 2009, pp. 191-193.

Li, C et al., "Modulated Structures of Homologous Compounds InMO3(ZnO)m (M=In,Ga; m=Integer) Described by Four-Dimensional Superspace Group," Journal of Solid State Chemistry, 1998, vol. 139, pp. 347-355.

Masuda, S et al., "Transparent thin film transistors using ZnO as an active channel layer and their electrical properties," J. Appl. Phys. (Journal of Applied Physics), Feb. 1, 2003, vol. 93, No. 3, pp. 1624-1630.

Meiboom, S et al., "Theory of the Blue Phase of Cholesteric Liquid Crystals," Phys. Rev. Lett. (Physical Review Letters), May 4, 1981, vol. 46, No. 18, pp. 1216-1219.

Miyasaka, M, "SUFTLA Flexible Microelectronics on Their Way to Business," SID Digest '07 : SID International Symposium Digest of Technical Papers, 2007, vol. 38, pp. 1673-1676.

Mo, Y et al., "Amorphous Oxide TFT Backplanes for Large Size AMOLED Displays," IDW '08 : Proceedings of the 6th International Display Workshops, Dec. 3, 2008, pp. 581-584.

Nakamura, "Synthesis of Homologous Compound with New Long-Period Structure," NIRIM Newsletter, Mar. 1995, vol. 150, pp. 1-4 with English translation.

Nakamura, M et al., "The phase relations in the In2O3-Ga2ZnO4-ZnO system at 1350° C.," Journal of Solid State Chemistry, Aug. 1, 1991, vol. 93, No. 2, pp. 298-315.

Nomura, K et al., "Thin-Film Transistor Fabricated in Single-Crystalline Transparent Oxide Semiconductor," Science, May 23, 2003, vol. 300, No. 5623, pp. 1269-1272.

Nomura, K et al., "Amorphous Oxide Semiconductors for High-Performance Flexible Thin-Film Transistors," Jpn. J. Appl. Phys. (Japanese Journal of Applied Physics), 2006, vol. 45, No. 5B, pp. 4303-4308.

Nomura, K et al., "Room-Temperature Fabrication of Transparent Flexible Thin-Film Transistors Using Amorphous Oxide Semiconductors," Nature, Nov. 25, 2004, vol. 432, pp. 488-492.

Nomura, K et al., "Carrier transport in transparent oxide semiconductor with intrinsic structural randomness probed using single-crystalline InGaO3(ZnO)5 films," Appl. Phys. Lett. (Applied Physics Letters), Sep. 13, 2004, vol. 85, No. 11, pp. 1993-1995.

Nowatari, H et al., "60.2: Intermediate Connector With Suppressed Voltage Loss for White Tandem OLEDS," SID Digest '09 : SID International Symposium Digest of Technical Papers, May 31, 2009, vol. 40, pp. 899-902.

Oba, F et al., "Defect energetics in ZnO: A hybrid Hartree-Fock density functional study," Phys. Rev. B (Physical Review. B), 2008, vol. 77, pp. 245202-1-245202-6.

Oh, M et al., "Improving the Gate Stability of ZnO Thin-Film Transistors With Aluminum Oxide Dielectric Layers," J. Electrochem. Soc. (Journal of the Electrochemical Society), 2008, vol. 155, No. 12, pp. H1009-H1014.

Ohara, H et al., "21.3: 4.0 in. QVGA AMOLED Display Using In-Ga-Zn-Oxide TFTS With a Novel Passivation Layer," SID Digest '09 : SID International Symposium Digest of Technical Papers, May 31, 2009, pp. 284-287.

* cited by examiner

A  101 111 119a 120a 107a 110a 113a 119b 120b 123    107b 110b  B

C  208 107a 110a 113a 111  401a 400a 122  D 101 102 103

106a    106b 107a 108a    107b 108b 109a    109b

A                                    B

301 | 302 | 303

101 102 103

106e  106f  106g 107e 108e  107f 108f  107g 108g

E                                                                F 331  332  333  334

107a 110a    107b 110b 111  112

113a

A  114 115                                                              B

301 | 302 | 303

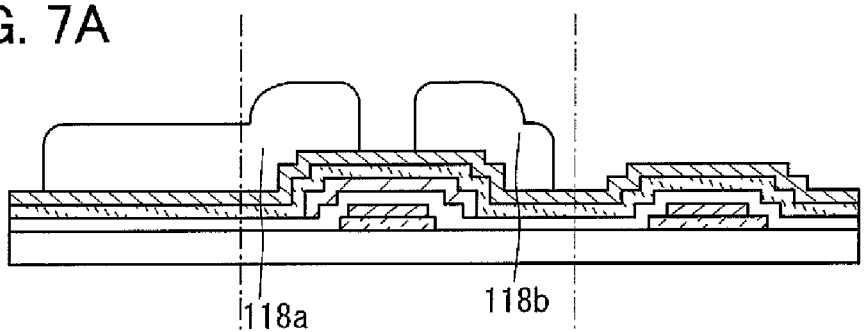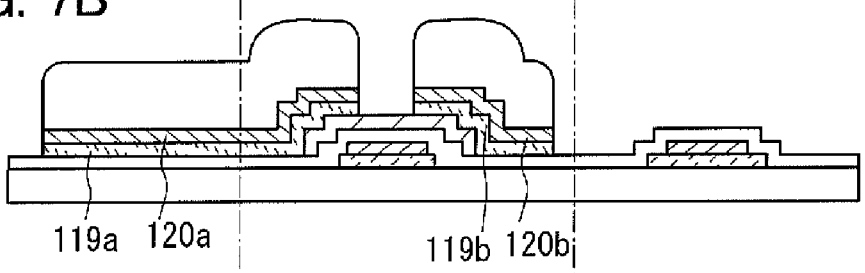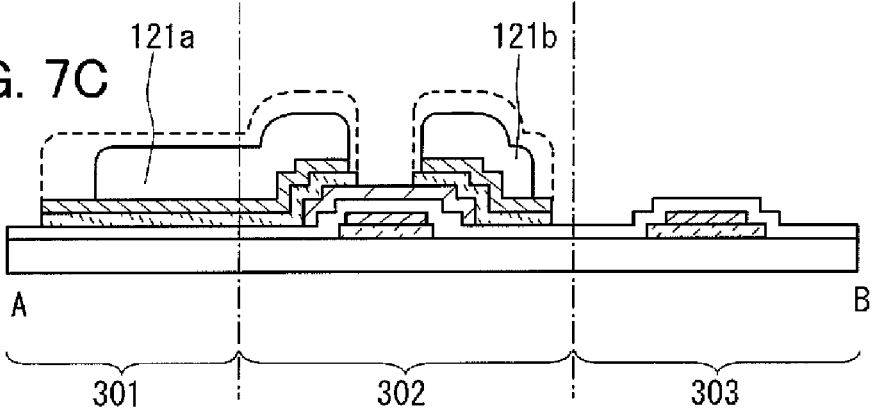

118h   118e   118g 119h 120h   119e 120e   120g   119g

E   120h   120e   F
331   332   333   334

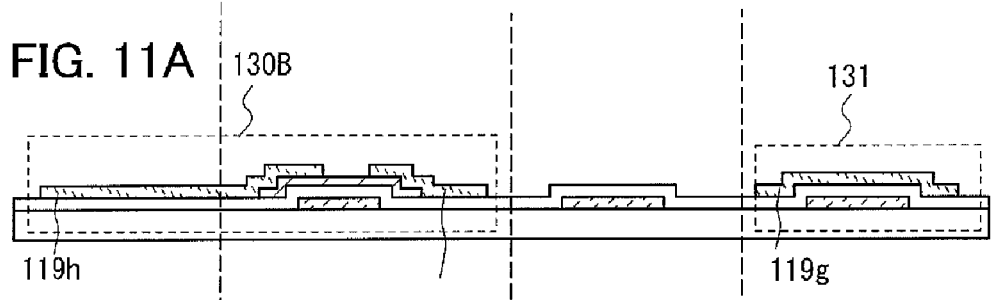
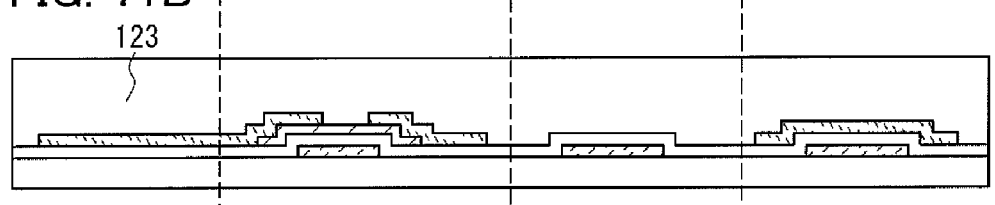
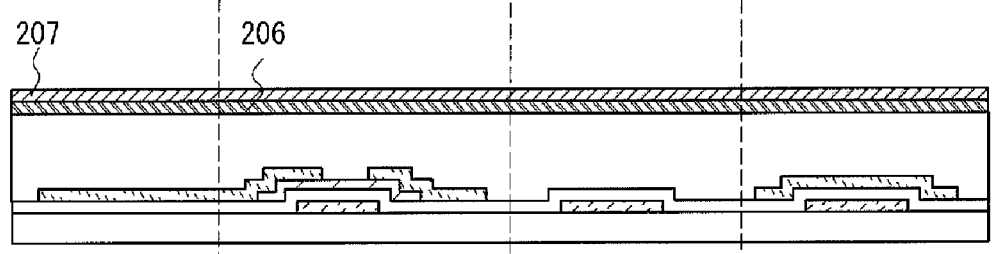
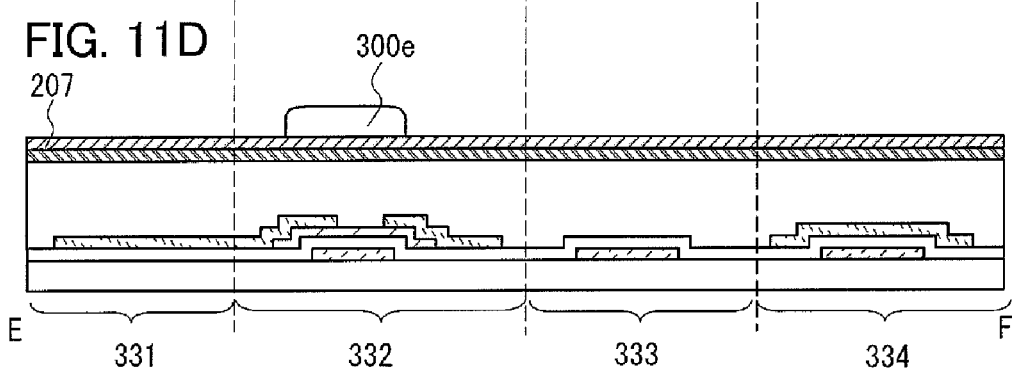

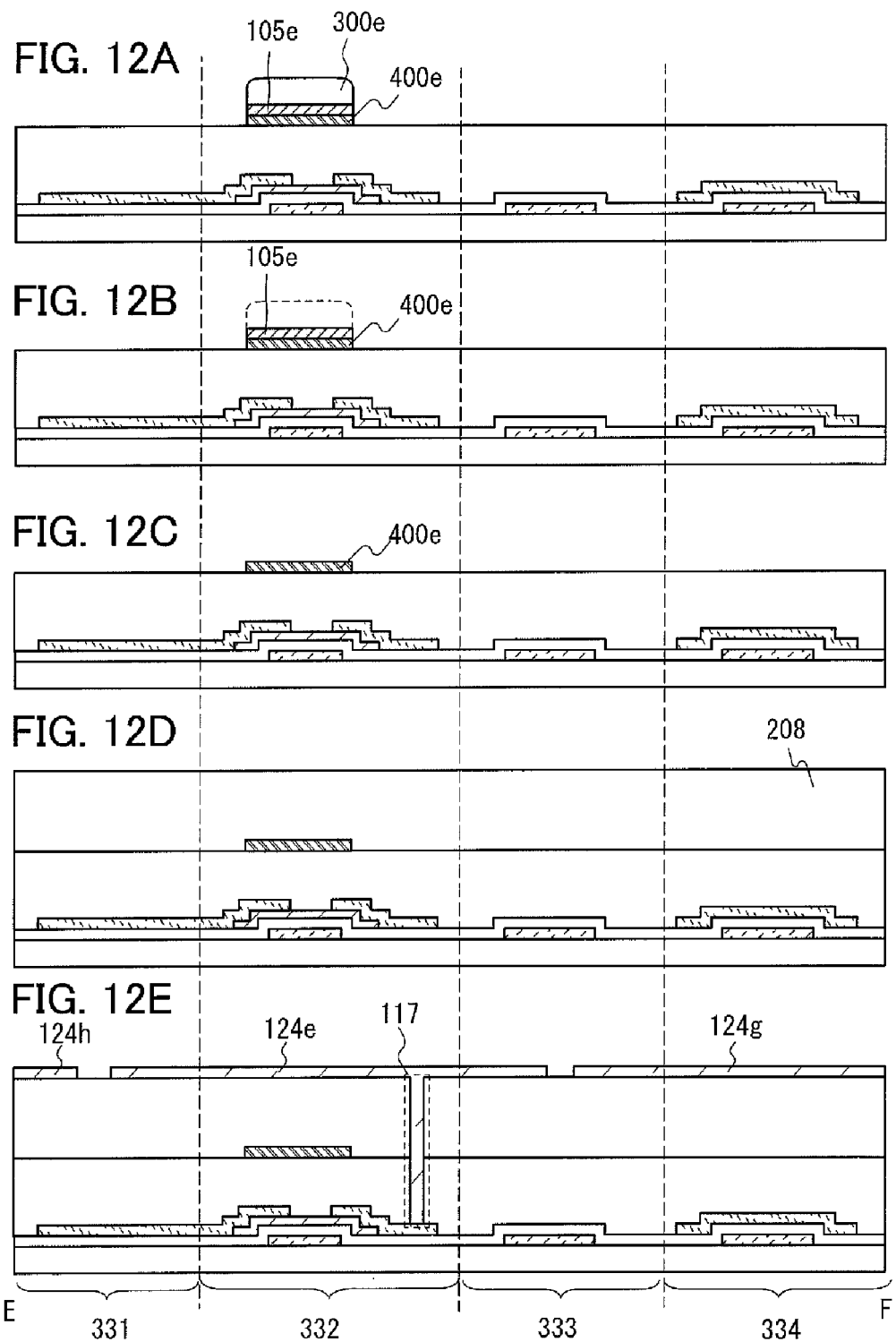

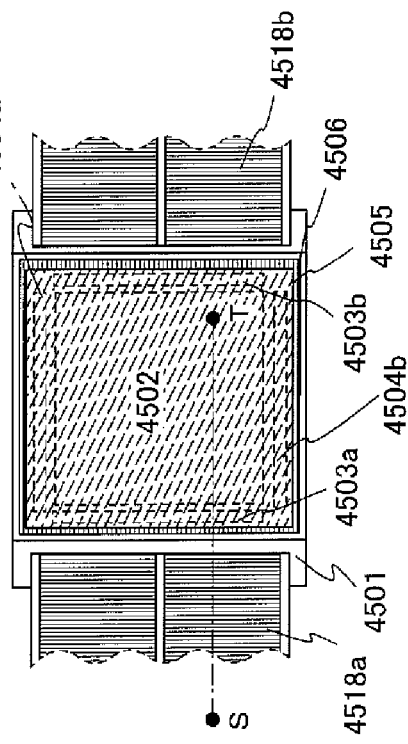
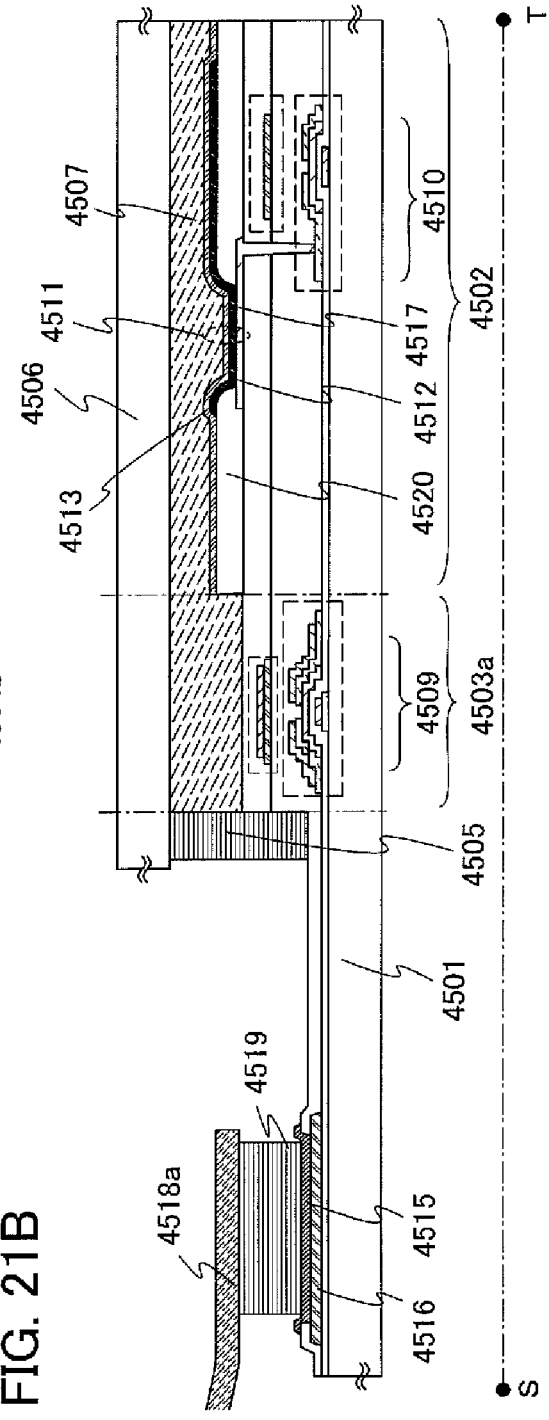
FIG. 21A
FIG. 21B

SEMICONDUCTOR DEVICE AND METHOD FOR MANUFACTURING THE SAME

BACKGROUND OF THE INVENTION

1. Field of the Invention

The present invention relates to semiconductor devices, display devices, manufacturing methods thereof, or methods for using the semiconductor devices or the display devices. In particular, the present invention relates to liquid crystal display devices including light-transmitting semiconductor layers, manufacturing methods thereof, or methods for using the liquid crystal display devices.

2. Description of the Related Art

In recent years, flat panel displays such as liquid crystal displays (LCDs) have been widely used. In particular, active matrix LCDs including a thin film transistor in each pixel have been often used. Further, a display device in which one or both of a source driver (a signal line driver circuit) and a gate driver (a scan line driver circuit) are formed over the same substrate as a pixel portion has developed. As the thin film transistor, a thin film transistor including amorphous silicon or polysilicon (polycrystalline silicon) as a semiconductor layer has been widely used.

Instead of such silicon materials, light-transmitting metal oxides have attracted attention. For example, In—Ga—Zn—O-based oxides and the like have been expected to be used as semiconductor materials needed in display devices such as liquid crystal displays. In particular, application of the In—Ga—Zn—O-based oxides and the like to channel layers of thin film transistors has been considered. Further, a technique for improving the aperture ratio with the use of a light-transmitting electrode as a gate electrode, a source electrode, or a drain electrode has been studied (see References 1 and 2).

REFERENCE

Reference 1: Japanese Published Patent Application No. 2007-123700
Reference 2: Japanese Published Patent Application No. 2007-081362

SUMMARY OF THE INVENTION

In general, in a display device in which one or both of a source driver and a gate driver are formed over the same substrate as a pixel portion as a driver circuit portion for controlling a thin film transistor in the pixel portion, a lead wiring such as a power supply line or a signal line led from an FPC terminal or the like, or a wiring for connecting an element to a different element (e.g., a wiring for connecting a thin film transistor to a different thin film transistor) is directly extended from conductive layers used for a gate electrode and a source electrode (a drain electrode) and is formed in the same island. Therefore, a wiring for connecting a gate of a thin film transistor to a gate of a different thin film transistor (such a wiring is referred to as a gate wiring) is formed using the same layer structure and material as a gate electrode of the thin film transistor; a wiring for connecting a source of the thin film transistor to a source of the different thin film transistor (such a wiring is referred to as a source wiring) is formed using the same layer structure and material as a source electrode of the thin film transistor; and a lead wiring such as a power supply line or a signal line is formed using the same layer structure and material as the gate wiring or the source wiring, in many cases. Therefore, in the case where a gate electrode and a source electrode (a drain electrode) are formed using light-transmitting materials, a lead wiring such as a power supply line or a signal line, a gate wiring and a source wiring in a driver circuit portion, and a gate wiring and a source wiring in a pixel portion are often formed using light-transmitting materials in a manner which is similar to that of the gate electrode and the source electrode (the drain electrode).

However, in general, a light-transmitting conductive material such as indium tin oxide (ITO), indium zinc oxide (IZO), or indium tin zinc oxide (ITZO) has a higher resistance value than a conductive material having a light-blocking property and reflectivity, such as aluminum (Al), molybdenum (Mo), titanium (Ti), tungsten (W), neodymium (Nd), copper (Cu), or silver (Ag). Therefore, when a lead wiring such as a power supply line or a signal line led from an FPC terminal or the like or a wiring in a driver circuit portion is formed using a light-transmitting conductive material, wiring resistance is increased. In particular, since the driver circuit portion needs to operate at high speed, when wiring resistance is increased, the waveform of a signal transmitted through the wiring is distorted, which impairs the high-speed operation of the driver circuit portion. Accordingly, it is difficult to supply accurate voltage and current, so that it is difficult for a pixel portion to perform normal display and operation.

In contrast, in the case where a gate electrode and a source electrode (a drain electrode) in the driver circuit portion are formed using light-blocking materials and the gate wiring and the source wiring are also formed using light-blocking conductive materials, the conductivity of the wirings is improved. Therefore, it is possible to suppress the increase in the wiring resistance of the lead wiring such as the power supply line or the signal line led from the FPC terminal or the like and distortion in the waveform of the signal in the driver circuit portion. Further, by forming a gate electrode and a source electrode (a drain electrode) in the pixel portion with the use of light-transmitting materials, the aperture ratio can be improved and power consumption can be reduced.

In addition, in terms of display performance, high storage capacitance and higher aperture ratio are demanded for pixels. Pixels each having high aperture ratio improve light use efficiency, so that power saving and miniaturization of a display device can be achieved. In recent years, the size of pixels has been made smaller and higher-resolution images have been demanded. However, the decrease in the size of pixels results in a large area where a thin film transistor and a wiring are formed in one pixel, so that the aperture ratio of the pixels is lowered. Therefore, in order to obtain high aperture ratio in each pixel in a specified size, it is necessary to lay out circuit components needed for the circuit structure of the pixel efficiently.

Further, a thin film transistor including a light-transmitting semiconductor layer tends to be normally on and the threshold voltage of the thin film transistor is unstable; thus, it is difficult to perform high-speed operation particularly in a driver circuit portion.

It is an object of one embodiment of the present invention to reduce the manufacturing cost of a semiconductor device.

It is an object of one embodiment of the present invention to improve the aperture ratio of a pixel portion.

It is an object of one embodiment of the present invention to make a pixel portion have higher resolution.

It is an object of one embodiment of the present invention to improve the operation speed of a driver circuit portion.

It is an object of one embodiment of the present invention to improve the reliability of a semiconductor device.

One embodiment of the present invention is a semiconductor device which includes a pixel portion having a first thin film transistor and a driver circuit portion having a second thin film transistor, or a manufacturing method of the semiconductor device. A gate electrode (also referred to as a gate electrode layer), a source electrode (also referred to as a source electrode layer), and a drain electrode (also referred to as a drain electrode layer) of the first thin film transistor have light-transmitting properties. The resistance value of a gate electrode layer of the second thin film transistor is lower than that of the gate electrode layer of the first thin film transistor. The resistance value of a source electrode layer of the second thin film transistor is lower than that of the source electrode layer of the first thin film transistor. The resistance value of a drain electrode layer of the second thin film transistor is lower than that of the drain electrode layer of the first thin film transistor.

As an oxide semiconductor used in this specification, a thin film of a material expressed by $InMO_3(ZnO)_m$ (m>0) is formed, and a thin film transistor including the thin film as an oxide semiconductor layer is formed. Note that M denotes one or more metal elements selected from Ga, Fe, Ni, Mn, or Co. As an example, M might be Ga or might be Ga and the above metal element other than Ga, for example, M might be Ga and Ni or Ga and Fe. Further, in the oxide semiconductor, in some cases, a transitional metal element such as Fe or Ni or an oxide of the transitional metal is contained as an impurity element in addition to the metal element contained as M. In this specification, among oxide semiconductor layers whose composition formulae are expressed by $InMO_3(ZnO)_m$ (m>0), an oxide semiconductor which includes Ga as M is referred to as an In—Ga—Zn—O-based oxide semiconductor, and a thin film of the In—Ga—Zn—O-based oxide semiconductor is referred to as an In—Ga—Zn—O-based non-single-crystal film.

As a metal oxide used for the oxide semiconductor layer, any of the following metal oxides can be used in addition to the above metal oxide: an In—Sn—Zn—O-based metal oxide; an In—Al—Zn—O-based metal oxide; a Sn—Ga—Zn—O-based metal oxide; an Al—Ga—Zn—O-based metal oxide; a Sn—Al—Zn—O-based metal oxide; an In—Zn—O-based metal oxide; a Sn—Zn—O-based metal oxide; an Al—Zn—O-based metal oxide; an In—O-based metal oxide; a Sn—O-based metal oxide; and a Zn—O-based metal oxide. Silicon oxide may be contained in the oxide semiconductor layer formed using the above metal oxide.

The oxide semiconductor is preferably an oxide semiconductor containing In, more preferably, an oxide semiconductor containing In and Ga. Dehydration or dehydrogenation is effective in obtaining an i-type (intrinsic) oxide semiconductor layer.

Note that in this specification, a semiconductor device refers to all devices that can function by utilizing semiconductor properties, and display devices, semiconductor circuits, and electronic devices are all semiconductor devices.

In one embodiment of the present invention, the operation speed of a driver circuit and the aperture ratio of a pixel portion can be improved. In addition, in one embodiment of the present invention, the number of manufacturing steps can be reduced, so that manufacturing cost can be reduced. Further, in one embodiment of the present invention, a pixel portion can have higher resolution. Furthermore, in one embodiment of the present invention, the reliability of a semiconductor device can be improved.

BRIEF DESCRIPTION OF THE DRAWINGS

In the accompanying drawings:

FIGS. 7A to 7C are cross-sectional views illustrating a method for manufacturing a semiconductor device according to one embodiment of the present invention;

FIGS. 11A to 11D are cross-sectional views illustrating a method for manufacturing a semiconductor device according to one embodiment of the present invention;

FIGS. 12A to 12E are cross-sectional views illustrating a method for manufacturing a semiconductor device according to one embodiment of the present invention;

FIG. 21A is a top view of a semiconductor device according to one embodiment of the present invention, and FIG. 21B is a cross-sectional view of the semiconductor device;

DETAILED DESCRIPTION OF THE INVENTION

Figure 1A:
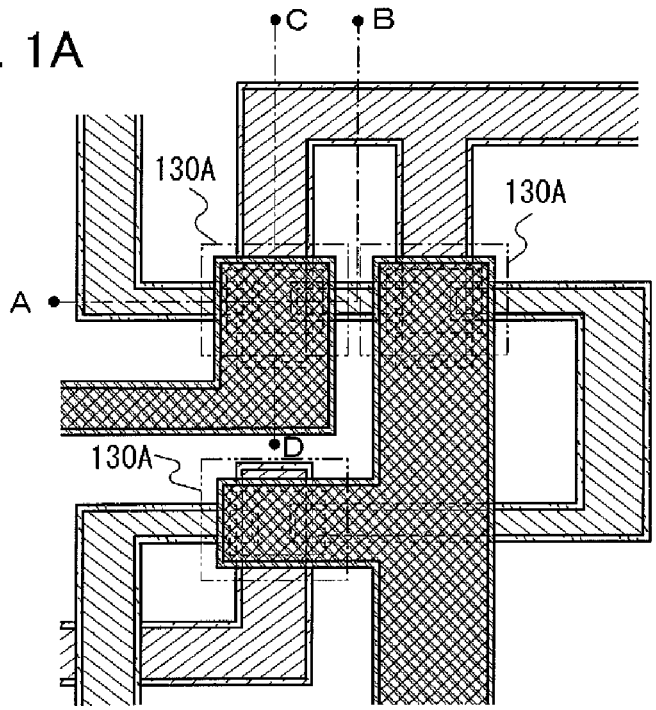
FIG. 1A is a top view of a semiconductor device according to one embodiment of the present invention.

Hereinafter, embodiments of the present invention will be described with reference to the drawings. Note that the present invention can be implemented in various ways and it will be readily appreciated by those skilled in the art that modes and details of the present invention can be changed in various ways without departing from the spirit and scope of the present invention. Therefore, the present invention should not be construed as being limited to the following description of the embodiments. Note that in structures described below, the same portions or portions having similar functions are denoted by common reference numerals in different drawings, and detailed description thereof will be omitted.

Embodiment 1

In this embodiment, a semiconductor device according to one embodiment of the present invention is described.

Figure 1B:
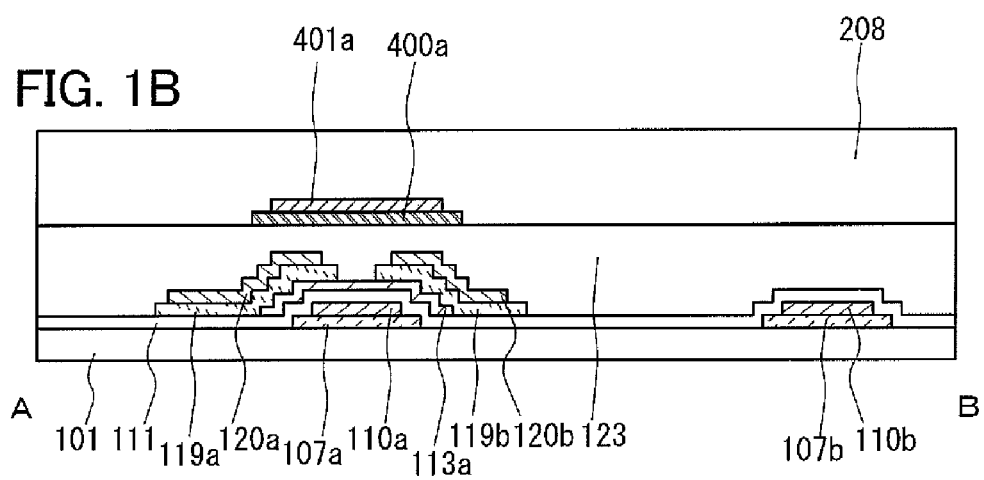
FIGS. 1B and 1C are cross-sectional views of the semiconductor device.
Figure 1C:
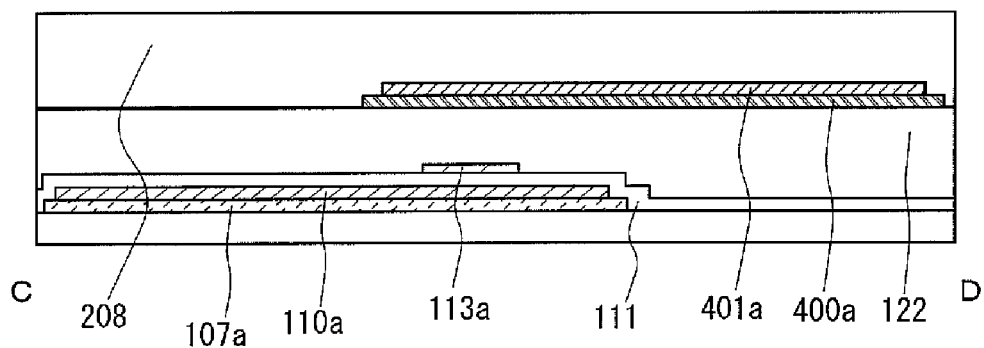
Figure 2A:
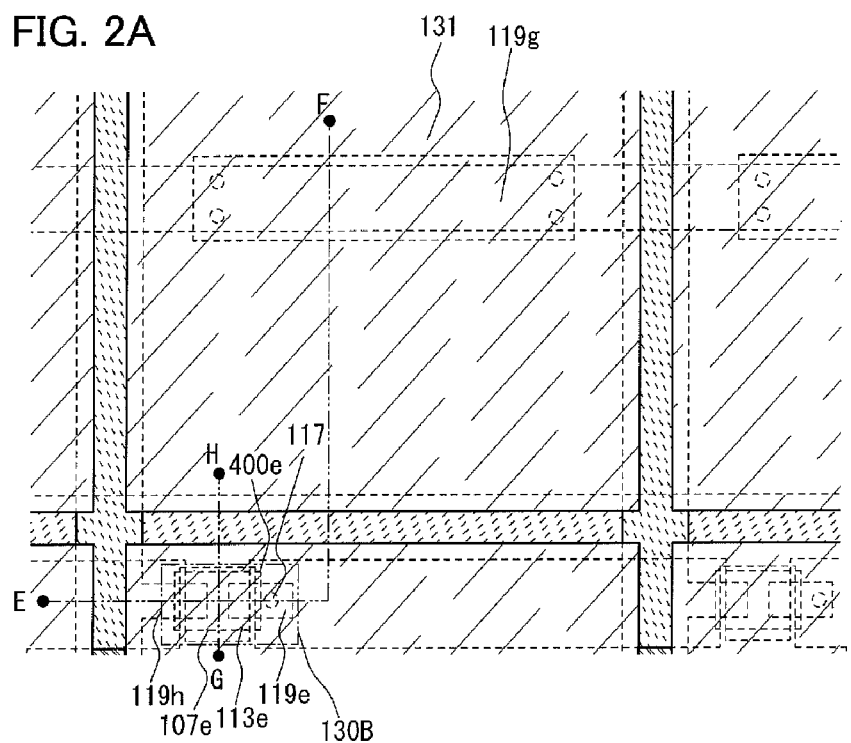
FIG. 2A is a top view of a semiconductor device according to one embodiment of the present invention.
Figure 2B:
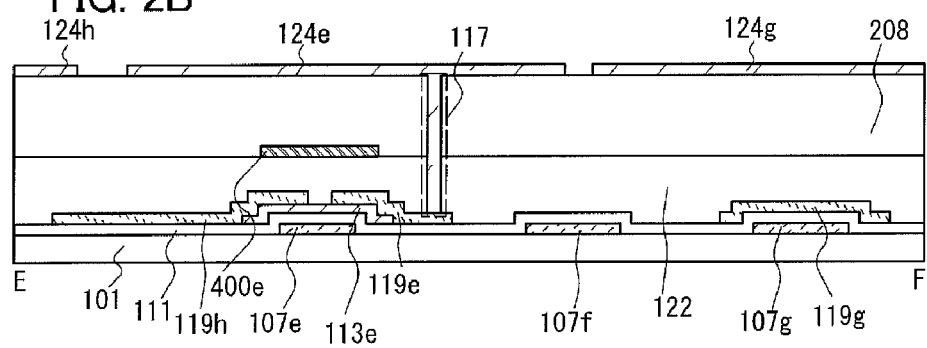
FIGS. 2B and 2C are cross-sectional views of the semiconductor device.
Figure 2C:
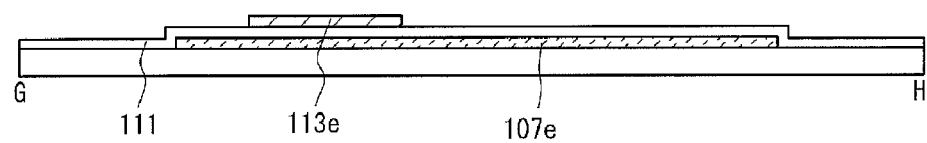

The structure of the semiconductor device according to one embodiment of the present invention is described with reference to FIGS. 1A to 1C and FIGS. 2A to 2C. FIG. 1A is a top view illustrating an example of a semiconductor device of this embodiment (specifically, illustrating a driver circuit portion). A cross section A-B in FIG. 1B is a cross-sectional view taken along line A-B in FIG. 1A. A cross section C-D in FIG. 1C is a cross-sectional view taken along line C-D in FIG. 1A. FIG. 2A is a top view illustrating an example of the semiconductor device of this embodiment (specifically, illustrating a pixel portion). A cross section E-F in FIG. 2B is a cross-sectional view taken along line E-F in FIG. 2A. A cross section G-H in FIG. 2C is a cross-sectional view taken along line G-H in FIG. 2A.

As illustrated in FIGS. 1A to 1C and FIGS. 2A to 2C, the semiconductor device of this embodiment has a structure where a driver circuit including a first thin film transistor and a pixel portion including a second thin film transistor are formed over the same substrate. The semiconductor device illustrated in FIGS. 1A to 1C and FIGS. 2A to 2C is described below.

FIGS. 1A to 1C illustrate part of the driver circuit portion. The driver circuit portion illustrated in FIGS. 1A to 1C includes a gate wiring and a storage capacitor line which are provided in a first direction, a source wiring which is provided in a second direction, which is different from the first direction, so as to intersect with the gate wiring and the storage capacitor line, and a thin film transistor provided around a portion where the gate wiring and the source wiring intersect with each other. FIGS. 2A to 2C illustrate part of the pixel portion. The pixel portion illustrated in FIGS. 2A to 2C includes a gate wiring and a storage capacitor line which are provided in a first direction, a source wiring which is provided in a second direction so as to intersect with the gate wiring and the storage capacitor line, and a thin film transistor provided around a portion where the gate wiring and the source wiring intersect with each other.

A thin film transistor 130A provided in the driver circuit in FIGS. 1A to 1C is a channel-etched thin film transistor. Over a substrate 101 having an insulating surface, the thin film transistor 130A includes a stack of conductive layers 107a and 110a having a function as a gate electrode layer or a gate wiring; a stack of an insulating film 111 having a function as a gate insulating layer, a semiconductor layer 113a including a channel formation region, and conductive layers 119a and 120a having a function as a source electrode layer or a source wiring; and a stack of conductive layers 119b and 120b having a function as a drain electrode layer.

The conductive layer 110a is provided over part of the conductive layer 107a. The area of the conductive layer 110a is smaller than that of the conductive layer 107a. In addition, a conductive layer 110b is provided over part of a conductive layer 107b. The area of the conductive layer 110b is smaller than that of the conductive layer 107b. In other words, end portions of the conductive layer 107a protrude from end portions of the conductive layer 110a, and end portions of the conductive layer 107b protrude from end portions of the conductive layer 110b. Further, the area of the conductive layer 107a and the area of the conductive layer 107b are larger than the area of the conductive layer 110a and the area of the conductive layer 110b, respectively.

The conductive layer 120a is provided over part of the conductive layer 119a. The area of the conductive layer 120a is smaller than that of the conductive layer 119a. In addition, the conductive layer 120b is provided over part of the conductive layer 119b. The area of the conductive layer 120b is smaller than that of the conductive layer 119b. In other words, end portions of the conductive layer 119a protrude from end portions of the conductive layer 120a, and end portions of the conductive layer 119b protrude from end portions of the conductive layer 120b. Further, the area of the conductive layer 119a and the area of the conductive layer 119b are larger than the area of the conductive layer 120a and the area of the conductive layer 120b, respectively.

For the conductive layers 110a, 120a, and 120b, for example, it is preferable to use metal materials in order to lower the wiring resistance of the wirings.

The gate wiring in the driver circuit portion is formed using the stack of the conductive layer 107a and the conductive layer 110a. The source wiring which is electrically connected to the source electrode layer or the drain electrode layer of the thin film transistor is formed using the stack of the conductive layer 119a and the conductive layer 120a or the stack of the conductive layer 119b and the conductive layer 120b. In other words, the gate electrode layer of the thin film transistor is formed using part of the stack of the conductive layer 107a and the conductive layer 110a which are included in the gate wiring, and the source electrode layer or the drain electrode layer is formed using part of the stack of the conductive layer 119a and the conductive layer 120a which are included in the source wiring or part of the stack of the conductive layer 119b and the conductive layer 120b.

Note that in this specification, when it is explicitly described that "X and Y are connected", the case where X and Y are electrically connected, the case where X and Y are functionally connected, and the case where X and Y are directly connected are included therein. Here, each of X and Y is an object (e.g., a device, an element, a circuit, a wiring, an electrode, a terminal, a conductive film, or a layer). Therefore, another element may be interposed between elements having a connection relationship illustrated in drawings and texts, without limitation to a predetermined connection relation, for example, the connection relation illustrated in the drawings and the texts.

Note that terms such as "first", "second", and "third" are used for distinguishing various elements, members, regions, layers, areas, and the like from others. Therefore, the terms such as "first", "second", and "third" do not limit the order and the number of the elements, members, regions, layers, areas, and the like. Further, for example, the term "first" can be replaced with the term "second", "third", or the like.

In addition, as illustrated in FIGS. 1A to 1C, the thin film transistor 130A provided in the driver circuit can include a second gate electrode layer (also referred to as a back gate electrode layer) including a conductive layer 400a and a conductive layer 401a above the channel formation region. When the back gate electrode layer is electrically connected to the lower gate electrode layer and has the same potential as the lower gate electrode layer, gate voltage can be applied from upper and lower sides of the semiconductor layer which is provided between the lower gate electrode layer and the back gate electrode layer. Further, when the lower gate electrode layer and the back gate electrode layer have different potentials, for example, when the potential of the back gate electrode layer is a fixed potential such as a ground potential (also referred to as GND) or 0 V, electrical characteristics of the TFT, for example, the threshold voltage or the like can be controlled. In other words, when the stack of the conductive layer 107a and the conductive layer 110a functions as a first gate electrode layer and the stack of the conductive layer 400a and the conductive layer 401a functions as a second gate electrode layer, the thin film transistor 130A can be used as a thin film transistor having four terminals.

Further, the driver circuit portion illustrated in FIGS. 1A to 1C includes an insulating layer 123 between the conductive layer 400a and the semiconductor layer 113a, the conductive layer 119a, the conductive layer 119b, the conductive layer 120a, and the conductive layer 120b.

For example, the insulating layer 123 can be formed using a single layer of an insulating film or a stack of insulating films.

Further, an oxide insulating film can be provided between the insulating layer 123 and the semiconductor layer 113a. With the provision of the oxide insulating film, the carrier concentration of the semiconductor layer can be lowered.

Over the substrate 101 having an insulating surface, a thin film transistor 130B in a pixel illustrated in FIGS. 2A to 2C includes a conductive layer 107e having a function as a gate electrode layer or a gate wiring, a gate insulating layer, a semiconductor layer 113e including a channel formation region, a conductive layer 119h having a function as a source electrode layer or a source wiring, and a conductive layer 119e having a function as a drain electrode layer.

The conductive layer 107e, the semiconductor layer 113e, the conductive layer 119e, and the conductive layer 119h can be formed using light-transmitting materials. Therefore, the entire thin film transistor 130B can be formed using light-transmitting materials.

Note that in this specification, a light-transmitting layer (film) refers to a layer (film) whose transmittance of visible light is 75 to 100%. In the case where such a layer (film) has conductivity, it is also referred to as a light-transmitting conductive layer (film). In addition, a conductive film having translucence with respect to visible light may be used for a metal oxide used for a gate electrode layer, a source electrode layer, a drain electrode layer, a pixel electrode, a different electrode, or a different wiring. Translucence with respect to visible light refers to a transmittance of 50 to 75%.

For example, an oxide semiconductor can be used for the semiconductor layer 113a or the semiconductor layer 113e. As for the oxide semiconductor, in the case where heat treatment is performed in the atmosphere of an inert gas such as nitrogen or a rare gas (e.g., argon or helium) or under reduced pressure, the oxide semiconductor layer is changed into an oxygen-deficient oxide semiconductor layer by the heat treatment so as to be a low-resistant oxide semiconductor layer, i.e., an n-type (e.g., n$^-$-type) oxide semiconductor layer. After that, by forming an oxide insulating film which is in contact with the oxide semiconductor layer so that the oxide semiconductor layer is made to be in an oxygen-excess state, the oxide semiconductor layer can be changed into a high-resistant oxide semiconductor layer, i.e., an i-type oxide semiconductor layer. Thus, it is possible to manufacture a semiconductor device including a highly reliable thin film transistor with favorable electrical characteristics.

In dehydration or dehydrogenation, heat treatment is performed at a temperature which is higher than or equal to 350° C., preferably higher than or equal to 400° C., and lower than the strain point of a substrate in the atmosphere of an inert gas such as nitrogen or a rare gas (e.g., argon or helium) or under reduced pressure, so that an impurity such as moisture contained in the oxide semiconductor layer is reduced.

The heat treatment for dehydration or dehydrogenation is performed under a heat treatment condition that two peaks of water or at least one peak of water at around 300° C. is not detected even if TDS is performed at up to 450° C. on the dehydrated or dehydrogenated oxide semiconductor layer. Therefore, even if TDS is performed at up to 450° C. on a thin film transistor including such a dehydrated or dehydrogenated oxide semiconductor layer, at least the peak of water at around 300° C. is not detected.

In addition, it is important not to mix water or hydrogen into the oxide semiconductor layer without exposure of the oxide semiconductor layer to the air with the use of a furnace used for dehydration or dehydrogenation when the temperature is lowered from a heating temperature T at which dehydration or dehydrogenation is performed on the oxide semiconductor layer. When a thin film transistor is formed using an oxide semiconductor layer obtained by changing an oxide semiconductor layer into a low-resistant oxide semiconductor layer, i.e., an n-type (e.g., n$^-$-type) oxide semiconductor layer by dehydration or dehydrogenation and then by changing the low-resistant oxide semiconductor layer into a high-resistant oxide semiconductor layer so as to be an i-type semiconductor layer, the threshold voltage of the thin film transistor can be positive voltage, so that a so-called normally-off switching element can be realized. It is preferable for a display device that a channel be formed with positive threshold voltage and as close to 0 V as possible in a thin film transistor. Note that if the threshold voltage of the thin film transistor is negative, the thin film transistor tends to be normally on; in other words, current flows between a source electrode layer and a drain electrode layer even when gate voltage is 0 V. In an active matrix display device, the electrical characteristics of a thin film transistor included in a circuit are important and influence the performance of the display device. Among the electrical characteristics of the thin film transistor, the threshold voltage ($V_{th}$) is particularly important. When the threshold voltage is high or negative even when field-effect mobility is high, it is difficult to control the circuit. In the case where a thin film transistor has high threshold voltage and a large absolute value of its threshold voltage, the thin film transistor cannot perform a switching function as the TFT and might be a load when the TFT is driven at low voltage. In the case of an n-channel thin film transistor, it is preferable that a channel be formed and drain current flows after positive voltage is applied as gate voltage. A thin film transistor in which a channel is not formed unless driving voltage is raised and a thin film transistor in which a channel is formed and drain current flows even when negative voltage is applied are unsuitable for a thin film transistor used in a circuit.

In addition, the gas atmosphere in which the temperature is lowered from the heating temperature T may be switched to a gas atmosphere which is different from the gas atmosphere in which the temperature is raised to the heating temperature T. For example, cooling is performed while the furnace used for dehydration or dehydrogenation is filled with a high-purity oxygen gas or a high-purity $N_2O$ gas without exposure of the oxide semiconductor layer to the air.

With the use of an oxide semiconductor film cooled slowly (or cooled) in an atmosphere which does not contain moisture (having a dew point of $-40°$ C. or lower, preferably $-60°$ C. or lower) after an impurity such as moisture contained in the film is reduced by heat treatment for dehydration or dehydrogenation, the electrical characteristics of a thin film transistor are improved and high-performance thin film transistors which can be mass-produced are realized.

In this specification, heat treatment in the atmosphere of an inert gas such as nitrogen or a rare gas (e.g., argon or helium) or under reduced pressure is referred to as heat treatment for dehydration or dehydrogenation. In this specification, for convenience, dehydration or dehydrogenation refers not only to elimination of $H_2$ but also to elimination of H, OH, or the like.

In the case where heat treatment is performed in the atmosphere of an inert gas such as nitrogen or a rare gas (e.g., argon or helium) or under reduced pressure, the oxide semiconductor layer is changed into an oxygen-deficient oxide semiconductor layer by the heat treatment so as to be a low-resistant oxide semiconductor layer, i.e., an n-type (e.g., n$^-$-type) oxide semiconductor layer. After that, a region overlapping with a source electrode layer is formed as a high-resistant source region (also referred to as an HRS region) which is an oxygen-deficient region, and a region overlapping with a drain electrode layer is formed as a high-resistant drain region (also referred to as an HRD region) which is an oxygen-deficient region. For example, in the thin film transistor illustrated in FIGS. 1A to 1C, a high-resistant source region can be formed in a region of the semiconductor layer 113a, which overlaps with the conductive layer 119a, and a high-resistant drain region can be formed in a region of the semiconductor layer 113a, which overlaps with the conductive layer 119b. Further, in the thin film transistor illustrated in FIGS. 2A to 2C, a high-resistant source region can be formed in a region of the semiconductor layer 113e, which overlaps with the conductive layer 119e, and a high-resistant drain region can be formed in a region of the semiconductor layer 113e, which overlaps with the conductive layer 119h.

The carrier concentration of the high-resistant source region or the high-resistant drain region is higher than or equal to $1\times10^{17}/cm^3$ and is at least higher than the carrier concentration of a channel formation region (lower than $1\times10^{17}/cm^3$). Note that the carrier concentration in this specification is carrier concentration obtained by Hall effect measurement at room temperature.

Further, a low-resistant source region (also referred to as an LRS region) and a low-resistant drain region (also referred to as an LRD region) may be formed between the oxide semiconductor layer and the drain electrode layer formed using a metal material. The carrier concentration of the low-resistant drain region is higher than the carrier concentration of the high-resistant drain region (the HRD region), for example, higher than or equal to $1\times10^{20}/cm^3$ and lower than or equal to $1\times10^{21}/cm^3$. In the semiconductor device of this embodiment, the conductive layer 119a illustrated in FIG. 1B corresponds to a low-resistant source region, and the conductive layer 119b illustrated in FIG. 1B corresponds to a low-resistant drain region.

Then, a channel formation region is formed by making at least part of the dehydrated or dehydrogenated oxide semiconductor layer be in an oxygen-excess state so as to be a higher-resistant oxide semiconductor layer, i.e., an i-type oxide semiconductor layer. Note that as the treatment for making part of the dehydrated or dehydrogenated oxide semiconductor layer be in an oxygen-excess state, any of the following methods is employed: deposition of an oxide insulating film which is in contact with the dehydrated or dehydrogenated oxide semiconductor layer by sputtering; heat treatment after the deposition of the oxide insulating film; heat treatment in an atmosphere containing oxygen after the deposition of the oxide insulating film; cooling treatment in an oxygen atmosphere after heat treatment in an inert gas atmosphere after the deposition of the oxide insulating film; and cooling treatment in ultra-dry air (having a dew point of $-40°$ C. or lower, preferably $-60°$ C. or lower) after heat treatment in an inert gas atmosphere after the deposition of the oxide insulating film.

Further, at least part of the dehydrated or dehydrogenated oxide semiconductor layer (a portion overlapping with a gate electrode (also referred to as a gate electrode layer)) can be selectively made to be in an oxygen-excess state so as to be a high-resistant oxide semiconductor layer, i.e., an i-type oxide semiconductor layer. Thus, the channel formation region can be formed. For example, the channel formation region can be formed in such a manner that a source electrode layer and a drain electrode layer formed using metal electrodes of Ti or the like are formed on and in contact with the dehydrated or dehydrogenated oxide semiconductor layer and exposure regions which do not overlap with at least one of the source electrode layer and the drain electrode layer are selectively made to be in an oxygen-excess state. In the case where the exposure regions are selectively made to be in an oxygen-excess state, a high-resistant source region overlapping with the source electrode layer and a high-resistant drain region overlapping with the drain electrode layer are formed, and the channel formation region is formed between the high-resistant source region and the high-resistant drain region. That is, the channel formation region is formed between the source electrode layer and the drain electrode layer in a self-aligning manner.

Thus, it is possible to manufacture a semiconductor device including a highly reliable thin film transistor with favorable electrical characteristics.

Note that by forming the high-resistant drain region in the oxide semiconductor layer overlapping with the drain electrode layer (and the source electrode layer), reliability when a driver circuit is formed can be improved. Specifically, by forming the high-resistant drain region, a structure can be employed in which conductivity can be varied stepwise from the drain electrode layer to the channel formation region via the high-resistant drain region. Therefore, in the case where operation is performed with the drain electrode layer connected to a wiring for supplying a high power supply potential VDD, the high-resistant drain region serves as a buffer and a high electric field is not applied locally even if the high electric field is applied between the gate electrode layer and the drain electrode layer, so that the withstand voltage of the thin film transistor can be improved.

In addition, by forming the high-resistant drain region (or the high-resistant source region) in the oxide semiconductor layer overlapping with the drain electrode layer (and the source electrode layer), the amount of leakage current in the channel formation region when the driver circuit is formed can be reduced. Specifically, by forming the high-resistant drain region (or the high-resistant source region), the leakage current of the thin film transistor, which flows between the drain electrode layer and the source electrode layer, flows sequentially through the drain electrode layer, the high-resistant drain region on the drain electrode layer side, the channel formation region, the high-resistant source region on the source electrode layer side, and the source electrode layer. In this case, in the channel formation region, leakage current flowing from the low-resistant drain region on the drain electrode layer side to the channel formation region can be localized in the vicinity of an interface between the channel formation region and a gate insulating layer which has high resistance when the thin film transistor is off. Thus, the amount of leakage current in a back channel portion (part of a surface of the channel formation region, which is apart from the gate electrode layer) can be reduced.

Further, the high-resistant source region overlapping with the source electrode layer and the high-resistant drain region overlapping with the drain electrode layer are formed so as to overlap with part of the gate electrode layer, so that the intensity of an electric field in the vicinity of an end portion of the drain electrode layer can be reduced more effectively.

The gate wiring which is electrically connected to the gate electrode layer of the thin film transistor 130B in the pixel portion is formed using the conductive layer 107e. The source wiring which is electrically connected to the source electrode layer or the drain electrode layer of the thin film transistor 130B in the pixel portion is formed using the conductive layer 119e or the conductive layer 119h. In other words, the gate electrode layer of the thin film transistor 130B is formed using part of the conductive layer 107e used for the gate wiring, and the source electrode layer or the drain electrode layer of the thin film transistor 130B is formed using part of the conductive layer 119e or part of the conductive layer 119h used for the source wiring.

Note that a wiring having a function as the gate electrode layer can be considered to be connected to a wiring having a function as the gate wiring (or at least one of layers of the wiring functioning as the gate wiring). Alternatively, at least one of the layers of the gate wiring can be formed to have a larger area than the other layer of the gate wiring, and part of the region with the larger area can be considered to function as the gate electrode layer.

Alternatively, at least part of the gate wiring can be considered to function as the gate electrode layer or part of the gate electrode layer. Alternatively, over a conductive layer which functions as the gate electrode layer or part of the gate electrode layer in the pixel portion and mainly functions as the gate electrode layer or part of the gate electrode layer of the thin film transistor, a conductive layer which mainly functions as the gate wiring or part of the gate wiring in the driver circuit portion can be considered to be provided.

A wiring which has a function as the source wiring and includes the source electrode layer of the thin film transistor in the pixel portion can be considered to be connected to a wiring which has a function as the source wiring and includes the source electrode layer of the thin film transistor in the driver circuit portion (or at least one of layers of the wiring which has a function as the source wiring and includes the source electrode layer of the thin film transistor in the driver circuit portion). That is, part of the source wiring in the driver circuit portion can be considered to function as the source electrode layer in the driver circuit portion or part of the source electrode layer in the pixel portion. Alternatively, over a conductive layer which mainly functions as the source electrode layer or part of the source electrode layer in the pixel portion, a conductive layer which mainly functions as the source wiring or part of the source wiring in the driver circuit portion can be considered to be provided.

In addition, the thin film transistor 130B provided in the pixel portion can include a second gate electrode layer (also referred to as a back gate electrode layer) including a conductive layer 400e above the channel formation region. When the back gate electrode layer is electrically connected to the lower gate electrode layer and has the same potential as the lower gate electrode layer, gate voltage can be applied from upper and lower sides of the semiconductor layer which is provided between the lower gate electrode layer and the back gate electrode layer. Further, when the lower gate electrode layer and the back gate electrode layer have different potentials, for example, when the potential of the back gate electrode layer is a fixed potential such as GND or 0 V, electrical characteristics of the TFT, for example, the threshold voltage or the like can be controlled.

In addition, the pixel portion illustrated in FIGS. 2A to 2C includes a storage capacitor which is formed using a conductive layer 107g functioning as a lower electrode, the insulating film 111 which has a function as a gate insulating layer and serves as a dielectric, and a conductive layer 119g functioning as an upper electrode. A storage capacitor line is formed using the conductive layer 107g and the conductive layer 119g. Further, an insulating layer 123 is provided between the conductive layer 400e and the semiconductor layer 113e and the conductive layers 119h and 119e. Since the insulating layer 122 is similar to the insulating layer 123 in FIG. 1B, description thereof is omitted.

Since the conductive layers 107g and 119g are formed using light-transmitting materials, at least part of a region of one of the conductive layers 107g and 119g can have a function as a capacitor wiring or part of a capacitor wiring, and part of a region of the other of the conductive layers 107g and 119g can function as an electrode of a capacitor or part of an electrode of a capacitor. Note that although FIGS. 2A to 2C illustrate the case where a capacitor is provided in the pixel portion, this embodiment is not limited to this. A capacitor can be provided in the driver circuit portion. For example, in the case where at least part of the region of one of the conductive layers 107g and 119g is a region where a light-transmitting conductive layer overlaps with a conductive layer whose resistance value is lower than that of the light-transmitting layer and the conductive layer whose resistance value is lower than that of the light-transmitting layer is a light-blocking conductive layer, at least part of the region of one of the conductive layers 107g and 119g preferably functions as a capacitor wiring or part of a capacitor wiring in the driver circuit portion. Further, in a region where a light-blocking conductive layer is not provided and a light-transmitting conductive layer is provided, part of the region of the other of the conductive layers 107g and 119g preferably functions as an electrode of a capacitor or part of an electrode of a capacitor in the pixel portion.

In addition, in the semiconductor device of this embodiment, a wiring having a function as an electrode of a capacitor can be considered to be connected to a wiring functioning as a capacitor wiring (or at least one of layers of the wiring functioning as the capacitor wiring). Alternatively, at least one of the layers of the capacitor wiring can be formed to have a larger area than the other layer of the capacitor wiring, and part of the region with the larger area can be considered to function as the electrode of the capacitor. Further, the light-transmitting conductive layer can be considered to be formed to have a larger area than the light-blocking conductive layer and part of the region with the larger area of the conductive layer can be considered to function as the electrode of the capacitor. Furthermore, at least part of the capacitor wiring in the pixel portion can be considered to function as the electrode of the capacitor or part of the electrode of the capacitor. Alternatively, at least one of the layers of the capacitor wiring can be considered to function as the electrode of the capacitor. Alternatively, part of the light-transmitting conductive layer can be considered to function as the electrode of the capacitor. Alternatively, over a conductive layer which mainly functions as the electrode of the capacitor or part of the electrode of the capacitor in the pixel portion, a conductive layer which mainly functions as the capacitor wiring or part of the capacitor wiring in the driver circuit portion can be considered to be provided.

In addition, part of a region in the light-blocking conductive layer or the light-transmitting conductive layer (mainly, a region in the light-blocking conductive layer) can function as a capacitor wiring led from an FPC or part of the capacitor wiring in the driver circuit portion, and another part of the region (a region including only the light-transmitting conductive layer) can function as the electrode of the capacitor in the pixel portion or part of the electrode of the capacitor. It is preferable that a region where the light-blocking conductive layer and the light-transmitting conductive layer overlap with each other function as the capacitor wiring led from the FPC or the part of the capacitor wiring, because the region has high conductivity (has a low resistance value) and includes the light-blocking conductive layer in some cases. Alternatively, it is preferable that the light-transmitting conductive layer in the region where the light-blocking conductive layer is not provided function as the electrode of the capacitor in the pixel portion or the part of the electrode of the capacitor.

Figure 32A:
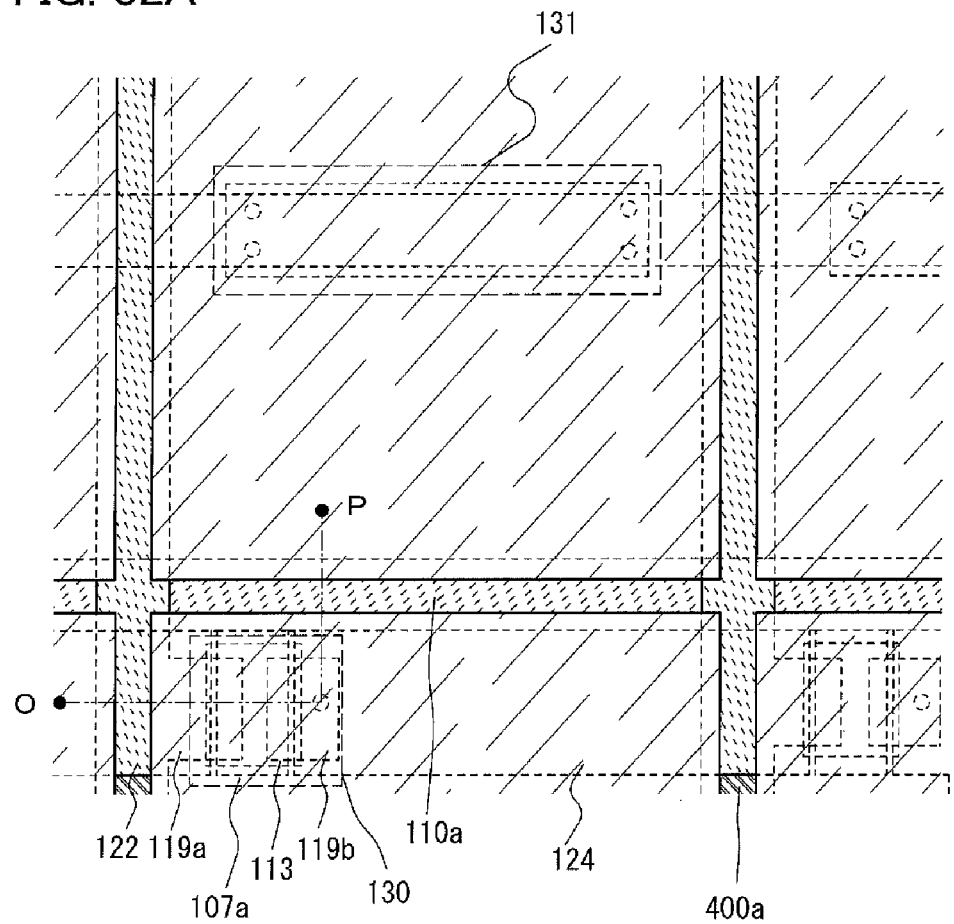
FIG. 32A is a top view of a semiconductor device according to one embodiment of the present invention.
Figure 32B:
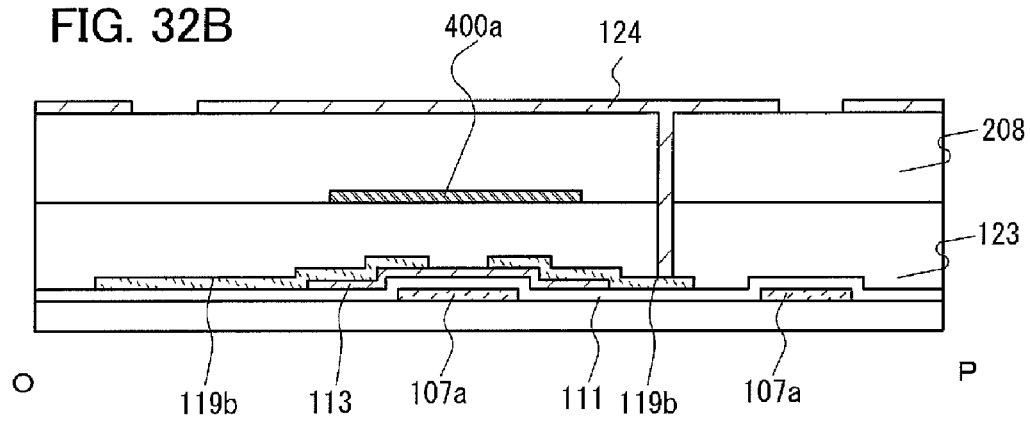
FIG. 32B is a cross-sectional view of the semiconductor device.

Note that in the case where the thin film transistor is formed over the gate wiring, the size of the thin film transistor depends on the width of the gate wiring of the thin film transistor. However, in this embodiment, since the thin film transistor is formed in a pixel, the size of the thin film transistor can be made large. Note that this embodiment is not limited to this. For example, as illustrated in FIGS. 32A and 32B, a thin film transistor whose width is larger than the width of a gate wiring can be formed. By making a thin film transistor larger, its current supply capability can be sufficiently increased, and the writing time of a signal to the pixel can be shortened. Therefore, a high-definition display device can be provided.

A storage capacitor portion includes a light-transmitting conductive layer which functions as a lower electrode, with an insulating film serving as a gate insulating film used as a dielectric. Therefore, by forming the storage capacitor portion with the use of the light-transmitting conductive layer as described above, the aperture ratio can be improved. In addition, by forming the storage capacitor portion with the use of the light-transmitting conductive layer, the storage capacitor portion can be made large, so that a potential of a pixel electrode can be easily held even if the thin film transistor is turned off. Further, a feedthrough potential can be lowered.

As described above, in the semiconductor device illustrated in FIGS. 1A to 1C and FIGS. 2A to 2C, the driver circuit portion and the pixel portion each including a thin film transistor are formed over the same substrate. The gate electrode layer and the source electrode layer of the thin film transistor in the pixel portion are formed using light-transmitting conductive layers. The semiconductor layer of the thin film transistor in the pixel portion is formed using a light-transmitting semiconductor material. The gate electrode layer and the source electrode layer of the thin film transistor in the driver circuit portion are formed using conductive layers whose resistance values are lower than those of the light-transmitting conductive layers. With this structure, the aperture ratio in the pixel portion can be improved; higher resolution can be realized; distortion in the waveform of a signal is suppressed by the decrease in wiring resistance in the driver circuit portion; power consumption can be reduced; and operation speed can be improved. Further, the larger the semiconductor device becomes, the more wiring resistance influences the semiconductor device. Therefore, the structure of the semiconductor device in this embodiment is also preferable when a semiconductor device is made larger.

Alternatively, in the semiconductor device illustrated in FIGS. 1A to 1C and FIGS. 2A to 2C, an electrode and a wiring of the storage capacitor in the pixel portion can be formed using light-transmitting conductive layers. With this structure, the aperture ratio can be improved, and the decrease in the aperture ratio can be suppressed even in the case where the area of the storage capacitor is made large.

Alternatively, in the semiconductor device illustrated in FIGS. 1A to 1C and FIGS. 2A to 2C, a lead wiring such as a power supply line or a signal line, the gate wiring, and the source wiring in the pixel portion can be formed using light-transmitting conductive layers, and a lead wiring such as a power supply line or a signal line, the gate wiring, and the source wiring in the driver circuit portion can be formed using conductive layers whose resistance values are lower than those of the light-transmitting conductive layers. With this structure, distortion in the waveform of a signal is suppressed, power consumption can be reduced, and operation speed can be improved.

Alternatively, the semiconductor device illustrated in FIGS. 1A to 1C and FIGS. 2A to 2C can include a light-transmitting conductive layer overlapping with the channel formation region of the thin film transistor in the pixel portion, and a conductive layer which is formed using a conductive material whose resistance value is lower than that of a light-transmitting conductive material and which overlaps with the channel formation region of the thin film transistor in the driver circuit portion. The conductive layers (the conductive layers overlapping with the channel formation regions) which are provided in the pixel portion and the driver circuit portion can function as second electrodes (back gate electrode layers) of the thin film transistors provided in the pixel portion and the driver circuit portion. The conductive layers are not necessarily provided; however, when the back gate electrode layers are provided, the threshold voltage of the thin film transistors can be controlled and the reliability of the thin film transistors can be improved.

Next, an example of a method for manufacturing the semiconductor device of this embodiment is described with reference to FIGS. 3A to 3D, FIGS. 4A to 4D, FIGS. 5A to 5D, FIGS. 6A to 6D, FIGS. 7A to 7C, FIGS. 8A to 8C, FIGS. 9A to 9D, FIGS. 10A to 10D, FIGS. 11A to 11D, and FIGS. 12A to 12E. FIGS. 3A to 3D, FIGS. 5A to 5D, FIGS. 7A to 7C, FIGS. 9A to 9D, and FIGS. 10A to 10D each illustrate a cross section taken along line A-B in FIG. 1A. FIGS. 4A to 4D, FIGS. 6A to 6D, FIGS. 8A to 8C, FIGS. 11A to 11D, and FIGS. 12A to 12E each illustrate a cross section taken along line E-F in FIG. 2A. FIGS. 3A to 3D, FIGS. 5A to 5D, FIGS. 7A to 7C, FIGS. 9A to 9D, and FIGS. 10A to 10D illustrate a source wiring portion 301, a thin film transistor portion 302, and a gate wiring portion 303. FIGS. 4A to 4D, FIGS. 6A to 6D, FIGS. 8A to 8C, FIGS. 11A to 11D, and FIGS. 12A to 12E illustrate a source wiring portion 331, a thin film transistor portion 332, a gate wiring portion 333, and a storage capacitor portion 334. Note that in the manufacturing method illustrated in FIGS. 3A to 3D, FIGS. 4A to 4D, FIGS. 5A to 5D, FIGS. 6A to 6D, FIGS. 7A to 7C, FIGS. 8A to 8C, FIGS. 9A to 9D, FIGS. 10A to 10D, FIGS. 11A to 11D, and FIGS. 12A to 12E, a multi-tone mask is used, for example; however, this embodiment is not limited to this.

Figure 3A:
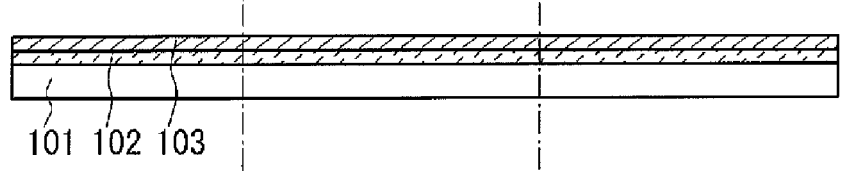
FIGS. 3A to 3D are cross-sectional views illustrating a method for manufacturing a semiconductor device according to one embodiment of the present invention.
Figure 4A:
FIGS. 4A to 4D are cross-sectional views illustrating a method for manufacturing a semiconductor device according to one embodiment of the present invention.

First, as illustrated in FIG. 3A and FIG. 4A, a conductive film 102 and a conductive film 103 are stacked over the substrate 101 by sputtering. These steps can be performed successively and sequential sputtering can be performed using a multi-chamber. By successively forming the conductive film 102 and the conductive film 103, throughput is improved and contamination by an impurity or dust can be suppressed.

The substrate 101 is preferably formed using a material having high transmittance. For example, a glass substrate, a plastic substrate, an acrylic substrate, a ceramic substrate, or the like can be used.

It is preferable that the transmittance of the conductive film 102 be sufficiently high. Further, the transmittance of the conductive film 102 is preferably higher than the transmittance of the conductive film 103.

The conductive film 102 can be formed using a conductive material having a light-transmitting property with respect to visible light, for example, an In—Sn—Zn—O-based metal oxide, an In—Al—Zn—O-based metal oxide, a Sn—Ga—Zn—O-based metal oxide, an A—Ga—Zn—O-based metal oxide, a Sn—Al—Zn—O-based metal oxide, an In—Zn—O-based metal oxide, a Sn—Zn—O-based metal oxide, an Al—Zn—O-based metal oxide, an In—O-based metal oxide, a Sn—O-based metal oxide, or a Zn—O-based metal oxide can be used. The metal oxide can be formed by, for example, sputtering, vacuum evaporation (e.g., electron beam deposition), arc discharge ion plating, or a spray method. In addition, in the case where sputtering is used, deposition may be performed using a target containing $SiO_2$ at 2 to 10 wt %, and $SiO_x$ (x>0), which inhibits crystallization, may be contained in the light-transmitting conductive film. Thus, crystallization of the metal oxide is suppressed when heat treatment for dehydration or dehydrogenation is performed in a later step. Alternatively, the conductive film 102 may be formed by stacking a plurality of films including any of the above materials. In the case of the layered structure, it is preferable that the transmittance of each of the plurality of films be sufficiently high.

It is preferable that the resistance value of the conductive film 103 be sufficiently low and the conductivity of the conductive film 103 be sufficiently high. In addition, the resistance value of the conductive film 102 is preferably lower than the resistance value of the conductive film 103. Since the conductive film 102 functions as a conductive layer, the resistance value of the conductive film 102 is preferably lower than the resistance value of an insulating layer.

The conductive film 103 can be formed to have a single-layer structure or a layered structure with the use of a metal material such as molybdenum, titanium, chromium, tantalum, tungsten, aluminum, copper, neodymium, or scandium, or an alloy material containing the above material as a main component by sputtering or vacuum evaporation. In addition, in the case where the conductive film 103 is formed to have a layered structure, a light-transmitting conductive film may be included as any of plurality of films.

Note that in the case where the conductive film 103 is formed over the conductive film 102, both the films react with each other in some cases. For example, in the case where a top surface (a surface which is in contact with the conductive film 103) of the conductive film 102 is formed using ITO and a bottom surface (a surface which is in contact with the conductive film 102) of the conductive film 103 is formed using aluminum, chemical reaction occurs therebetween in some cases. Therefore, in order to avoid such chemical reaction, a high-melting point material is preferably used for the bottom surface (the surface which is in contact with the conductive film 102) of the conductive film 103. For example, as the high-melting point material, molybdenum (Mo), titanium (Ti), tungsten (W), neodymium (Nd), or the like can be used. It is preferable to form the conductive film 103 as a multi-layer film with the use of a material having a low resistance value over the film formed using the high-melting point material. As the material having a low resistance value, aluminum (Al), copper (Cu), silver (Ag), or the like can be used. For example, in the case where the conductive film 103 is formed to have a layered structure, a stack of molybdenum (Mo) as a first layer, aluminum (Al) as a second layer, and molybdenum (Mo) as a third layer, or a stack of molybdenum (Mo) as a first layer, aluminum (Al) containing a small amount of neodymium (Nd) as a second layer, and molybdenum (Mo) as a third layer can be used.

Although not illustrated, silicon oxide, silicon nitride, silicon oxynitride, or the like can be formed between the substrate 101 and the conductive film 102 as a base film. By forming the base film between the substrate 101 and the light-transmitting conductive film, diffusion of mobile ions, impurities, or the like from the substrate 101 into an element can be suppressed, so that deterioration in the characteristics of the element can be prevented.

Figure 3B:
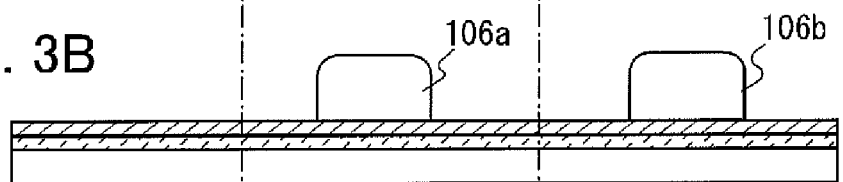
Figure 4B:
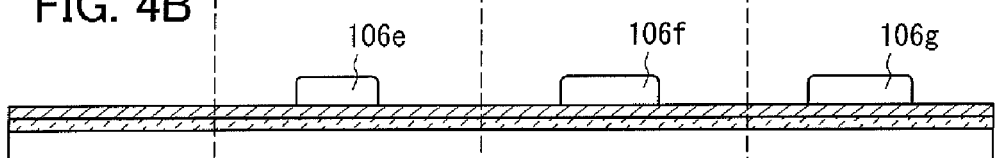

Next, as illustrated in FIG. 3B and FIG. 4B, over the conductive film 103, resist masks 106a and 106b having large thickness are formed in the driver circuit portion and resist masks 106e, 106f, and 106g having smaller thickness than the resist masks 106a and 106b are formed in the pixel portion. The resist masks 106a, 106b, 106e, 106f, and 106g can be formed using a multi-tone mask, for example. With the use of a multi-tone mask, a resist mask having regions with different thicknesses can be formed. With the use of the multi-tone mask, the number of photomasks used and the number of manufacturing steps are reduced. In this embodiment, the multi-tone mask can be used in a step of forming the patterns of the conductive film 102 and the conductive film 103 and a step of forming the light-transmitting conductive layer which functions as the gate electrode layer.

A multi-tone mask is a mask capable of light exposure with multi-level light intensity, typically, with three levels of light intensity so that an exposed region, a semi-exposed region, and an unexposed region are formed. With the use of the multi-tone mask, a resist mask with plural thicknesses (typically two kinds of thicknesses) can be formed by one-time exposure and development process. Therefore, with the use of the multi-tone mask, the number of photomasks can be reduced.

Figures 1, 16A:
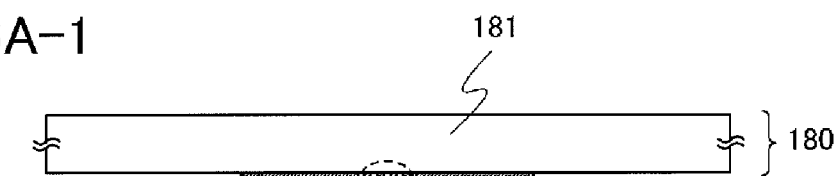
FIGS. 16A-1 to 16B-2 illustrate multi-tone masks which can be used in one embodiment of the present invention.
Figures 2, 16A:
Figures 1, 16B:
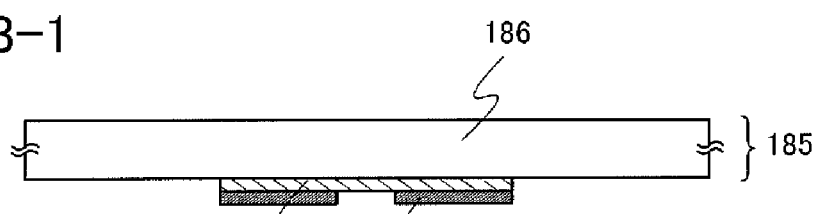
Figures 2, 16B:
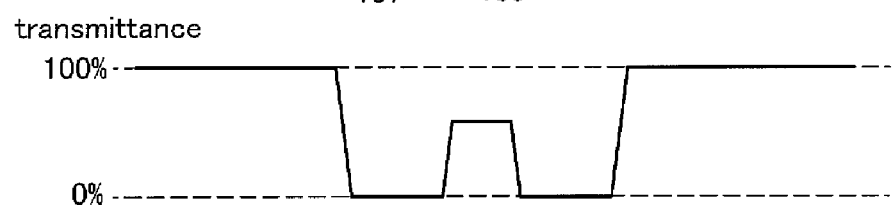

FIGS. 16A-1 and 16B-1 illustrate cross sections of typical multi-tone masks. FIG. 16A-1 illustrates a gray-tone mask 180, and FIG. 16B-1 illustrates a half-tone mask 185.

The gray-tone mask 180 illustrated in FIG. 16A-1 includes a light-blocking portion 182 formed using a light-blocking layer on a light-transmitting substrate 181, and a diffraction grating portion 183 provided with a pattern of the light-blocking layer.

The diffraction grating portion 183 has slits, dots, meshes, or the like provided at intervals which are less than or equal to the resolution limit of light used for exposure, so that the amount of light to be transmitted is controlled. Note that the slits, dots, or meshes provided at the diffraction grating portion 183 may be provided periodically or non-periodically.

For the light-transmitting substrate 181, quartz or the like can be used. The light-blocking layer included in the light-blocking portion 182 and the diffraction grating portion 183 may be formed using a metal film, and is preferably formed using chromium, chromium oxide, or the like.

In the case where the gray-tone mask 180 is irradiated with light for exposure, as illustrated in FIG. 16A-2, transmittance in a region overlapping with the light-blocking portion 182 is 0% and transmittance in a region where neither the light-blocking portion 182 nor the diffraction grating portion 183 is provided is 100%. Further, transmittance at the diffraction grating portion 183 is approximately in the range of 10 to 70%, which can be adjusted by the interval of slits, dots, or meshes of the diffraction grating, or the like.

The half-tone mask 185 illustrated in FIG. 16B-1 includes a semi-light-transmitting portion 187 formed using a semi-light-transmitting layer on a light-transmitting substrate 186, and a light-blocking portion 188 formed using a light-blocking layer.

The semi-light-transmitting portion 187 can be formed using a layer of MoSiN, MoSi, MoSiO, MoSiON, CrSi, or the like. The light-blocking portion 188 may be formed using a metal film which is similar to that of the light-blocking layer of the gray-tone mask, and is preferably formed using chromium, chromium oxide, or the like.

In the case where the half-tone mask 185 is irradiated with light for exposure, as illustrated in FIG. 16B-2, transmittance in a region overlapping with the light-blocking portion 188 is 0%, and transmittance in a region where neither the light-blocking portion 188 nor the semi-light-transmitting portion 187 is provided is 100%. Further, transmittance at the semi-light-transmitting portion 187 is approximately in the range of 10 to 70%, which can be adjusted by the kind, thickness, or the like of a material to be used.

By performing exposure with the use of the multi-tone mask and development, a resist mask having regions with different thicknesses can be formed. In addition, a resist mask with different thicknesses can be formed.

Figure 3C:
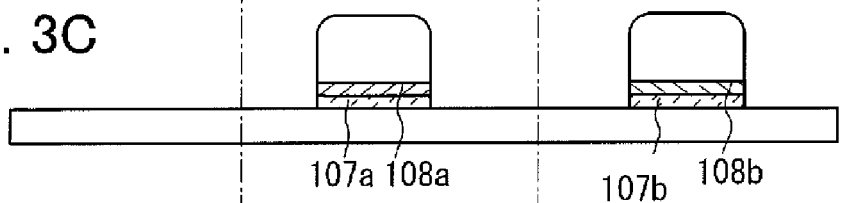
Figure 4C:
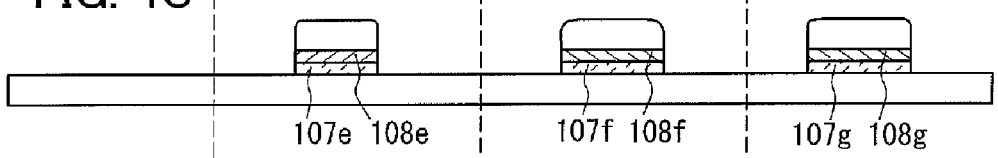

Next, as illustrated in FIG. 3C and FIG. 4C, etching is performed using the resist masks 106a, 106b, 106e, 106f, and 106g. With the etching, the conductive film 102 and the conductive film 103 are selectively removed, so that conductive layers 107a, 108a, 107b, 108b, 107e, 108e, 107f, 108f, 107g, and 108g can be formed.

Figure 3D:
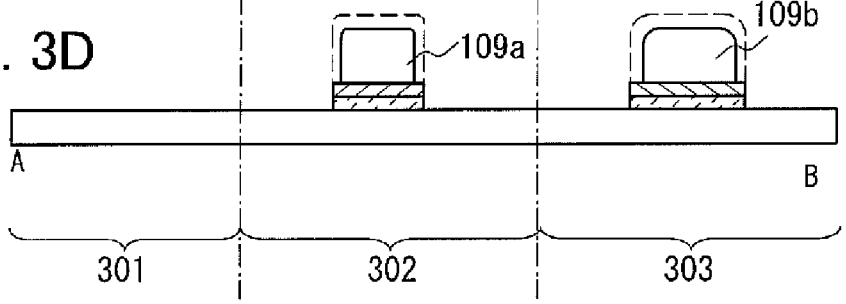
Figure 4D:
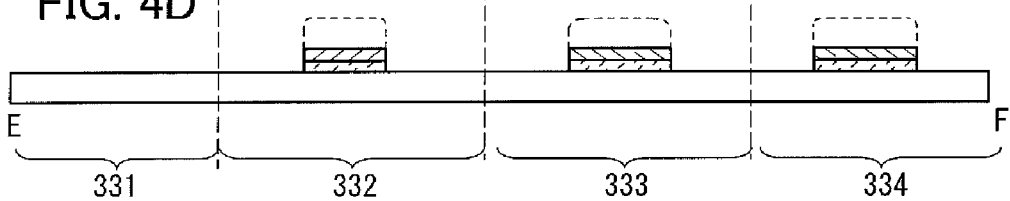

Then, as illustrated in FIG. 3D and FIG. 4D, ashing is performed on the resist masks 106a, 106b, 106e, 106f, and 106g. For example, ashing or the like in which oxygen plasma is used may be performed. When the resist masks 106a and 106b are reduced (downsized) by the ashing, resist masks 109a and 109b are formed and some of the conductive layers 108a and 108b are exposed. Further, with this ashing treatment, the resist masks 106e, 106f, and 106g in the pixel portion, which have small thickness, are removed, and the conductive layers 108e, 108f, and 108g are exposed. In this manner, with the use of the resist mask formed using the multi-tone mask, a resist mask is not additionally used, so that steps can be simplified.

Figure 5A:
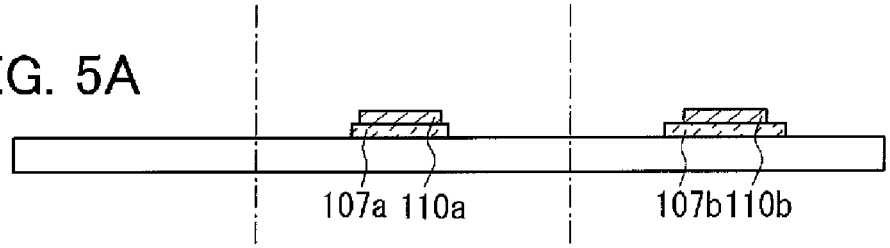
FIGS. 5A to 5D are cross-sectional views illustrating a method for manufacturing a semiconductor device according to one embodiment of the present invention.
Figure 6A:
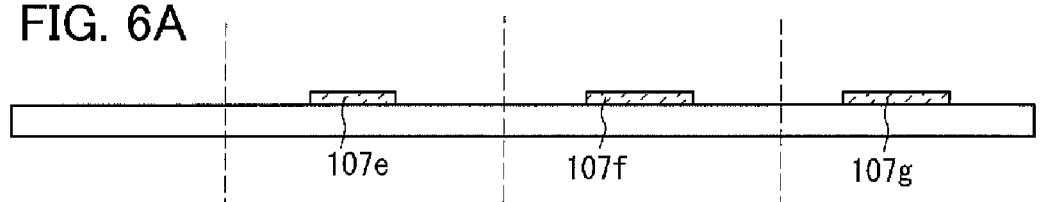
FIGS. 6A to 6D are cross-sectional views illustrating a method for manufacturing a semiconductor device according to one embodiment of the present invention.

Next, as illustrated in FIG. 5A and FIG. 6A, etching is performed using the resist masks 109a and 109b. Thus, part of the conductive layer 108a is removed; a conductive layer 110a is formed; a conductive layer 110b which is obtained by removal of the part of the conductive layer 108b is formed; and the conductive layers 108e, 108f, and 108g are removed. After that, the resist masks 109a and 109b are removed. By removal of the part of the conductive layer 108a, part of the conductive layer 107a is exposed. By removal of the part of the conductive layer 108b, part of the conductive layer 107b is exposed. By removal of the conductive layer 108e, the conductive layer 107e is exposed. By removal of the conductive layer 108f, the conductive layer 107f is exposed. By removal of the conductive layer 108g, the conductive layer 107g is exposed.

Note that as illustrated in FIG. 5A, with etching in which the resist masks 109a and 109b which are obtained by reduction (downsizing) of the resist masks 106a and 106b are used, peripheral portions of the conductive layers 108a and 108b (regions in the conductive layers 108a and 108b, which are exposed from the resist masks 109a and 109b) are etched concurrently. In other words, the end portions of the conductive layer 107a protrude from end portions of the conductive layer 108a (110a), and the end portions of the conductive layer 107b protrude from end portions of the conductive layer 108b (110b). Further, the area of the conductive layer 107a and the area of the conductive layer 107b are larger than the area of the conductive layer 110a and the area of the conductive layer 110b, respectively. Furthermore, the conductive layers 110a and 110b and the conductive layers 107a and 107b include a region where the conductive layer 110a and the conductive layer 107a overlap with each other, a region where the conductive layer 110b and the conductive layer 107b overlap with each other, regions where the conductive layer 110a and the conductive layer 107a do not overlap with each other, and regions where the conductive layer 11013 and the conductive layer 107b do not overlap with each other are provided.

When the light-blocking conductive layer is removed, part of the light-transmitting conductive layer (for example, a surface portion which is in contact with the light-blocking conductive layer) is also removed in some cases. The selectivity of the light-blocking conductive layer to the light-transmitting conductive layer in etching determines how much the light-transmitting conductive layer is removed. Therefore, for example, the thickness of the light-transmitting conductive layer in a region covered with the light-blocking conductive layer is often larger than the thickness of the light-transmitting conductive layer in a region which is not covered with the light-blocking conductive layer.

In the case where only the light-blocking conductive layer is removed by wet etching while the light-transmitting conductive layer is left, an etching solution with high selectivity of the light-blocking conductive layer to the light-transmitting conductive layer is used. In the case where a stack of molybdenum (Mo) as a first layer, aluminum (Al) as a second layer, and molybdenum (Mo) as a third layer, or a stack of molybdenum (Mo) as a first layer, aluminum (Al) containing a small amount of neodymium (Nd) as a second layer, and molybdenum (Mo) as a third layer is used as the light-blocking conductive layer, for example, a mixed acid of phosphoric acid, nitric acid, acetic acid, and water can be used. With the use of this mixed acid, a forward tapered shape which is uniform and favorable can be obtained. In this manner, in addition to improvement in coverage due to a tapered shape, high throughput can be obtained while the wet etching is a simple process in which etching by an etchant, a rinse by pure water, and drying are performed. Thus, the wet etching is suitable for etching of the light-blocking conductive layer.

Figure 5B:
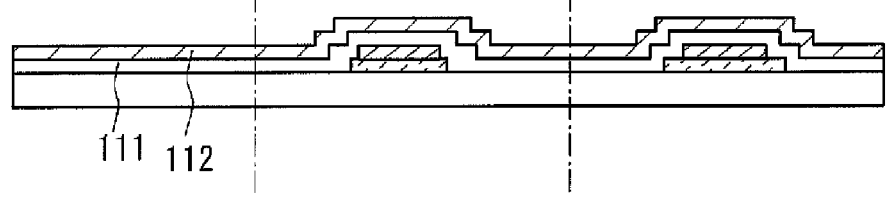
Figure 6B:
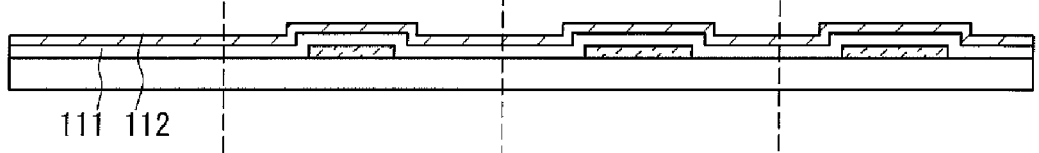

Next, as illustrated in FIG. 5B and FIG. 6B, the insulating film 111 which covers the conductive layers 107a, 107b, 107e, 107f, and 107g and the conductive layers 110a and 110b and functions as a gate insulating layer is formed.

The insulating film 111 may be formed to have a single-layer structure or a layered structure including a plurality of films. In the case of the layered structure including a plurality of films, it is preferable that all the films have sufficiently high transmittance. In particular, in the pixel portion, it is preferable that all the films have sufficiently high transmittance.

The insulating film 111 which covers the light-transmitting conductive layer and the light-blocking conductive layer is formed to a thickness of about 50 to 500 nm. The insulating film 111 is formed to have a single-layer structure of a film containing an oxide of silicon or a nitride of silicon, or a layered structure thereof, by sputtering or a variety of CVD such as plasma-enhanced CVD. Specifically, the insulating film 111 is formed by using a single layer of a film containing silicon oxide, a film containing silicon oxynitride, or a film containing silicon nitride oxide, or by appropriately stacking these films.

The insulating film 111 is preferably formed using a light-transmitting material or a material having high transmittance. Specifically, the insulating film 111 is preferably formed using a material having higher transmittance than the conductive layers 107a, 107b, 107e, 107f, and 107g. Therefore, the transmittance of the insulating film 111 is preferably higher than or equal to the transmittance of the conductive layers 107a, 107b, 107e, 107f, and 107g. This is because the insulating film 111 is formed to have a large area in some cases and higher transmittance is preferable in order to increase light use efficiency. In particular, in the pixel portion, it is preferable that the insulating film 111 and the conductive layers 107e, 107f, and 107g be formed using light-transmitting materials.

Next, a semiconductor film 112 is formed over the insulating film 111.

The semiconductor film 112 may be formed to have a single-layer structure or a layered structure including a plurality of films. In the case of the layered structure including a plurality of films, it is preferable that all the films have sufficiently high transmittance. Similarly, especially in the pixel portion, it is preferable that all the films have sufficiently high transmittance. The semiconductor film 112 is preferably formed using a light-transmitting material or a material with high transmittance. The semiconductor film 112 can be formed using an oxide semiconductor, for example. For the oxide semiconductor, any of the following oxide semiconductor films is used: an In—Ga—Zn—O-based non-single-crystal film; an In—Sn—Zn—O-based oxide semiconductor film; an In—Al—Zn—O-based oxide semiconductor film; a Sn—Ga—Zn—O-based oxide semiconductor film; an A—Ga—Zn—O-based oxide semiconductor film; a Sn—Al—Zn—O-based oxide semiconductor film; an In—Zn—O-based oxide semiconductor film; a Sn—Zn—O-based oxide semiconductor film; an Al—Zn—O-based oxide semiconductor film; an In—O-based oxide semiconductor film; a Sn—O-based oxide semiconductor film; and a Zn—O-based oxide semiconductor film. In this embodiment, the semiconductor film 112 is formed by sputtering with the use of an In—Ga—Zn—O-based oxide semiconductor target. Alternatively, the oxide semiconductor film can be formed by sputtering in a rare gas (typically argon) atmosphere, an oxygen atmosphere, or an atmosphere including a rare gas (typically argon) and oxygen. In addition, in the case where sputtering is used, deposition is performed using a target containing $SiO_2$ at 2 to 10 wt %, and $SiO_x$ (x>0), which inhibits crystallization, is contained in the oxide semiconductor film. Thus, crystallization can be suppressed.

Note that before the semiconductor film 112 is formed by sputtering, dust on a surface of the insulating film 111 is preferably removed by reverse sputtering in which an argon gas is introduced and plasma is generated. The reverse sputtering refers to a method in which, without application of voltage to a target side, an RF power source is used for application of voltage to a substrate side in an argon atmosphere and plasma is generated in the vicinity of the substrate so that a substrate surface is modified. Note that nitrogen, helium, oxygen, or the like may be used instead of the argon atmosphere.

Heat treatment for reducing an impurity such as moisture (heat treatment for dehydration or dehydrogenation) can be performed on the oxide semiconductor film. The heat treatment leads to improvement in electrical characteristics of the thin film transistor and improvement in reliability. For example, the heat treatment for dehydration or dehydrogenation is preferably performed at higher than or equal to 350° C. and lower than the strain point of the substrate, preferably higher than or equal to 400° C. and lower than the strain point of the substrate. Here, after the substrate is put in an electric furnace which is a kind of heat treatment apparatus and heat treatment is performed on the oxide semiconductor film in a nitrogen atmosphere, it is preferable that water or hydrogen be prevented from being mixed into the oxide semiconductor film by preventing the substrate from being exposed to the air. Further, the same furnace is used from the heating temperature T at which the oxide semiconductor film is subjected to dehydration or dehydrogenation to a temperature low enough to prevent water from entering again; specifically, slow cooling is performed in a nitrogen atmosphere until the temperature drops by 100° C. or more from the heating temperature T. Furthermore, without limitation to a nitrogen atmosphere, dehydration or dehydrogenation can be performed in a rare gas atmosphere (e.g., helium, neon, or argon) or under reduced pressure.

Note that in the heat treatment, it is preferable that water, hydrogen, and the like be not included in nitrogen or a rare gas such as helium, neon, or argon. For example, the purity of nitrogen or a rare gas such as helium, neon, or argon, which is introduced into the heat treatment apparatus, is preferably 6N (99.9999%) or more, more preferably 7N (99.99999%) or more (i.e., impurity concentration is preferably 1 ppm or lower, more preferably 0.1 ppm or lower).

In addition, the transmittance of the conductive layers 107a, 107b, 107e, 107f, and 107g is preferably higher than or equal to the transmittance of the semiconductor film 112. This is because the conductive layers 107a, 107b, 107e, 107f, and 107g are used in large areas in some cases and the films having larger areas preferably have higher transmittance in order to improve light use efficiency and to reduce power consumption with higher aperture ratio. This is also because the conductive layers 107a, 107b, 107e, 107f, and 107g are used in a gate wiring portion, a source wiring portion, a thin film transistor portion, and a storage capacitor portion.

Further, the transmittance of the insulating film 111 is preferably higher than the transmittance of the semiconductor film 112. This is because the insulating film 111 is used in a larger area as compared to the semiconductor film 112 in some cases and the film having a larger area preferably has higher transmittance in order to improve light use efficiency.

Figure 5C:
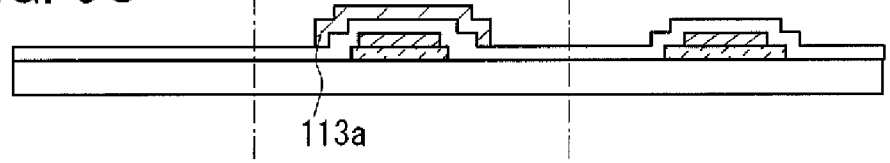
Figure 6C:
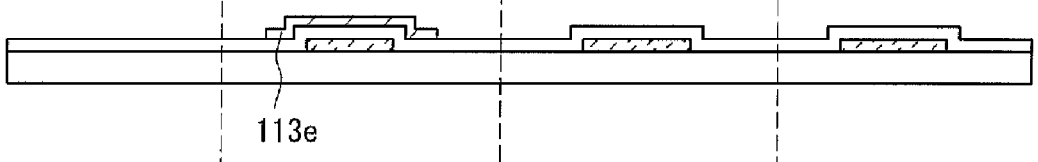

Next, a resist mask (not illustrated) is formed over the semiconductor film 112. Then, etching is performed using the resist mask so that semiconductor layers 113a and 113e (also referred to as island-shaped semiconductor layers) which are processed into desired shapes are formed, as illustrated in FIG. 5C and FIG. 6C. For the etching, hydrofluoric acid diluted to 0.05%, hydrochloric acid, or the like can be used.

The semiconductor layers 113a and 113e can function as semiconductor layers (active layers) of the thin film transistors or some of the semiconductor layers (active layers) of the thin film transistors. Alternatively, the semiconductor layers 113a and 113e can function as capacitors or some of the capacitors. Alternatively, the semiconductor layers 113a and 113e can function as films for reducing parasitic capacitance at the intersection portion of wirings.

Figure 5D:
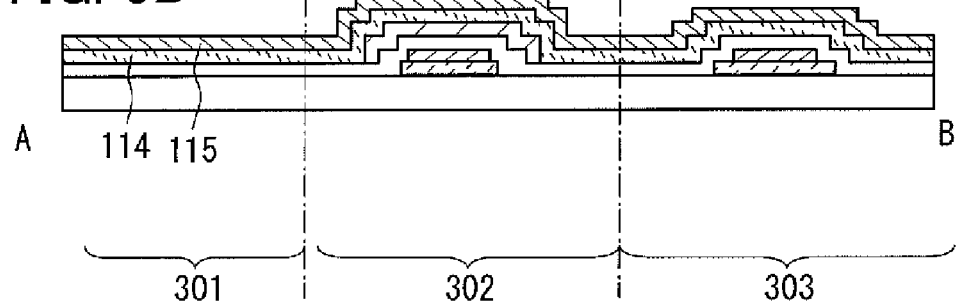
Figure 6D:
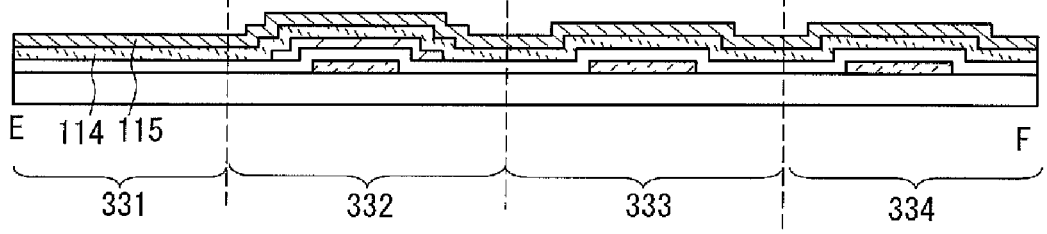

Next, as illustrated in FIG. 5D and FIG. 6D, a conductive film 114 and a conductive film 115 are stacked by sputtering so as to cover the semiconductor layer 113a, the semiconductor layer 113e, and the insulating film 111. These steps can be performed successively and sequential sputtering can be performed using a multi-chamber. By successively forming the conductive film 114 and the conductive film 115, throughput is improved and contamination by an impurity or dust can be suppressed.

It is preferable that the transmittance of the conductive film 114 be sufficiently high. Further, the transmittance of the conductive film 114 is preferably higher than the transmittance of the conductive film 115.

The conductive film 114 can be formed to have a single-layer structure or a layered structure including one or a plurality of materials which can be used for the conductive film 102 illustrated in FIGS. 3A and 3B and FIGS. 4A and 4B.

The conductive film 114 is preferably formed using a material which is substantially the same as the material of the conductive film 102. Substantially the same material is a material whose element of a main component is the same. In terms of impurities, the kind and the concentration of elements contained are different from each other in some cases. When the conductive film 114 is formed using the material which is substantially the same as the material of the conductive film 102 by sputtering or evaporation in this manner, there is an advantage that the material can be shared between the conductive films 114 and 102. When the material can be shared, the same manufacturing apparatus can be used.

The resistance value of the conductive film 114 is preferably higher than the resistance value of the conductive film 115.

The conductive film 115 can be formed to have a single-layer structure or a layered structure including one or a plurality of materials which can be used for the conductive film 103 illustrated in FIGS. 3A and 3B and FIGS. 4A and 4B.

Further, the conductive film 115 is preferably formed using a material which is different from that used for the conductive film 103. Alternatively, the conductive film 115 is preferably formed to have a layered structure which is different from that of the light-blocking conductive film.

Note that in the case where the conductive film 115 is formed over the conductive film 114, both the films react with each other in some cases. For example, in the case where a top surface (a surface which is in contact with the conductive film 115) of the conductive film 114 is formed using ITO and a bottom surface (a surface which is in contact with the conductive film 114) of the conductive film 115 is formed using aluminum, chemical reaction occurs therebetween in some cases. Therefore, in order to avoid such chemical reaction, a high-melting point material is preferably used for the bottom surface (the surface which is in contact with the conductive film 114) of the conductive film 115. For example, as the high-melting point material, molybdenum (Mo), titanium (Ti), tungsten (W), neodymium (Nd), or the like can be used. It is preferable to form the conductive film 115 as a multi-layer film with the use of a material having a low resistance value over the film formed using the high-melting point material. As the material having a low resistance value, aluminum (Al), copper (Cu), silver (Ag), or the like can be used. Such a material has a light-blocking property and reflectivity.

Figure 8A:
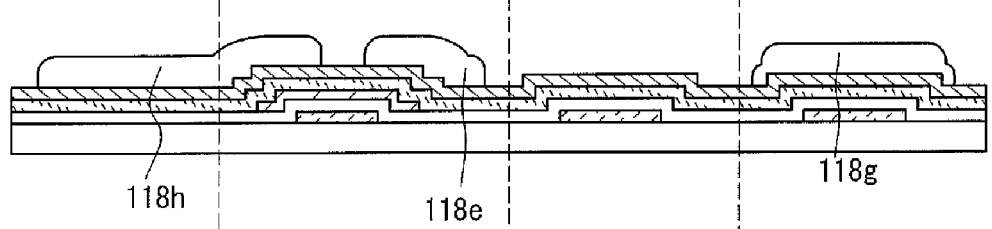
FIGS. 8A to 8C are cross-sectional views illustrating a method for manufacturing a semiconductor device according to one embodiment of the present invention.

Next, as illustrated in FIG. 7A and FIG. 8A, resist masks 118a, 118b, 118e, 118g, and 118h are formed over the conductive film 115. The resist masks 118a, 118b, 118e, 118g, and 118h are resist masks having regions with different thicknesses, which are obtained using a multi-tone mask. The thickness of the resist masks 118a and 118b provided in the driver circuit portion is larger than the thickness of the resist masks 118e, 118g, and 118h provided in the pixel portion.

Figure 8B:
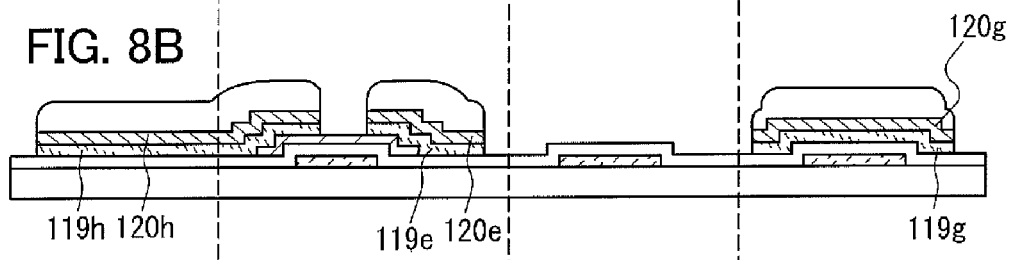

Next, as illustrated in FIG. 7B and FIG. 8B, the conductive film 114 and the conductive film 115 are etched using the resist masks 118a, 118b, 118e, 118g, and 118h. With the etching, the conductive layers 119a, 120a, 119b, 120b, 119e, 120e, 119g, 120g, 119h, and 120h can be formed. Further, some of channel formation regions in the semiconductor layers 113a and 113e can be etched.

Figure 8C:
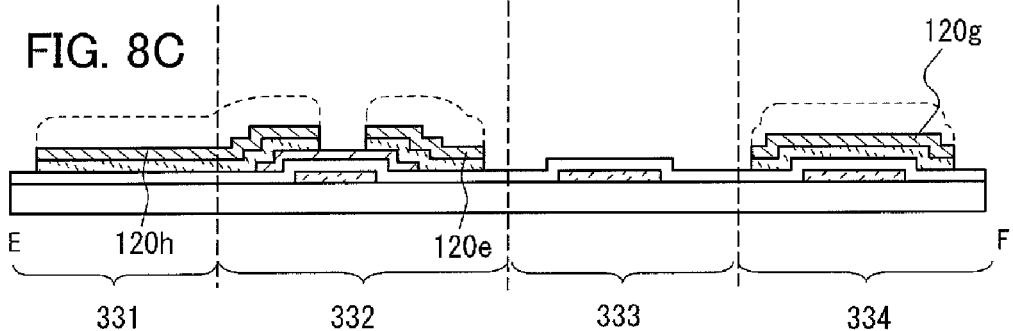

Then, as illustrated in FIG. 7C and FIG. 8C, ashing is performed on the resist masks 118a, 118b, 118e, 118g, and 118h. For example, ashing or the like in which oxygen plasma is used may be performed. When the resist masks 118a and 118b are reduced (downsized) by the ashing, resist masks 121a and 121b are formed and some of the conductive layers 120a and 120b are exposed. Further, with this ashing treatment, the resist masks 118e, 118g, and 118h in the pixel portion, which have small thickness, are removed, and the conductive layers 120e, 120g, and 120h are exposed. In this manner, with the use of the resist mask formed using the multi-tone mask, a resist mask is not additionally used, so that steps can be simplified.

Figure 9A:
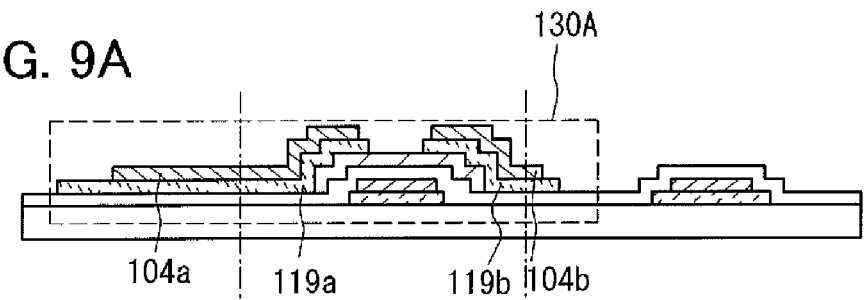
FIGS. 9A to 9D are cross-sectional views illustrating a method for manufacturing a semiconductor device according to one embodiment of the present invention.

Next, as illustrated in FIG. 9A and FIG. 11A, the conductive layers 120a, 120b, 120e, 120g, and 120h are etched using the resist masks 121a and 121b. Thus, conductive layers 104a and 104b which are obtained by removal of some of the conductive layers 120a and 120b are formed, and some of the conductive layers 119a and 119b are exposed. Note that the end portions of the conductive layer 119a protrude from end portions of the conductive layer 104a, and the end portions of the conductive layer 119b protrude from end portions of the conductive layer 104b. By removal of the conductive layers 120e, 120g, and 120h, the conductive layers 119e, 119g, and 119h are exposed. After the etching, the resist masks 121a and 121b are removed.

Through the above steps, the thin film transistor 130A which is illustrated in FIGS. 1A to 1C and the thin film transistor 130B and a capacitor 131 which are illustrated in FIGS. 2A to 2C can be formed, and the thin film transistor 130B and the capacitor 131 can have light-transmitting properties. Further, the source wiring portion and the gate wiring portion in the pixel portion can have light-transmitting properties.

Note that the conditions of the etching may be set as appropriate so that the lower semiconductor layers 113a and 113e are left. As each of the materials of the semiconductor layers 113a and 113e and the materials of the conductive layers 119a, 119b, 119e, 119g, and 119h, a material with high etching selectivity is preferably used. For example, a metal oxide material containing Sn (e.g., $SnZnO_x$ (x>0) or $SnGaZnO_x$ (x>0)) may be used as each of the materials of the semiconductor layers, and ITO or the like may be used as each of the materials of the conductive layers 119a, 119b, 119e, 119g, and 119h. When the light-blocking conductive layer is removed, part of the light-transmitting conductive layer (for example, a surface portion which is in contact with the light-blocking conductive layer) is also removed in some cases. Therefore, for example, the thickness of the conductive layers 119a and 119b is often larger than the thickness of the conductive layers 119e, 119g, and 119h.

Figure 9B:
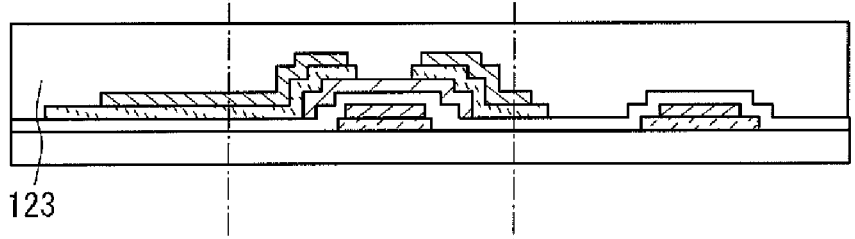

Next, as illustrated in FIG. 9B and FIG. 11B, the insulating layer 123 is formed over the thin film transistors 130A and 130B and the capacitor 131. The insulating layer 123 can be formed to have a single-layer structure or a layered structure. When the insulating layer 123 is formed to have a layered structure, the transmittance of each of films is preferably high enough. The insulating layer 123 functions as a film which protects the thin film transistor from an impurity or the like. Further, the insulating layer 123 can function as a film for smoothing unevenness due to the thin film transistor, the capacitor, the wiring, or the like and for flattening a surface where the thin film transistor, the capacitor, the wiring, or the like is formed.

In particular, since the thin film transistor 130B and the capacitor 131 in the pixel portion can be formed as light-transmitting elements, it is advantageous to flatten an upper portion where these elements are formed by smoothing unevenness due to the thin film transistor 130B, the capacitor 131, the wiring, or the like in order to use the region where these elements are formed as a display region.

The insulating layer 123 is preferably formed using a film containing silicon nitride. A silicon nitride film is preferable because it is highly effective in blocking impurities. Alternatively, the insulating layer 123 is preferably formed using a film containing an organic material. As the organic material, acrylic, polyimide, polyamide, or the like is preferable. Such an organic material is preferable because of high functionality of flattening unevenness. Therefore, in the case where the insulating layer 123 is formed to have a layered structure of a silicon nitride film and a film of an organic material, it is preferable to provide the silicon nitride film on a lower side and the film containing an organic material on an upper side.

Further, before the formation of the insulating layer 123, an oxide insulating film can be formed in contact with the semiconductor layer 113a and the semiconductor layer 113e, for example. With the provision of the oxide insulating film, the carrier concentration of the semiconductor layers can be lowered.

In this case, the oxide insulating film has a thickness of at least 1 nm or larger and can be formed by a method by which an impurity such as water or hydrogen are not mixed into the oxide insulating film, such as sputtering, as appropriate. The substrate temperature at the time of deposition is in the range of room temperature to 300° C. A silicon oxide film can be deposited by sputtering in a rare gas (typically argon) atmosphere, an oxygen atmosphere, or an atmosphere including a rare gas (typically argon) and oxygen. Further, a silicon oxide target or a silicon target can be used as a target. For example, silicon oxide can be deposited using a silicon target in an atmosphere including oxygen and nitrogen by sputtering. The oxide insulating film which is formed in contact with the oxide semiconductor layer whose resistance is lowered by dehydration or dehydrogenation is formed using an inorganic insulating film which does not contain an impurity such as water, a hydrogen ion, or $OH^-$ and blocks entry of such an impurity from the outside, typically a silicon oxide film, a silicon nitride oxide film, an aluminum oxide film, or an aluminum oxynitride film.

Next, heat treatment (preferably at 200 to 400° C., for example, 250 to 350° C.) may be performed in an inert gas atmosphere or an oxygen gas atmosphere. With the heat treatment, heat is applied while grooves in the semiconductor layer 113a and the semiconductor layer 113e are in contact with the oxide insulating film.

Through the above steps, heat treatment for dehydration or dehydrogenation is performed on the oxide semiconductor film after deposition to reduce the resistance, and then, the oxide semiconductor film is changed into a high-resistant source region or a high-resistant drain region and part of the high-resistant drain region is selectively made to be in an oxygen-excess state. Accordingly, the channel formation region overlapping with the gate electrode layer becomes intrinsic, and the high-resistant source region which overlaps with the source electrode layer and the high-resistant drain region which overlaps with the drain electrode layer are formed in a self-aligning manner. Further, the entire oxide semiconductor layer becomes intrinsic and serves as an oxide semiconductor layer including a channel formation region.

Figure 9C:
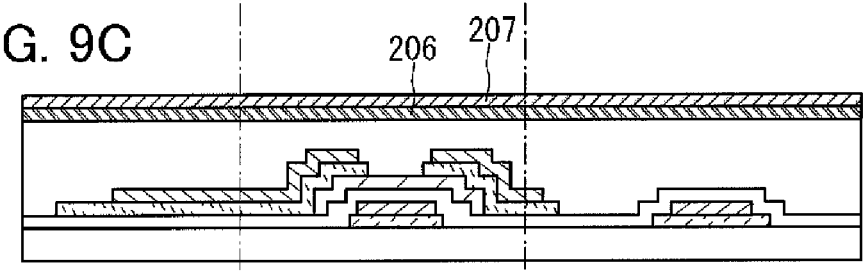

Next, as illustrated in FIG. 9C and FIG. 11C, a conductive film 206 and a conductive film 207 are stacked over the insulating layer 123 by sputtering. These steps can be performed successively and sequential sputtering can be performed using a multi-chamber. By successively forming the conductive film 206 and the conductive film 207, throughput is improved and contamination by an impurity or dust can be suppressed.

It is preferable that the transmittance of the conductive film 206 be sufficiently high. Further, the transmittance of the conductive film 206 is preferably higher than the transmittance of the conductive film 207.

The conductive film 206 can be formed to have a single-layer structure or a layered structure including one or a plurality of materials which can be used for the conductive film 102 illustrated in FIGS. 3A and 3B and FIGS. 4A and 4B.

The conductive film 206 is preferably formed using a material which is substantially the same as the materials of the conductive film 102 and the conductive film 114. Substantially the same material is a material whose element of a main component is the same. For example, in terms of impurities, the kind and the concentration of elements contained are different from each other in some cases. When the conductive film 206 is formed using the material which is substantially the same as the materials of the conductive film 102 and the conductive film 114 by sputtering or evaporation in this manner, there is an advantage that the material can be shared among the conductive films 206, 102, and 114. When the material can be shared, the same manufacturing apparatus can be used, manufacturing steps can proceed smoothly, and throughput can be improved, which leads to reduction in cost.

It is preferable that the resistance value of the conductive film 207 be sufficiently low and the conductivity of the conductive film 207 be sufficiently high. In addition, the resistance value of the conductive film 206 is preferably higher than the resistance value of the conductive film 207.

The conductive film 207 can be formed to have a single-layer structure or a layered structure including one or a plurality of materials which can be used for the conductive film 103 illustrated in FIGS. 3A and 3B and FIGS. 4A and 4B. Further, the conductive film 206 is preferably formed using a material which is different from that used for the conductive film 207. Alternatively, the conductive film 207 is preferably formed to have a layered structure which is different from that of the light-blocking conductive film. This is because, in manufacturing steps, temperatures of the conductive film 206 and the conductive film 207 are different from each other in many cases. In general, the conductive film 207 tends to have a higher temperature. The conductive film 207 is preferably formed to have a single-layer structure or a layered structure of a layer formed using a material having low wiring resistance. The conductive film 206 is preferably formed using a light-transmitting material.

Note that in the case where the conductive film 207 is formed over the conductive film 206, both the films react with each other in some cases. For example, in the case where a top surface (a surface which is in contact with the conductive film 207) of the conductive film 206 is formed using ITO and a bottom surface (a surface which is in contact with the conductive film 206) of the conductive film 207 is formed using aluminum, chemical reaction occurs therebetween in some cases. Therefore, in order to avoid such chemical reaction, a high-melting point material is preferably used for the bottom surface (the surface which is in contact with the conductive film 206) of the conductive film 207. For example, as the high-melting point material, molybdenum (Mo), titanium (Ti), tungsten (W), neodymium (Nd), or the like can be used. It is preferable to form the conductive film 207 as a multilayer film with the use of a material having a low resistance value over the film formed using the high-melting point material. As the material having a low resistance value, aluminum (Al), copper (Cu), silver (Ag), or the like can be used. Such a material has a light-blocking property and reflectivity.

Figure 9D:
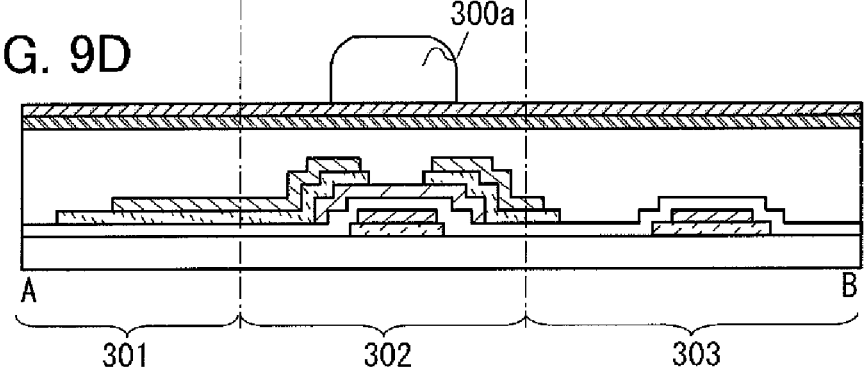

Next, as illustrated in FIG. 9D and FIG. 11D, resist masks 300a and 300e are formed over the conductive film 207. The resist masks 300a and 300e are resist masks having regions with different thicknesses, which are obtained using a multi-tone mask. The thickness of the resist masks 300a provided in the driver circuit portion is larger than the thickness of the resist mask 300e provided in the pixel portion.

Figure 10A:
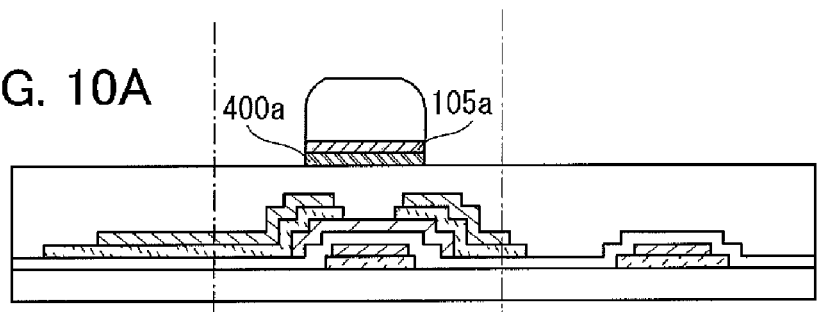
FIGS. 10A to 10D are cross-sectional views illustrating a method for manufacturing a semiconductor device according to one embodiment of the present invention.

Next, as illustrated in FIG. 10A and FIG. 12A, the conductive film 206 and the conductive film 207 are etched using the resist masks 300a and 300e. With the etching, the conductive layers 400a and 400e and conductive layers 105a and 105e can be formed.

Figure 10B:
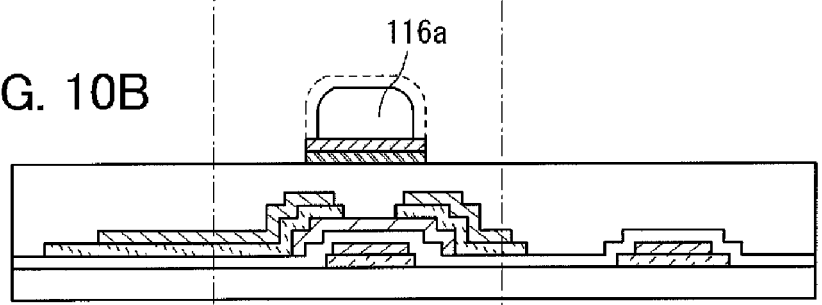

Then, as illustrated in FIG. 10B and FIG. 12B, ashing is performed on the resist masks 300a and 300e. For example, ashing or the like in which oxygen plasma is used may be performed. When the resist mask 300a is reduced (downsized) by the ashing, a resist mask 116a is formed and part of the conductive layer 105a is exposed. Further, with this ashing treatment, the resist mask 300e in the pixel portion, which has small thickness, is removed, and the conductive layer 105e is exposed. In this manner, with the use of the resist mask formed using the multi-tone mask, a resist mask is not additionally used, so that steps can be simplified.

Figure 10C:
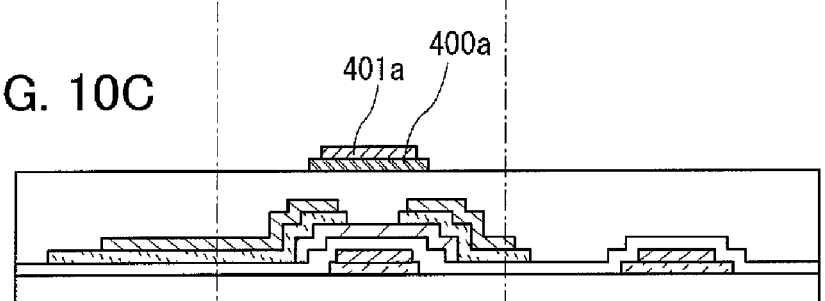

Next, as illustrated in FIG. 10C and FIG. 12C, the conductive layer 105a is etched using the resist mask 116a. Thus, the conductive layer 401a which is obtained by removal of part of the conductive layer 105a is formed, and part of the conductive layers 400a is exposed. Further, the conductive layer 105e is removed and the conductive layer 400e is exposed. Note that end portions of the conductive layer 400a protrude from end portions of the conductive layer 401a. Furthermore, the areas of conductive layers 400a and 401a are greatly different from each other. That is, the area of the conductive layer 400a is larger than the area of the conductive layer 401a. After the etching, the resist mask 116a is removed.

Figure 10D:
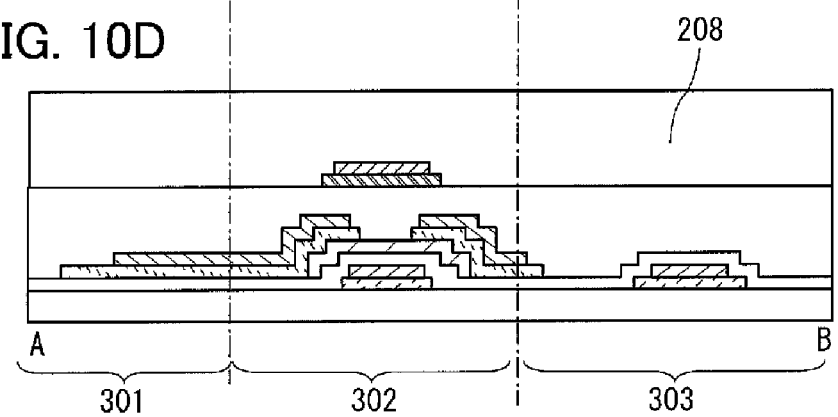

Next, as illustrated in FIG. 10D and FIG. 12D, an insulating layer 208 is formed over the conductive layers 400a and 400e and the conductive layer 401a. The insulating layer 208 can be formed to have a single-layer structure or a layered structure. When the insulating layer 208 is formed to have a layered structure, the transmittance of each of films is preferably high enough. The insulating layer 208 can function as a film for smoothing unevenness due to the conductive layers 400a and 400e and the conductive layer 401a and for flattening surfaces. That is, the insulating layer 208 can function as a planarization film. The insulating layer 208 is preferably formed using a film containing silicon nitride. A silicon nitride film is preferable because it is highly effective in blocking impurities. Alternatively, the insulating layer 208 is preferably formed using a film containing an organic material. As the organic material, acrylic, polyimide, polyamide, or the like is preferable. Such an organic material is preferable because of high functionality of flattening unevenness. Therefore, in the case where the insulating layer 208 is formed to have a layered structure of a silicon nitride film and a film of an organic material, it is preferable to provide the silicon nitride film on a lower side and the film containing an organic material on an upper side.

Note that each of the insulating layer 123 and the insulating layer 208 can have a function as a color filter. When a color filter is provided over the substrate 101, it is not necessary to provide a color filter on a counter substrate. Therefore, a margin for adjusting the positions of the two substrates is not necessary, which can facilitate manufacture of a panel.

Next, a resist mask is formed over the insulating layer 208. When etching is performed using the resist mask, some of the insulating layer 123 and the insulating layer 208 are removed so that a contact hole 117 is formed.

Then, as illustrated in FIG. 12E, a conductive film is formed over the insulating layer 123 and in the contact hole 117, and a resist mask is formed over the conductive film. When etching is performed using the resist mask, part of the conductive film is removed so that conductive layers 124e, 124g, and 124h are formed. The conductive film can be formed to have a single-layer structure or a layered structure. When the conductive film is formed to have a layered structure, the transmittance of each of films is preferably high enough.

The conductive layers 124e, 124g, and 124h can function as pixel electrodes. Alternatively, the conductive layers 124e, 124g, and 124h can function as electrodes of the capacitor. Therefore, it is preferable that the conductive layers 124e, 124g, and 124h be formed using a light-transmitting material or a material having high transmittance.

The conductive layers 124e, 124g, and 124h can be connected to the source wiring, the source electrode layer, the gate wiring, the gate electrode layer, the pixel electrode, the capacitor wiring, the electrode of the capacitor, or the like through the contact hole 117. Therefore, the conductive layers 124e, 124g, and 124h can function as wirings for connecting conductors to each other.

The conductive layers 124e, 124g, and 124h are preferably formed using a material which is substantially the same as the material of the conductive film 102. Alternatively, the conductive layers 124e, 124g, and 124h are preferably formed using a material which is substantially the same as the material of the conductive film 114. Alternatively, the conductive layers 124e, 124g, and 124h are preferably formed using a material which is substantially the same as the material of the conductive film 206. When the conductive layers 124e, 124g, and 124h are formed using the material which is substantially the same as the material of the conductive film 102, 114, or 206 by sputtering or evaporation in this manner, there is an advantage that the material can be shared. When the material can be shared, the same manufacturing apparatus can be used, manufacturing steps can proceed smoothly, and throughput can be improved, which leads to reduction in cost.

Through the steps illustrated in FIGS. 3A to 3D, FIGS. 4A to 4D, FIGS. 5A to 5D, FIGS. 6A to 6D, FIGS. 7A to 7C, FIGS. 8A to 8C, FIGS. 9A to 9D, FIGS. 10A to 10D, FIGS. 11A to 11D, and FIGS. 12A to 12E, over the same substrate, the thin film transistor 130A in the driver circuit portion and the thin film transistor 130B in the pixel portion can be separately formed with the use of six masks. Further, the capacitor 131 can be formed over the same substrate. The thin film transistors 130B and the capacitors 131 are arranged in matrix to correspond to individual pixels. Thus, one of the substrates for manufacturing an active matrix display device can be obtained. In this specification, such a substrate is referred to as an active matrix substrate for convenience.

By the method for manufacturing a semiconductor device, which is illustrated in FIGS. 3A to 3D, FIGS. 4A to 4D, FIGS. 5A to 5D, FIGS. 6A to 6D, FIGS. 7A to 7C, FIGS. 8A to 8C, FIGS. 9A to 9D, FIGS. 10A to 10D, FIGS. 11A to 11D, and FIGS. 12A to 12E, a light-transmitting conductive film is formed; a conductive film whose resistance value is lower than that of the light-transmitting conductive film is stacked over the light-transmitting conductive film; and the stacked films are selectively etched using a multi-tone mask so that a gate electrode layer, a source electrode layer, or a drain electrode layer of a thin film transistor in a driver circuit portion which is formed using the stack of the light-transmitting conductive film and the conductive film whose resistance value is lower than that of the light-transmitting conductive film, and a gate electrode layer, a source electrode layer, or a drain electrode layer of a thin film transistor in a pixel portion which is formed using the light-transmitting conductive film, are formed. Thus, without the increase in the number of masks, gate electrode layers, source electrode layers, or drain electrode layers with different structures can be separately formed in the driver circuit portion and the pixel portion. Therefore, the number of manufacturing steps can be reduced, so that manufacturing cost can be reduced.

By the method for manufacturing a semiconductor device, which is illustrated in FIGS. 3A to 3D, FIGS. 4A to 4D, FIGS. 5A to 5D, FIGS. 6A to 6D, FIGS. 7A to 7C, FIGS. 8A to 8C, FIGS. 9A to 9D, FIGS. 10A to 10D, FIGS. 11A to 11D, and FIGS. 12A to 12E, a light-transmitting conductive film is formed; a conductive film whose resistance value is lower than that of the light-transmitting conductive film is stacked over the light-transmitting conductive film; and the stacked films are selectively etched using a multi-tone mask so that a gate wiring, a source wiring, or a different lead wiring of the thin film transistor in the driver circuit portion which is formed using the stack of the light-transmitting conductive film and the conductive film whose resistance value is lower than that of the light-transmitting conductive film, and a gate wiring, a source wiring, or a different lead wiring of the thin film transistor in the pixel portion which is formed using the light-transmitting conductive film, can be formed. Thus, without the increase in the number of masks, gate wirings, source wirings, or other lead wirings with different structures can be separately formed in the driver circuit portion and the pixel portion. Therefore, the number of manufacturing steps can be reduced, so that manufacturing cost can be reduced.

By the method for manufacturing a semiconductor device, which is illustrated in FIGS. 3A to 3D, FIGS. 4A to 4D, FIGS. 5A to 5D, FIGS. 6A to 6D, FIGS. 7A to 7C, FIGS. 8A to 8C, FIGS. 9A to 9D, FIGS. 10A to 10D, FIGS. 11A to 11D, and FIGS. 12A to 12E, a storage capacitor formed using a light-transmitting conductive layer and a dielectric layer can be formed in the same step as the thin film transistor in the pixel portion. Thus, without the increase in the number of masks, the thin film transistor and the storage capacitor can be separately formed in the pixel portion. Therefore, the number of manufacturing steps can be reduced, so that manufacturing cost can be reduced.

By the method for manufacturing a semiconductor device, which is illustrated in FIGS. 3A to 3D, FIGS. 4A to 4D, FIGS. 5A to 5D, FIGS. 6A to 6D, FIGS. 7A to 7C, FIGS. 8A to 8C, FIGS. 9A to 9D, FIGS. 10A to 10D, FIGS. 11A to 11D, and FIGS. 12A to 12E, a conductive film whose resistance value is lower than that of a light-transmitting conductive film is stacked over the light-transmitting conductive film; and for example, the stacked films are selectively etched using a multi-tone mask so that a conductive layer which overlaps with a channel formation region of the thin film transistor in the driver circuit portion which is formed using the stack of the light-transmitting conductive film and the conductive film whose resistance value is lower than that of the light-transmitting conductive film, and a conductive layer which overlaps with a channel formation region of the thin film transistor in the pixel portion which is formed using the light-transmitting conductive film, can be formed. The conductive layers which overlap with the channel formation regions of the thin film transistors can function as back gate electrode layers of the thin film transistors. By the method for manufacturing a semiconductor device, which is illustrated in FIGS. 3A to 3D, FIGS. 4A to 4D, FIGS. 5A to 5D, FIGS. 6A to 6D, FIGS. 7A to 7C, FIGS. 8A to 8C, FIGS. 9A to 9D, FIGS. 10A to 10D, FIGS. 11A to 11D, and FIGS. 12A to 12E, without the increase in the number of masks, conductive layers with different structures can be separately formed in the driver circuit portion and the pixel portion. Therefore, the number of manufacturing steps can be reduced, so that manufacturing cost can be reduced.

Figure 13A:
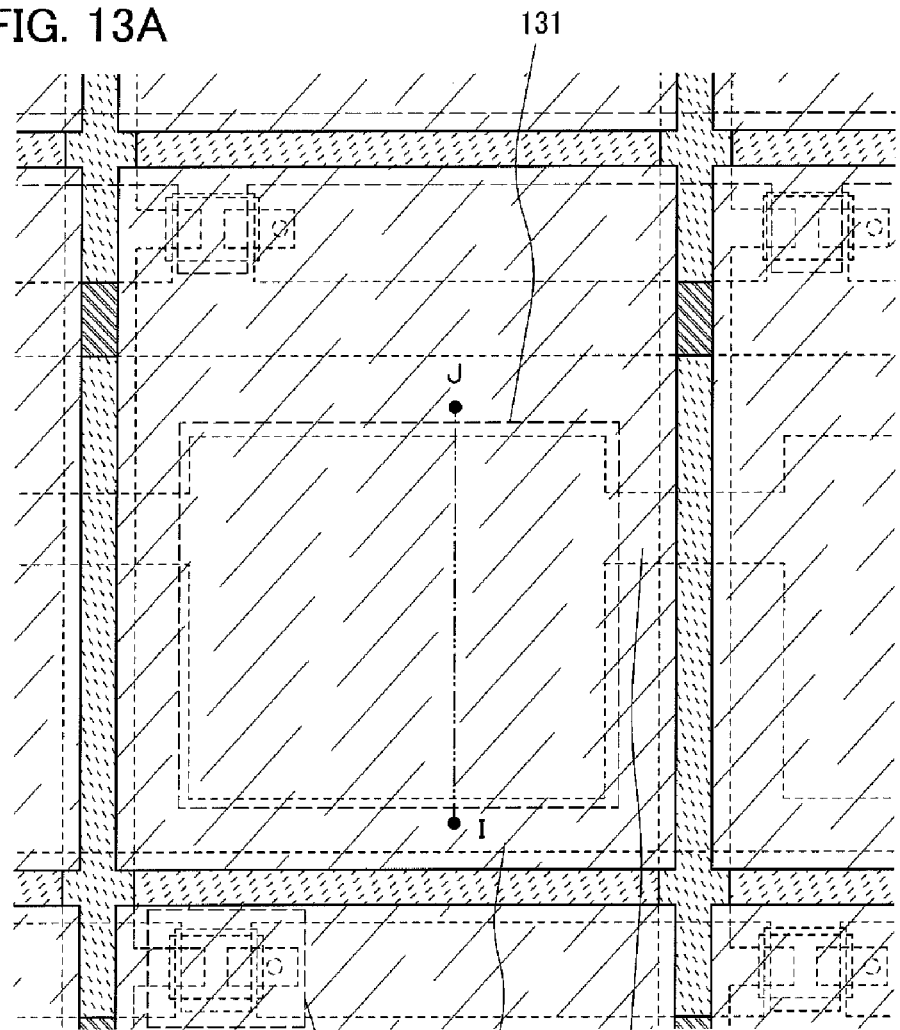
FIG. 13A is a top view of a semiconductor device according to one embodiment of the present invention.
Figure 13B:
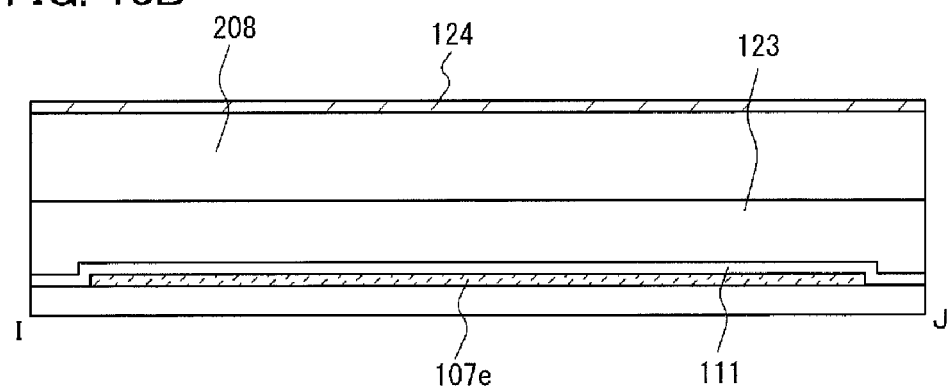
FIG. 13B is a cross-sectional view of the semiconductor device.

Next, an example of the structure of the semiconductor device including a pixel portion which is different from that in FIGS. 2A to 2C is described with reference to FIGS. 13A and 13B. FIG. 13A is a top view of a semiconductor device of this embodiment, and FIG. 13B is a cross-sectional view taken along line J-K in FIG. 13A. FIGS. 13A and 13B differ from FIGS. 2A to 2C in that the area of a lower electrode of a storage capacitor portion is made larger and an upper electrode of the storage capacitor portion is a pixel electrode 124. The size of the storage capacitor portion is preferably larger than pixel pitch by 70% or more or 80% or more. In the following description, since the structure except for the storage capacitor portion and the storage capacitor wiring in FIGS. 13A and 13B is the same as that in FIGS. 2A to 2C, detailed description thereof is omitted.

With such a structure, transmittance can be increased because the upper electrode of the storage capacitor portion does not need to be formed when the source wiring and the source electrode layer and the drain electrode layer are formed. In addition, the large storage capacitor portion with high transmittance can be formed. By forming the large storage capacitor portion, even if the thin film transistor is turned off, a potential of the pixel electrode is easily held. Further, a feedthrough potential can be lowered. Furthermore, even if the large storage capacitor portion is formed, the aperture ratio can be increased and power consumption can be reduced. Moreover, since the insulating film has two layers, interlayer short-circuit due to a pinhole or the like in the insulating film can be prevented, unevenness of the capacitor wiring can be reduced, and alignment disorder of liquid crystals can be suppressed.

Next, an example of the structure of the semiconductor device, which is different from that in FIGS. 2A to 2C, is described with reference to FIGS. 14A and 14B.

Figure 14A:
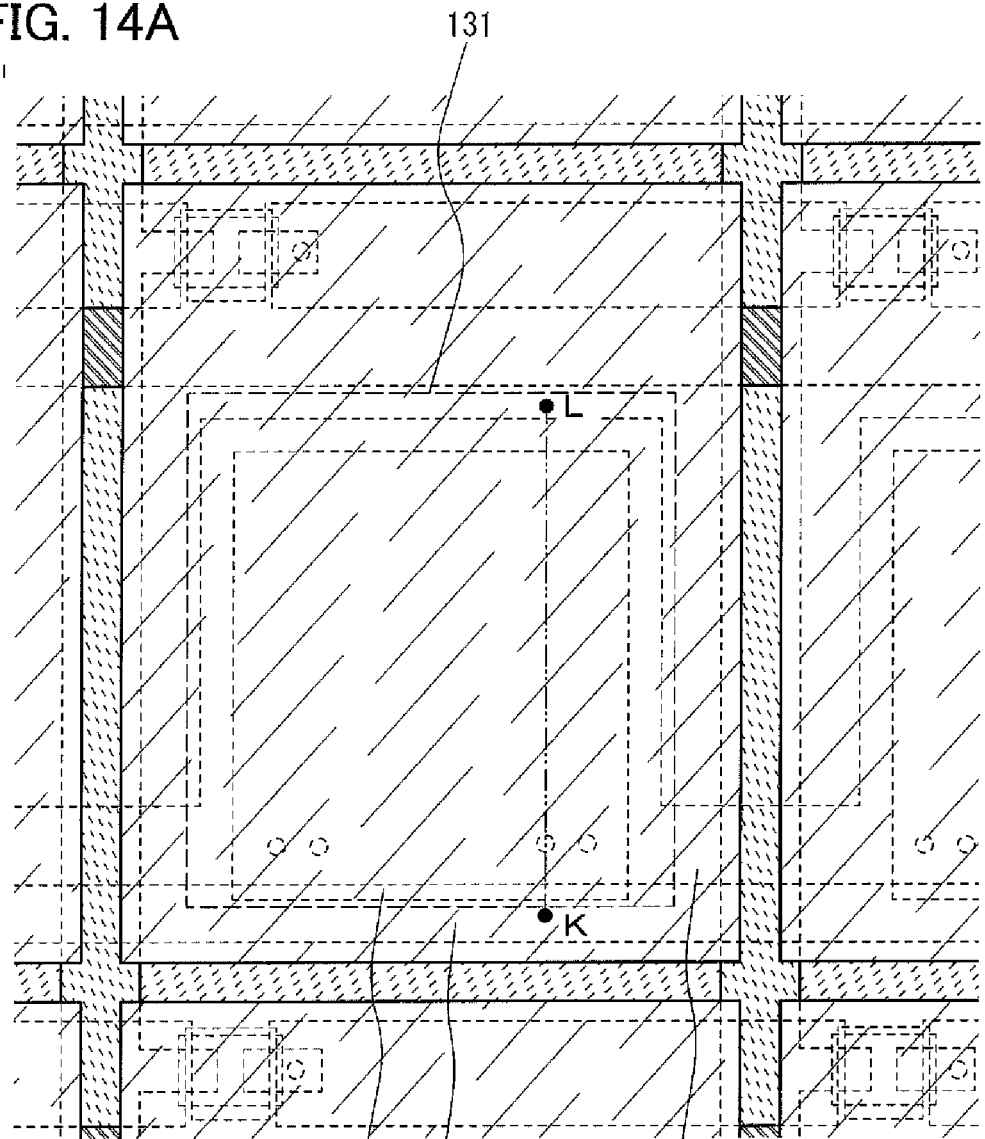
FIG. 14A is a top view of a semiconductor device according to one embodiment of the present invention.
Figure 14B:
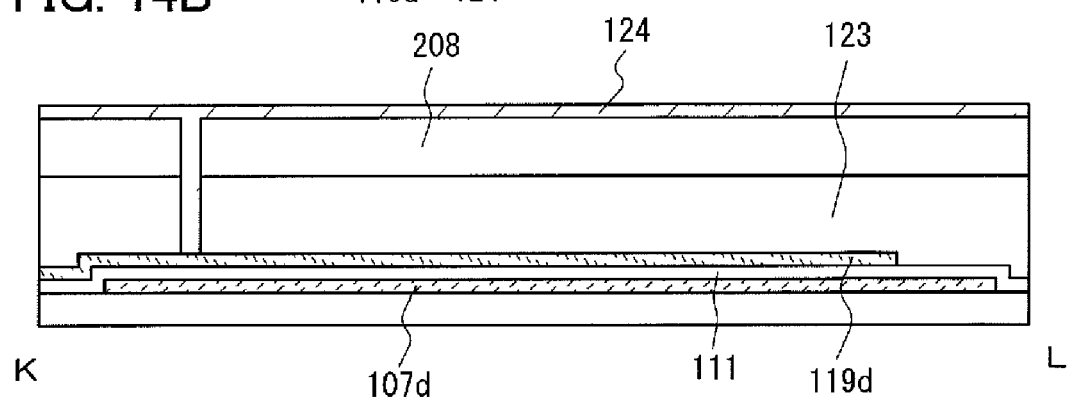
FIG. 14B is a cross-sectional view of the semiconductor device.

FIG. 14A is a top view of a semiconductor device of this embodiment, and FIG. 14B is a cross-sectional view taken along line K-L in FIG. 14A. FIGS. 14A and 14B differ from FIGS. 2A to 2C in that a lower electrode of a storage capacitor portion is made larger, a capacitor wiring, a gate wiring, and a source wiring are formed using light-transmitting conductive layers, and an upper electrode of the storage capacitor portion is made larger. The size of the storage capacitor portion is preferably larger than pixel pitch by 70% or more or 80% or more. In the following description, since the structure except for the storage capacitor portion in FIGS. 14A and 14B is the same as that in FIGS. 2A to 2C, detailed description thereof is omitted.

With such a structure, distortion in the waveform of a signal and voltage drop due to wiring resistance can be suppressed because the capacitor wiring can be formed using a material with a low resistance value and high conductivity. In addition, even if disorder of the alignment of liquid crystals is caused by unevenness due to a contact hole in the pixel electrode, light leakage can be prevented by the light-blocking conductive layer in the capacitor wiring. Further, by forming the large storage capacitor, even if the thin film transistor is turned off, a potential of the pixel electrode is easily held. Furthermore, a feedthrough potential can be lowered. Moreover, even if the large storage capacitor is formed, the aperture ratio can be increased and power consumption can be reduced.

Figure 15A:
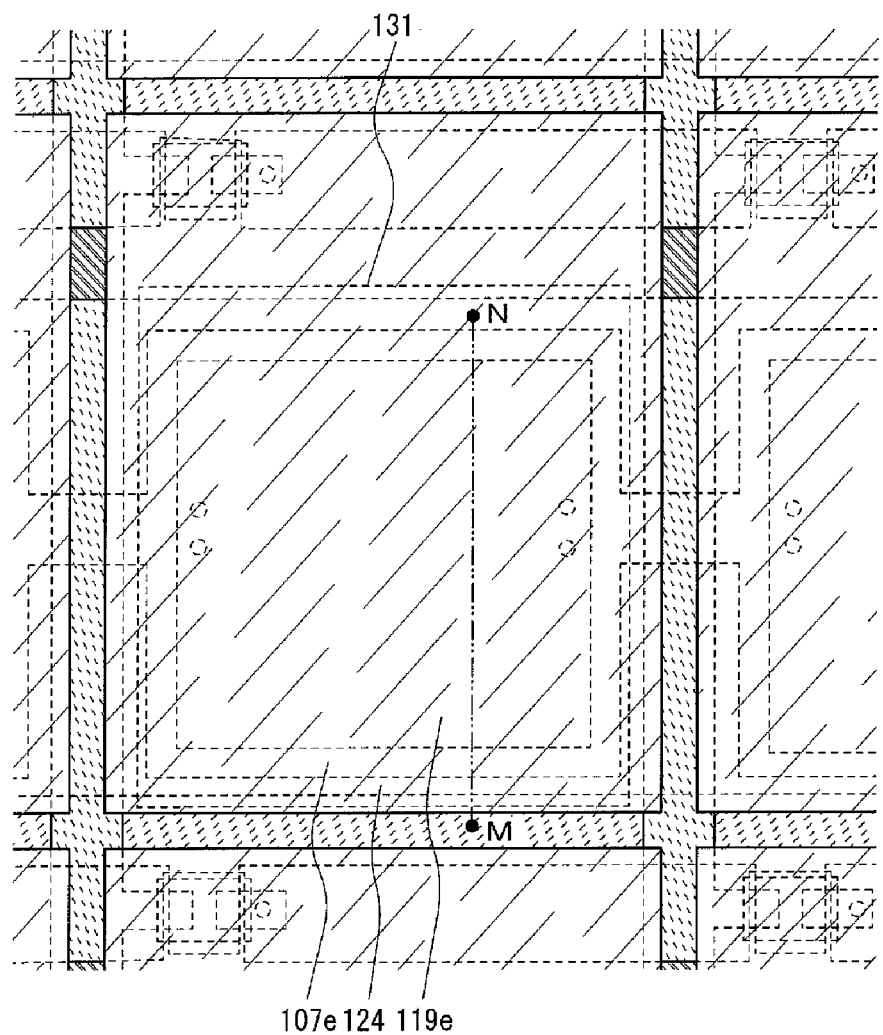
FIG. 15A is a top view of a semiconductor device according to one embodiment of the present invention.
Figure 15B:
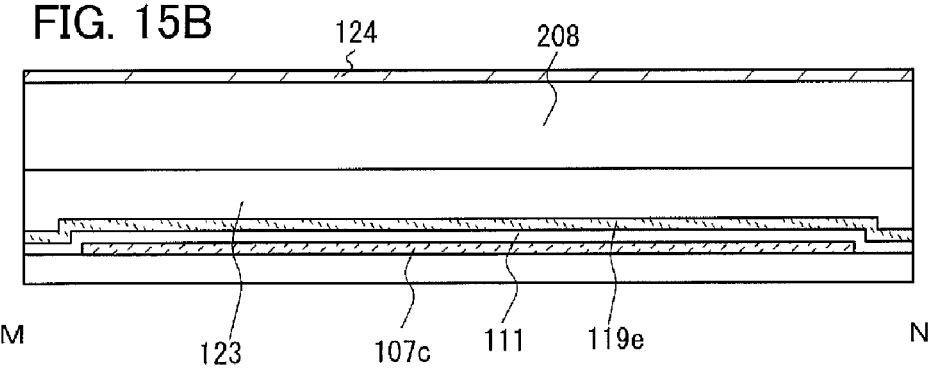
FIG. 15B is a cross-sectional view of the semiconductor device.

Next, an example of the structure of the semiconductor device, which is different from that in FIGS. 2A to 2C, is described with reference to FIGS. 15A and 15B. FIG. 15A is a top view of a semiconductor device of this embodiment, and FIG. 15B is a cross-sectional view taken along line M-N in FIG. 15A. FIGS. 15A and 15B differ from FIGS. 2A to 2C in that a light-transmitting conductive layer which functions as a lower electrode of a storage capacitor portion is made larger and a light-transmitting conductive layer which functions as an upper electrode of the storage capacitor portion is made larger. The size of the storage capacitor portion is preferably larger than pixel pitch by 70% or more or 80% or more. In the following description, since the structure except for the storage capacitor portion in FIGS. 15A and 15B is the same as that in FIGS. 2A to 2C, detailed description thereof is omitted.

With such a structure, the large storage capacitor with high transmittance can be formed. By forming the large storage capacitor, even if the thin film transistor is turned off, a potential of the pixel electrode is easily held. Further, a feedthrough potential can be lowered. Furthermore, even if the large storage capacitor is formed, the aperture ratio can be increased and power consumption can be reduced.

This embodiment can be freely combined with any of the other embodiments.

Embodiment 2

According to one embodiment of the present invention, thin film transistors are formed, and a semiconductor device having a display function (also referred to as a display device) can be manufactured using the thin film transistor in a pixel portion and the thin film transistor in a driver circuit. Further, when part or whole of a driver circuit including a thin film transistor is formed over the substrate as a pixel portion including a thin film transistor, a system-on-panel can be obtained.

The display device includes a display element. As the display element, a liquid crystal element (also referred to as a liquid crystal display element) or a light-emitting element (also referred to as a light-emitting display element) can be used. The light-emitting element includes, in its category, an element whose luminance is controlled by current or voltage, and specifically includes an inorganic electroluminescent (EL) element, an organic EL element, and the like. Further, a display medium whose contrast is changed by electric action, such as electronic ink, can be used.

In addition, the display device includes a panel in which the display element is sealed, and a module in which an IC or the like including a controller is mounted on the panel. Further, an element substrate, which corresponds to one embodiment before the display element is completed in a manufacturing process of the display device, is provided with a means for supplying current to the display element in each of a plurality of pixels. Specifically, the element substrate may be in a state in which only a pixel electrode of the display element is formed, a state after the formation of a conductive film serving as a pixel electrode and before etching of the conductive film so that the pixel electrode is formed, or any other states.

Note that a display device in this specification refers to an image display device or a light source (including a lighting device). Further, the display device includes the following modules in its category: a module including a connector such as a flexible printed circuit (FPC), a tape automated bonding (TAB) tape, or a tape carrier package (TCP); a module having a TAB tape or a TCP which is provided with a printed wiring board at the end thereof; and a module having an integrated circuit (IC) which is directly mounted on a display element by a chip on glass (COG) method.

Figure 17A:
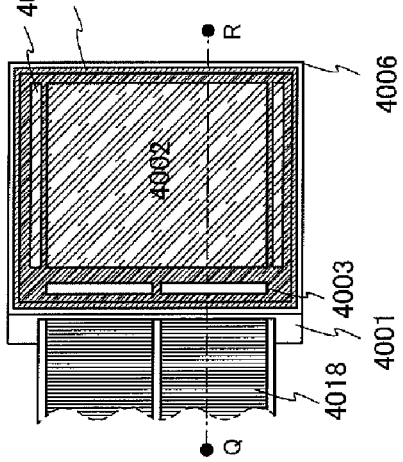
FIG. 17A is a top view of a semiconductor device according to one embodiment of the present invention.
Figure 17B:
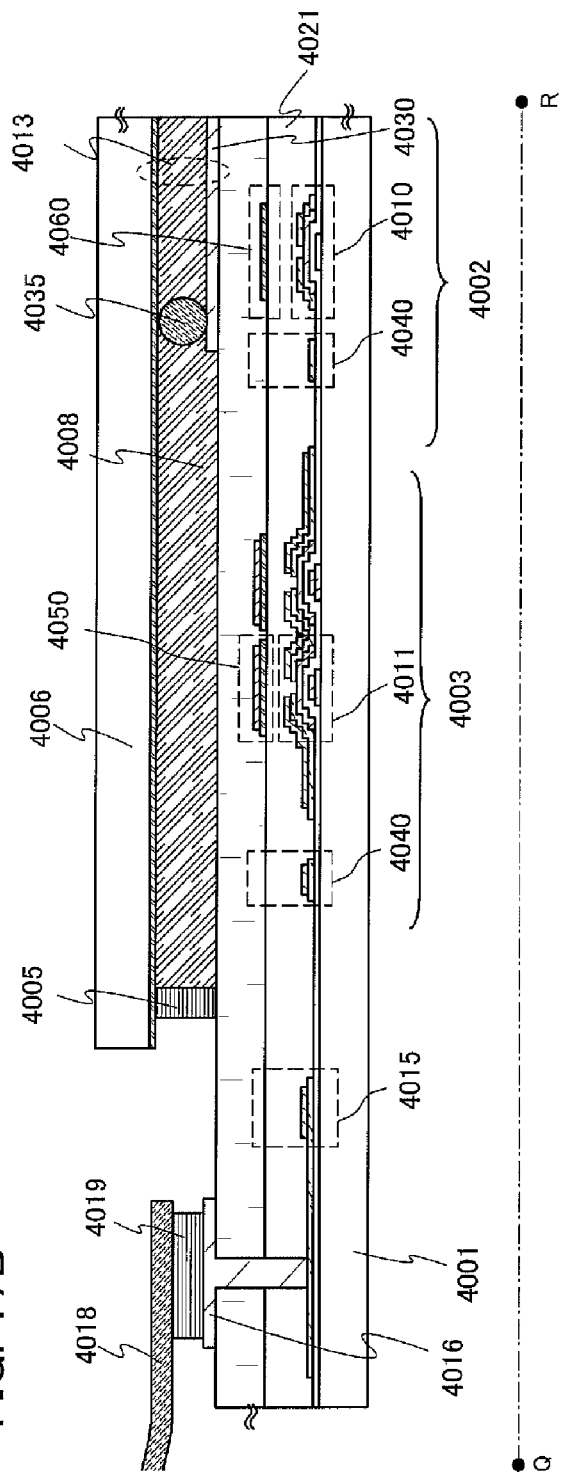
FIG. 17B is a cross-sectional view of the semiconductor device.

The appearance and a cross section of a liquid crystal display panel, which is one embodiment of a semiconductor device, is described with reference to FIGS. 17A and 17B. FIG. 17A is a plan view of a panel in which thin film transistors 4010 and 4011 and a liquid crystal element 4013 are sealed between a first substrate 4001 and a second substrate 4006 with a sealant 4005. FIG. 17B is a cross-sectional view taken along line Q-R in FIG. 17A.

Note that in each of the thin film transistors 4010 and 4011 illustrated in FIGS. 17A and 17B, end portions of a gate electrode layer, a gate insulating layer, a semiconductor layer, a source electrode layer, and a drain electrode layer are tapered. In this manner, by tapering the end portions of the layers, coverage with layers formed on and in contact with the layers can be improved, disconnection can be prevented, and the yield of the semiconductor device can be improved. Note that this embodiment is not limited to this structure. The end portion of the gate electrode layer, the gate insulating layer, the semiconductor layer, the source electrode layer, or the drain electrode layer is not necessarily tapered. Alternatively, one or more of the layers may be tapered.

The sealant 4005 is provided so as to surround a pixel portion 4002, a signal line driver circuit 4003, and a scan line driver circuit 4004 which are provided over the first substrate 4001. The second substrate 4006 is provided over the pixel portion 4002, the signal line driver circuit, and the scan line driver circuit 4004. Thus, the pixel portion 4002, the signal line driver circuit 4003, and the scan line driver circuit 4004 are sealed together with a liquid crystal 4008 by the first substrate 4001, the sealant 4005, and the second substrate 4006. Note that in this embodiment, an example is described in which the pixel portion 4002, the signal line driver circuit 4003, and the scan line driver circuit 4004 are formed over the first substrate 4001: however, the signal line driver circuit 4003 or the scan line driver circuit 4004 may be formed over a substrate separately prepared with the use of a thin film transistor including a single crystal semiconductor or a polycrystalline semiconductor so as to be attached onto the first substrate 4001. FIGS. 17A and 17B illustrate examples of thin film transistors formed using oxide semiconductors in the pixel portion 4002, the signal line driver circuit 4003, and the scan line driver circuit 4004.

The pixel portion 4002, the signal line driver circuit 4003, and the scan line driver circuit 4004 provided over the first substrate 4001 include a plurality of thin film transistors. FIG. 17B illustrates the thin film transistor 4010 included in the pixel portion 4002 and the thin film transistor 4011 included in the signal line driver circuit 4003. The thin film transistors 4010 and 4011 correspond to thin film transistors formed using n-type semiconductor layers. Although a storage capacitor portion is not illustrated in the pixel portion 4002, the storage capacitor portion illustrated in FIGS. 2A to 2C, FIGS. 13A and 13B, FIGS. 14A and 14B, and FIGS. 15A and 15B can be formed.

As described above, in a driver circuit portion, the gate wiring which is electrically connected to the gate electrode layer of the thin film transistor and includes the gate electrode layer is formed by stacking a light-transmitting conductive layer and a light-blocking conductive layer having high conductivity in that order, and the source wiring which is electrically connected to the source electrode layer or the drain electrode layer of the thin film transistor and includes the source electrode layer is formed by stacking a light-transmitting conductive layer and a light-blocking conductive layer having high conductivity in that order. In the pixel portion, the gate wiring which is electrically connected to the gate electrode layer of the thin film transistor and includes the gate electrode layer is formed using only a light-transmitting conductive layer, and the source wiring which is electrically connected to the source electrode layer or the drain electrode layer of the thin film transistor and includes the source electrode layer is formed using only a light-transmitting conductive layer. In other words, the gate wiring which is electrically connected to the gate electrode layer of the thin film transistor and includes the gate electrode layer in the pixel portion is formed using part of the light-transmitting conductive layer which is included in the gate wiring electrically connected to the gate electrode layer of the thin film transistor and includes the gate electrode layer in the driver circuit portion; and the source wiring which is electrically connected to the source electrode layer or the drain electrode layer of the thin film transistor and includes the source electrode layer in the pixel portion is formed using part of the light-transmitting conductive layer which is included in the source wiring electrically connected to the source electrode layer or the drain electrode layer of the thin film transistor and includes the source electrode layer in the driver circuit portion.

In the pixel portion, the gate wiring including the gate electrode layer, the source wiring including the source electrode layer, and a back gate are each formed by stacking a light-transmitting conductive layer and a light-blocking conductive layer having high conductivity in that order, so that wiring resistance is reduced and power consumption can be reduced. Further, since a light-blocking conductive film is used as one of conductive films included in the back gate when the back gate is provided in the pixel portion, a space between pixels can be shielded from light. That is, a space between pixels can be shielded from light without the use of a black matrix.

By forming the storage capacitor portion in the pixel portion with the use of the light-transmitting conductive layer as described above, the aperture ratio can be improved. In addition, by forming the storage capacitor portion with the use of the light-transmitting conductive layer, the storage capacitor portion can be made large, so that a potential of a pixel electrode can be easily held even if the thin film transistor is turned off.

In addition, reference numeral 4013 denotes a liquid crystal element. A pixel electrode 4030 included in the liquid crystal element 4013 is electrically connected to the thin film transistor 4010 through a wiring 4040. A counter electrode 4031 of the liquid crystal element 4013 is formed on the second substrate 4006. A portion where the pixel electrode 4030, the counter electrode 4031, and the liquid crystal 4008 overlap with each other corresponds to the liquid crystal element 4013.

Note that each of the first substrate 4001 and the second substrate 4006 can be formed using glass, metal (typically, stainless steel), ceramics, or plastics. As plastics, a fiberglass-reinforced plastic (FRP) plate, a poly(vinyl fluoride) (PVF) film, a polyester film, or an acrylic resin film can be used. Alternatively, a sheet with a structure in which aluminum foil is sandwiched between PVF films or polyester films can be used.

A spherical spacer 4035 is provided in order to control the distance (a cell gap) between the pixel electrode 4030 and the counter electrode 4031. Note that a spacer obtained by selective etching of an insulating film may be used.

A variety of signals and potentials supplied to the signal line driver circuit 4003 which is formed separately, the scan line driver circuit 4004, or the pixel portion 4002 are supplied from an FPC 4018 through lead wirings 4014 and 4015.

In this embodiment, a connection terminal electrode 4016 is formed using the same conductive film as the pixel electrode 4030 included in the liquid crystal element 4013. Further, the lead wiring 4015 is formed using the same conductive film as the wiring 4040.

The connection terminal electrode 4016 is electrically connected to a terminal of the FPC 4018 through an anisotropic conductive film 4019.

Note that although not illustrated, the liquid crystal display device illustrated in this embodiment may include an alignment film. Alternatively, a liquid crystal exhibiting a blue phase for which an alignment film is not used may be used. A blue phase is one of liquid crystal phases, which is generated just before a cholesteric phase changes into an isotropic phase while the temperature of a cholesteric liquid crystal is raised. Since the blue phase is generated within a narrow range of temperature, a liquid crystal composition containing a chiral agent at 5 wt % or more is used for the liquid crystal 4008 in order to improve the temperature range. A liquid crystal composition including a liquid crystal exhibiting a blue phase and a chiral agent has a short response time of 1 msec or less and is optically isotropic; thus, alignment treatment is not necessary and viewing angle dependence is small.

Note that this embodiment can also be applied to a transflective liquid crystal display device in addition to a transmissive liquid crystal display device.

In an example of the liquid crystal display device, a polarizer is provided on an outer surface of the substrate (on the viewer side), and a coloring layer (a color filter) and an electrode layer used for a display element are sequentially provided on all inner surface of the substrate; however, the polarizer may be provided on the inner surface of the substrate. The layered structure of the polarizer and the coloring layer is not limited to that in this embodiment and may be set as appropriate depending on the materials of the polarizer and the coloring layer or conditions of the manufacturing process. Further, a light-blocking film serving as a black matrix may be provided except in a display portion.

A conductive layer 4050 is provided over part of the insulating layer 4021 so as to overlap with a channel formation region of an oxide semiconductor layer in the thin film transistor 4011 for the driver circuit. The conductive layer 4050 is provided so as to overlap with the channel formation region of the oxide semiconductor layer, whereby the amount of change in the threshold voltage of the thin film transistor 4011 before and after BT test can be reduced. Further, a potential of the conductive layer 4050 may be the same as or different from that of a gate electrode layer of the thin film transistor 4011. The conductive layer 4050 can function also as a second gate electrode layer. Alternatively, the potential of the conductive layer 4050 may be GND or 0 V, or the conductive layer 4050 may be in a floating sate. Note that a conductive layer 4060 may be formed using a light-transmitting conductive material so as to overlap with a channel formation region of an oxide semiconductor layer of the thin film transistor 4010 in the pixel portion.

The insulating layer 4021 is formed as a planarization insulating film. The insulating layer 4021 may be formed using a material and a method which are similar to those of the planarization insulating layer 454 described in Embodiment 1, and an organic material having heat resistance, such as polyimide, acrylic, benzocyclobutene, polyamide, or epoxy, can be used. Other than such an organic material, it is possible to use a low-dielectric constant material (a low-k material), a siloxane-based resin, PSG (phosphosilicate glass), BPSG (borophosphosilicate glass), or the like. Note that the insulating layer 4021 may be formed by stacking a plurality of insulating films formed using these materials.

Note that a siloxane-based resin corresponds to a resin including a Si—O—Si bond formed using a siloxane-based material as a starting material. The siloxane-based resin may include an organic group (e.g., an alkyl group or an aryl group) or a fluoro group as a substituent. Further, the organic group may include a fluoro group.

There is no particular limitation to the method of forming the insulating layer 4021. The insulating layer 4021 can be formed, depending on the material, by a method such as sputtering, an SOG method, a spin coating method, a dipping method, a spray coating method, a droplet discharge method (e.g., an inkjet method, screen printing, or offset printing), or a tool such as a doctor knife, a roll coater, a curtain coater, or a knife coater. A baking step of the insulating layer 4021 also serves as annealing of the semiconductor layer, whereby a semiconductor device can be efficiently manufactured.

Each of the pixel electrode 4030 and the counter electrode 4031 can be formed using a light-transmitting conductive material such as indium oxide containing tungsten oxide, indium zinc oxide containing tungsten oxide, indium oxide containing titanium oxide, indium tin oxide containing titanium oxide, indium tin oxide (ITO), indium zinc oxide, or indium tin oxide to which silicon oxide is added.

Alternatively, a conductive composition including a conductive high molecule (also referred to as a conductive polymer) can be used for each of the pixel electrode 4030 and the counter electrode 4031. The pixel electrode formed using the conductive composition preferably has a sheet resistance of lower than or equal to 10000 ohms per square and a transmittance of higher than or equal to 70% at a wavelength of 550 nm. The sheet resistance is preferably lower. Further, the resistivity of the conductive high molecule included in the conductive composition is preferably lower than or equal to 0.1 Ω·cm.

As the conductive high molecule, a so-called π-electron conjugated conductive high molecule can be used. Examples are polyaniline and a derivative thereof, polypyrrole and a derivative thereof, polythiophene and a derivative thereof, a copolymer of two or more kinds of these materials, and the like.

Further, a variety of signals and potentials are supplied from an FPC 4018 to the signal line driver circuit 4003 which is separately formed, the scan line driver circuit 4004, or the pixel portion 4002.

A connection terminal electrode 4016 is formed using the same conductive film as the pixel electrode 4030 included in the liquid crystal element 4013. The lead wiring 4015 is formed using the same conductive film as source electrode layers and drain electrode layers of the thin film transistors 4010 and 4011.

The connection terminal electrode 4016 is electrically connected to a terminal of the FPC 4018 through an anisotropic conductive film 4019.

FIGS. 17A and 17B illustrate an example in which the signal line driver circuit 4003 is formed separately and mounted on the first substrate 4001; however, this embodiment is not limited to this structure. The scan line driver circuit may be separately formed and mounted, or only part of the signal line driver circuit or part of the scan line driver circuit may be separately formed and mounted.

Figure 18:
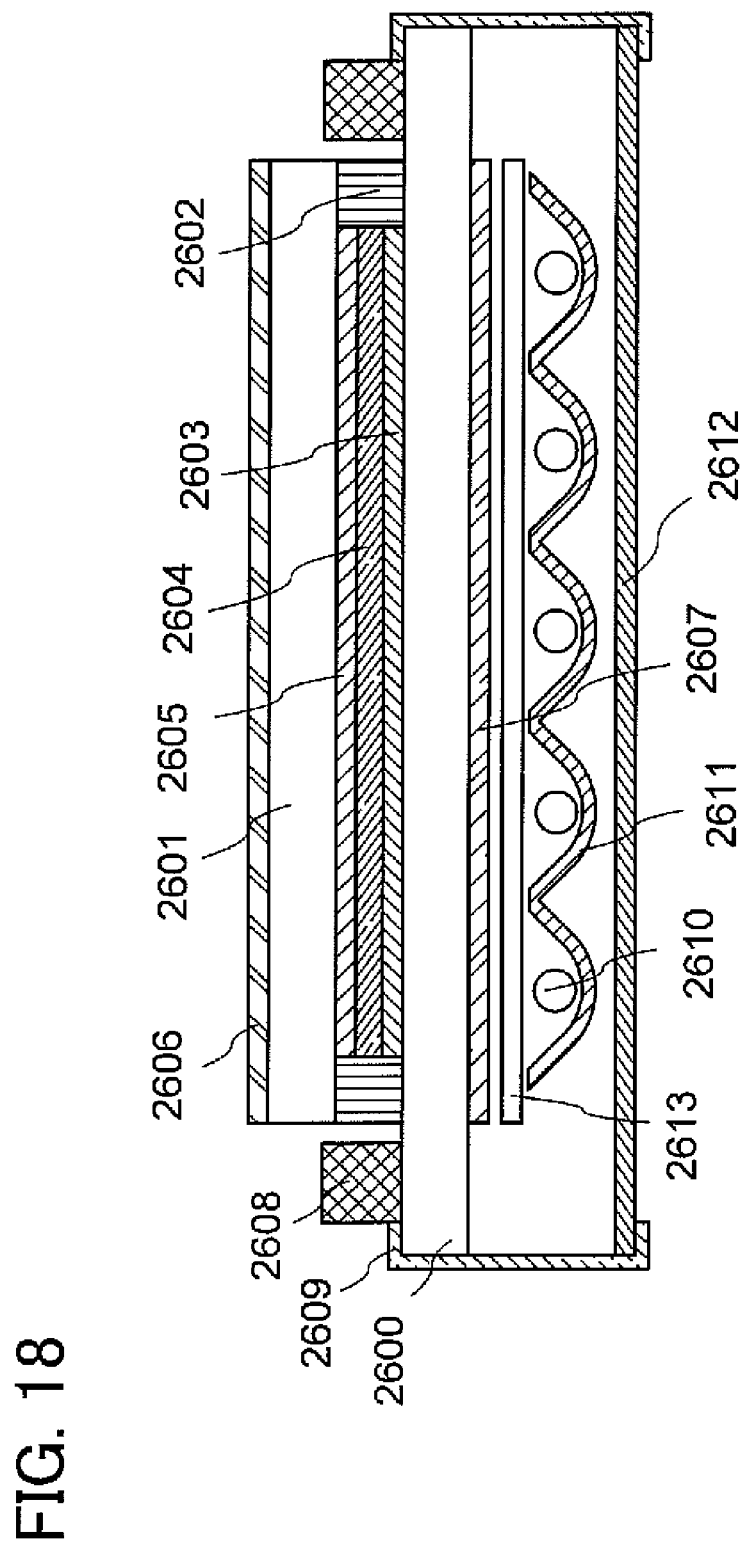
FIG. 18 is a cross-sectional view of a semiconductor device according to one embodiment of the present invention.

FIG. 18 illustrates an example of a liquid crystal display module which is formed as a semiconductor device by using a TFT substrate 2600 manufactured by the manufacturing method disclosed in this specification.

FIG. 18 illustrates an example of a liquid crystal display module, in which the TFT substrate 2600 and a counter substrate 2601 are fixed with a sealant 2602, and a pixel portion 2603 including a TFT and the like, a display element 2604 including a liquid crystal layer, and a coloring layer 2605 are provided between the substrates to form a display region. The coloring layer 2605 is necessary to perform color display. In an RGB system, coloring layers corresponding to colors of red, green, and blue are provided for pixels. Polarizers 2606 and 2607 and a diffusion plate 2613 are provided outside the TFT substrate 2600 and the counter substrate 2601. A light source includes a cold cathode fluorescent lamp 2610 and a reflector 2611. A circuit board 2612 is connected to a wiring circuit portion 2608 of the TFT substrate 2600 by a flexible wiring board 2609 and includes an external circuit such as a control circuit or a power source circuit. The polarizer and the liquid crystal layer may be stacked with a retardation plate therebetween.

For the liquid crystal display module, a TN (twisted nematic) mode, an IPS (in-plane-switching) mode, an FFS (fringe field switching) mode, an MVA (multi-domain vertical alignment) mode, a PVA (patterned vertical alignment) mode, an ASM (axially symmetric aligned micro-cell) mode, an OCB (optically compensated birefringence) mode, an FLC (ferroelectric liquid crystal) mode, an AFLC (antiferroelectric liquid crystal) mode, or the like can be used.

Through the above steps, a highly reliable liquid crystal display panel can be manufactured as a semiconductor device.

This embodiment can be combined with any of the structures described in the other embodiments as appropriate.

Embodiment 3

In this embodiment, an example of electronic paper is described as one embodiment of a semiconductor device.

The semiconductor device may be used for electronic paper in which electronic ink is driven by an element which is electrically connected to a switching element. Electronic paper is also referred to as an electrophoretic display device (an electrophoretic display) and has advantages of the same level of readability as plain paper, lower power consumption than other display devices, and reduction in thickness and weight.

Electrophoretic displays can have various modes. Electrophoretic displays contain a plurality of microcapsules dispersed in a solvent or a solute, each of which contains first particles which are positively charged and second particles which are negatively charged. By applying an electric field to the microcapsules, the particles in the microcapsules move in opposite directions and only the color of the particles gathering on one side is displayed. Note that the first particles and the second particles contain pigments and do not move without an electric field. Further, the first particles and the second particles have different colors (which may be colorless).

In this manner, an electrophoretic display utilizes a so-called dielectrophoretic effect by which a substance having a high dielectric constant moves to a high-electric field region. Note that the electrophoretic display does not need a polarizer which is needed in a liquid crystal display device.

A solution in which the above microcapsules are dispersed in a solvent is referred to as electronic ink. This electronic ink can be printed on a surface of glass, plastics, cloth, paper, or the like. Further, color display can be realized with a color filter or particles including pigments.

When a plurality of the above microcapsules are arranged as appropriate over an active matrix substrate so as to be sandwiched between two electrodes, an active matrix display device is completed, and display can be performed by application of an electric field to the microcapsules. For example, the active matrix substrate including the thin film transistor in Embodiment 1 can be used.

Note that each of the first particles and the second particles in the microcapsules may be formed using one of a conductive material, an insulating material, a semiconductor material, a magnetic material, a liquid crystal material, a ferroelectric material, an electroluminescent material, an electrochromic material, and a magnetophoretic material, or a composite material of any of these materials.

Figure 19:
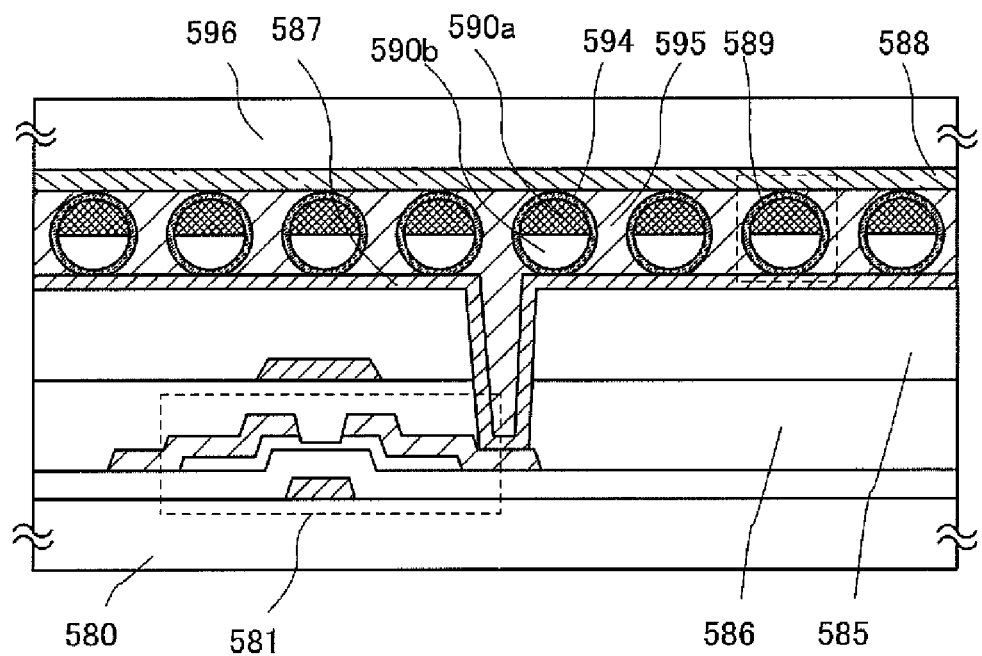
FIG. 19 is a cross-sectional view of a semiconductor device according to one embodiment of the present invention.

FIG. 19 illustrates active matrix electronic paper as an example of a semiconductor device. A thin film transistor 581 used in the semiconductor device can be formed in a manner which is similar to that of the thin film transistor described in Embodiment 1 and is a highly reliable thin film transistor including an oxide semiconductor layer.

The electronic paper in FIG. 19 is an example of a display device using a twisting ball display system. The twisting ball display system refers to a method in which spherical particles each colored in black and white are provided between a first electrode layer and a second electrode layer which are electrode layers used for a display element, and a potential difference is generated between the first electrode layer and the second electrode layer in order to control the orientation of the spherical particles, so that display is performed.

The thin film transistor 581 formed over a substrate 580 is a bottom-gate thin film transistor and is covered with an insulating film 586 which is in contact with the oxide semiconductor layer and an insulating film 585 which is in contact with the insulating film 586. A source electrode layer or a drain electrode layer of the thin film transistor 581 which is sealed between the substrate 580 and a substrate 596 is in contact with a first electrode layer 587 through an opening formed in the insulating film 585, whereby the thin film transistor 581 is electrically connected to the first electrode layer 587. Spherical particles 589 are provided between the first electrode layer 587 and a second electrode layer 588 formed on the substrate 596. Each of the spherical particles 589 includes a black region 590a, a white region 590b, and a cavity 594 filled with liquid around the black region 590a and the white region 590b. A space around the spherical particles 589 is filled with a filler 595 such as a resin (see FIG. 19). Note that the insulating film 585 which covers the thin film transistor 581 may have either a single-layer structure or a layered structure. The first electrode layer 587 corresponds to a pixel electrode, and the second electrode layer 588 corresponds to a common electrode. The second electrode layer 588 is electrically connected to a common potential line provided over the same substrate as the thin film transistor 581. With the use of a common connection portion, the second electrode layer 588 and the common potential line can be electrically connected to each other through conductive particles provided between the substrates 580 and 596.

Note that in the thin film transistor 581 illustrated in FIG. 19, end portions of a gate electrode layer, a gate insulating layer, a semiconductor layer, the source electrode layer, and the drain electrode layer are tapered. In this manner, by tapering the end portions of the layers, coverage with layers formed on and in contact with the layers can be improved, disconnection can be prevented, and the yield of the semiconductor device can be improved. Note that this embodiment is not limited to this structure. The end portion of the gate electrode layer, the gate insulating layer, the semiconductor layer, the source electrode layer, or the drain electrode layer is not necessarily tapered. Alternatively, one or more of the layers may be tapered.

It is possible to use an electrophoretic element instead of the element using the twisting ball. A microcapsule having a diameter of approximately 10 to 200 μm, in which transparent liquid, positively charged white microparticles, and negatively charged black microparticles are encapsulated, is used. In the microcapsule provided between a first electrode layer and a second electrode layer, when an electric field is applied by the first electrode layer and the second electrode layer, the white microparticles and the black microparticles move in opposite directions, so that white or black can be displayed. A display element utilizing this principle is an electrophoretic display element, and a device including an electrophoretic display element is called an electronic paper in general. The electrophoretic display element has higher reflectance than a liquid crystal display element; thus, an auxiliary light is unnecessary, power consumption is low, and a display portion can be recognized even in a dim environment. In addition, even when power is not supplied to the display portion, an image which has been displayed once can be held. Thus, a displayed image can be held even if a semiconductor device having a display function (which may be referred to simply as a display device or a semiconductor device including a display device) is disconnected from a power source.

Through the above steps, highly reliable electronic paper can be manufactured as a semiconductor device.

This embodiment can be combined with any of the structures described in the other embodiments as appropriate.

Embodiment 4

In this embodiment, an example of a light-emitting display device is described as a semiconductor device. Here, a light-emitting element utilizing electroluminescence is described as a display element included in a display device. Light-emitting elements utilizing electroluminescence are classified according to whether a light-emitting material is an organic compound or an inorganic compound. In general, the former is referred to as an organic EL element, and the latter is referred to as an inorganic EL element.

In an organic EL element, by application of voltage to a light-emitting element, electrons and holes are injected from a pair of electrodes into a layer containing a light-emitting organic compound, and current flows. These carriers (electrons and holes) are recombined, so that the light-emitting organic compound emits light. Due to such a mechanism, the light-emitting element is referred to as a current-excitation light-emitting element.

Inorganic EL elements are classified according to their element structures into dispersion-type inorganic EL elements and thin-film inorganic EL elements. A dispersion-type inorganic EL element has a light-emitting layer where particles of a light-emitting material are dispersed in a binder, and its light emission mechanism is donor-acceptor recombination type light emission which utilizes a donor level and an acceptor level. A thin-film inorganic EL element has a structure where a light-emitting layer is interposed between dielectric layers, which are further interposed between electrodes, and its light emission mechanism is localized type light emission which utilizes inner-shell electron transition of metal ions. Note that here, an organic EL element is used as a light-emitting element.

Next, structures of light-emitting elements are described with reference to FIGS. 20A to 20C. Here, cross-sectional structures of pixels are described using n-channel driving TFTs as an example. TFTs 7001, 7011, and 7021 used in semiconductor devices in FIGS. 20A to 20C can be formed in a manner which is similar to that of the thin film transistor described in any of the above embodiments.

In order to extract light from a light-emitting element, at least one of an anode and a cathode is transparent. Here, the term "transparent" means that at least transmittance at the wavelength of emitted light is sufficiently high. As a method for extracting light, there are a top emission method (a top extraction method) by which light is extracted from a side opposite to a substrate where a thin film transistor and a light-emitting element are formed, a bottom emission method (a bottom extraction method) by which light is extracted from the substrate side, a dual emission method (a dual extraction method) by which light is extracted from both the substrate side and the side opposite to the substrate, and the like.

A top-emission-type light-emitting element is described with reference to FIG. 20A.

Figure 20A:
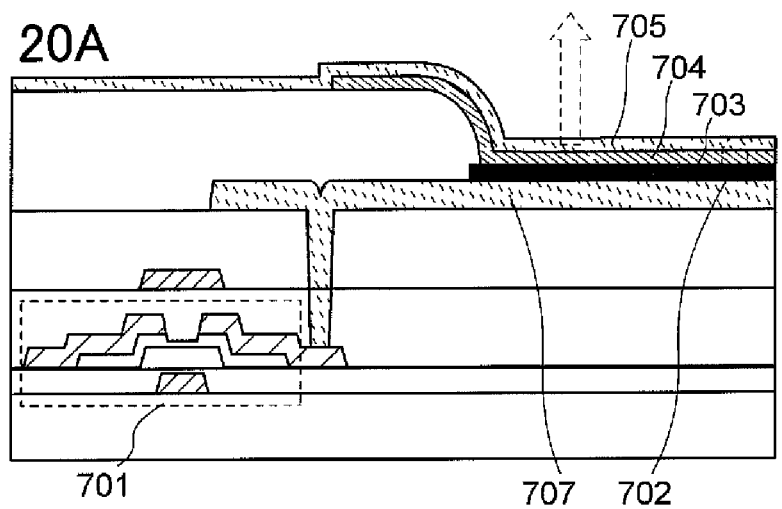
FIGS. 20A to 20C are cross-sectional views of semiconductor devices according to one embodiment of the present invention.

FIG. 20A is a cross-sectional view of a pixel when light is emitted from a light-emitting element 702 to an anode 705 side. Here, the light-emitting element 702 is formed over a light-transmitting conductive layer 707 which is electrically connected to the driving TFT 701, and a light-emitting layer 704 and the anode 705 are stacked in that order over a cathode 703. For the cathode 703, a conductive film which has a low work function and reflects light can be used. For example, the cathode 703 is preferably formed using Ca, Al, Mg—Ag, Al—Li, or the like. The light-emitting layer 704 may be formed using either a single layer or a plurality of layers stacked. In the case where the light-emitting layer 704 is formed using a plurality of layers, an electron injection layer, an electron transport layer, a light-emitting layer, a hole transport layer, and a hole injection layer are preferably stacked in that order over the cathode 703; however, needless to say, it is not necessary to form all of these layers. The anode 705 is formed using a light-transmitting conductive material. For example, a light-transmitting conductive material, such as indium oxide containing tungsten oxide, indium zinc oxide containing tungsten oxide, indium oxide containing titanium oxide, indium tin oxide containing titanium oxide, indium tin oxide (ITO), indium zinc oxide, or indium tin oxide to which silicon oxide is added, may be used.

A structure in which the light-emitting layer 704 is sandwiched between the cathode 703 and the anode 705 can be called the light-emitting element 702. In the case of the pixel illustrated in FIG. 20A, light is emitted from the light-emitting element 702 to the anode 705 side as indicated by an arrow. The structure of the light-emitting element 702 may be a microcavity structure. Accordingly, it is possible to select wavelength to be extracted, so that color purity can be improved. Note that in that case, the thickness of layers included in the light-emitting element 702 is set in accordance with the wavelength to be extracted. Further, an electrode is preferably formed using a material with predetermined reflectivity.

An insulating layer containing silicon nitride, silicon oxide, or the like may be formed over the anode 705. Accordingly, deterioration of the light-emitting element can be suppressed.

Next, a bottom-emission-type light-emitting element is described with reference to FIG. 20B.

Figure 20B:
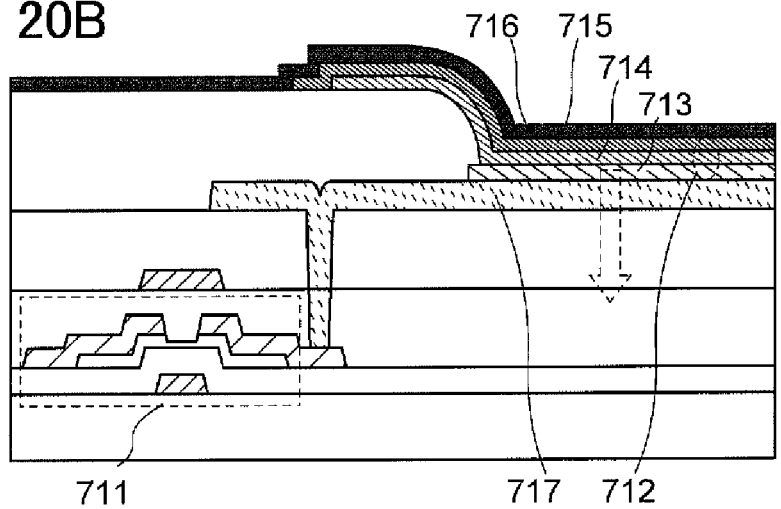

FIG. 20B is a cross-sectional view of a pixel when light is emitted from a light-emitting element 712 to a cathode 713 side. Here, the cathode 713 of the light-emitting element 712 is formed over a light-transmitting conductive film 717 which is electrically connected to the driving TFT 711, and a light-emitting layer 714 and an anode 715 are stacked in that order over the cathode 713. Note that when the anode 715 has a light-transmitting property, a light-blocking film 716 may be provided so as to cover the anode 715. For the cathode 713, a conductive material having a low work function can be used as in the case of FIG. 20A. Note that the thickness of the cathode 7013 is set such that light is transmitted therethrough (preferably, approximately 5 to 30 nm). For example, an aluminum film with a thickness of approximately 20 nm can be used for the cathode 713. The light-emitting layer 714 may be formed using either a single layer or a plurality of layers stacked, as in FIG. 20A. The anode 715 dose not necessarily transmit light, but may be formed using a light-transmitting conductive material as in the case of FIG. 20A. The light-blocking film 716 can be formed using a metal or the like which reflects light; however, this embodiment is not limited to this. Note that when the light-blocking film 716 has a function of reflecting light, light extraction efficiency can be improved.

A structure in which the light-emitting layer 714 is sandwiched between the cathode 713 and the anode 715 can be called the light-emitting element 712. In the case of the pixel illustrated in FIG. 20B, light is emitted from the light-emitting element 712 to the cathode 713 side as indicated by an arrow. The structure of the light-emitting element 712 may be a microcavity structure. Further, an insulating layer may be formed over the anode 715.

Figure 20C:
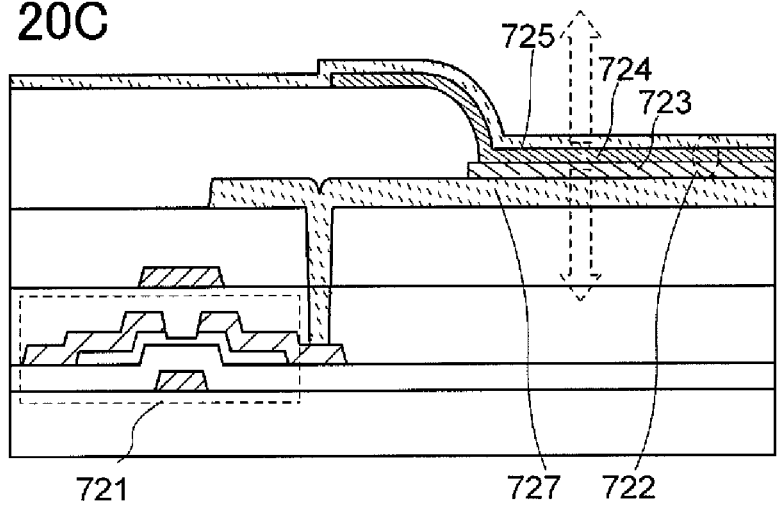

Next, a dual-emission-type light-emitting element is described using FIG. 20C.

In FIG. 20C, a cathode 723 of a light-emitting element 722 is formed over a light-transmitting conductive film 727 which is electrically connected to the driving TFT 721, and a light-emitting layer 724 and an anode 725 are stacked in that order over the cathode 723. For the cathode 723, a conductive material having a low work function can be used as in the case of FIG. 20A. The thickness of the cathode 7023 is set such that light is transmitted therethrough. For example, a 20-nm-thick aluminum film can be used for the cathode 723. As in the case of FIG. 20A, the light-emitting layer 724 may be formed using either a single layer or a plurality of layers stacked. As in FIG. 20A, the anode 725 can be formed using a light-transmitting conductive material.

A structure in which the light-emitting layer 724 is sandwiched between the cathode 723 and the anode 725 can be called the light-emitting element 722. In the case of the pixel illustrated in FIG. 20C, light is emitted from the light-emitting element 722 to both the anode 725 side and the cathode 723 side as indicated by arrows. The structure of the light-emitting element 722 may be a microcavity structure. Further, an insulating layer may be formed over the anode 725.

Note that although organic EL elements are described here as the light-emitting elements, inorganic EL elements can be provided as the light-emitting elements. The example is described here in which a thin film transistor (a TFT for driving a light-emitting element) which controls the driving of a light-emitting element is electrically connected to the light-emitting element; however, a structure may be employed in which a TFT for current control is connected between the driving TFT and the light-emitting element.

Note that the structure of the semiconductor device in this embodiment is not limited to the structures illustrated in FIGS. 20A to 20C, and can be modified in various ways.

Next, appearance and a cross section of a light-emitting display panel (also referred to as a light-emitting panel), which corresponds to one embodiment of a semiconductor device, are described with reference to FIGS. 21A and 21B. FIG. 21A is a top view of a panel in which thin film transistors 4509 and 4510 and a light-emitting element 4511 which are formed over a first substrate 4501 are sealed between the first substrate 4501 and a second substrate 4506 with a sealant 4505. FIG. 21B is a cross-sectional view taken along line S-T in FIG. 21A.

The sealant 4505 is provided so as to surround a pixel portion 4502, signal line driver circuits 4503a and 4503b, and scan line driver circuits 4504a and 4504b which are provided over the first substrate 4501. In addition, a second substrate 4506 is provided over the pixel portion 4502, the signal line driver circuits 4503a and 4503b, and the scan line driver circuits 4504a and 4504b. In other words, the pixel portion 4502, the signal line driver circuits 4503a and 4503b, and the scan line driver circuits 4504a and 4504b are sealed together with a filler 4507, by the first substrate 4501, the sealant 4505, and the second substrate 4506. It is preferable that the panel be packaged (sealed) with a protective film (e.g., an attachment film or an ultraviolet curable resin film) or a cover material, which has high air-tightness and causes less degasification, so that the panel is not exposed to the external air, in this manner.

Further, the pixel portion 4502, the signal line driver circuits 4503a and 4503b, and the scan line driver circuits 4504a and 4504b which are provided over the first substrate 4501 each include a plurality of thin film transistors, and the thin film transistor 4510 included in the pixel portion 4502 and the thin film transistor 4509 included in the signal line driver circuit 4503a are illustrated in FIG. 21B.

As each of the thin film transistors 4509 and 4510, any of the thin film transistors in Embodiments 1 to 3 can be used. Note that in this embodiment, the thin film transistors 4509 and 4510 are n-channel thin film transistors.

Further, reference numeral 4511 denotes a light-emitting element. A first electrode layer 4517 which is a pixel electrode of the light-emitting element 4511 is electrically connected to a source electrode layer or a drain electrode layer of the thin film transistor 4510. Note that although the light-emitting element 4511 has a layered structure of the first electrode layer 4517, a second electrode layer 4512, an electroluminescent layer 4513, and a third electrode layer 4514, the structure of the light-emitting element 4511 is not limited to the structure described in this embodiment. The above structure can be changed as appropriate depending on a direction in which light is extracted from the light-emitting element 4511, or the like.

A partition 4520 is formed using an organic resin film, an inorganic insulating film, or organic polysiloxane. It is particularly preferable that the partition 4520 be formed using a photosensitive material to have an opening over the first electrode layer 4517 so that a sidewall of the opening is formed as an inclined surface with continuous curvature.

The electroluminescent layer 4513 may be formed using either a single layer or a plurality of layers stacked.

A protective film may be formed over the third electrode layer 4514 and the partition 4520 in order to prevent oxygen, hydrogen, water, carbon dioxide, or the like from entering the light-emitting element 4511. As the protective film, a silicon nitride film, a silicon nitride oxide film, a DLC film, or the like can be formed.

In addition, a variety of signals are supplied from FPCs 4518a and 4518b to the signal line driver circuits 4503a and 4503b, the scan line driver circuits 4504a and 4504b, the pixel portion 4502, or the like.

In this embodiment, a connection terminal electrode 4515 is formed using the same conductive film as the first electrode layer 4517 of the light-emitting element 4511, and a terminal electrode 4516 is formed using the same conductive film as the source electrode layers and the drain electrode layers of the thin film transistors 4509 and 4510.

The connection terminal electrode 4515 is electrically connected to a terminal of the FPC 4518a through an anisotropic conductive film 4519.

The substrate located in the direction in which light is extracted from the light-emitting element 4511 needs to have a light-transmitting property with respect to visible light. For a substrate having a light-transmitting property with respect to visible light, a glass plate, a plastic plate, a polyester film, an acrylic film, or the like can be used.

Further, as well as an inert gas such as nitrogen or argon, an ultraviolet curable resin or a thermosetting resin can be used as the filler 4507. For example, PVC (polyvinyl chloride), acrylic, polyimide, an epoxy resin, a silicone resin, PVB (polyvinyl butyral), EVA (ethylene vinyl acetate), or the like can be used. In this embodiment, an example where nitrogen is used for the filler is described.

If needed, an optical film such as a polarizer, a circular polarizer (including an elliptical polarizer), a retardation plate (a quarter-wave plate or a half-wave plate), or a color filter, may be provided as appropriate on a light-emitting surface of the light-emitting element. Further, anti-reflection treatment may be performed on a surface. For example, antiglare treatment can be performed by which reflected light can be diffused by projections and depressions on the surface so that glare can be reduced.

The signal line driver circuits 4503a and 4503b and the scan line driver circuits 4504a and 4504b may be formed using a single crystal semiconductor or a polycrystalline semiconductor over a substrate separately prepared. Alternatively, only the signal line driver circuits or some of the signal line driver circuits, or only the scan line driver circuits or some of the scan line driver circuits may be separately formed and mounted. This embodiment is not limited to the structure illustrated in FIGS. 21A and 21B.

Through the above steps, a high-performance light-emitting display device (display panel) can be manufactured.

Figure 22A:
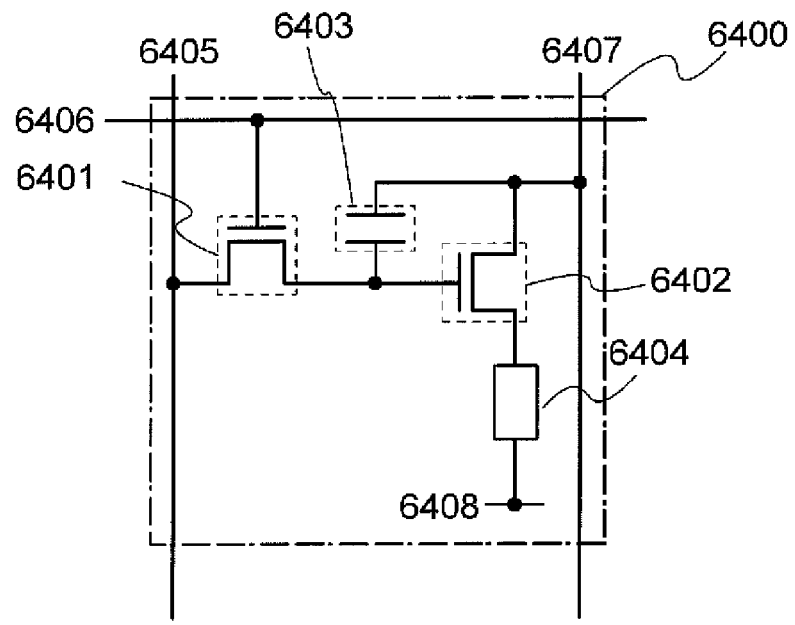
FIGS. 22A and 22B are circuit diagrams of semiconductor devices according to one embodiment of the present invention.
Figure 22B:
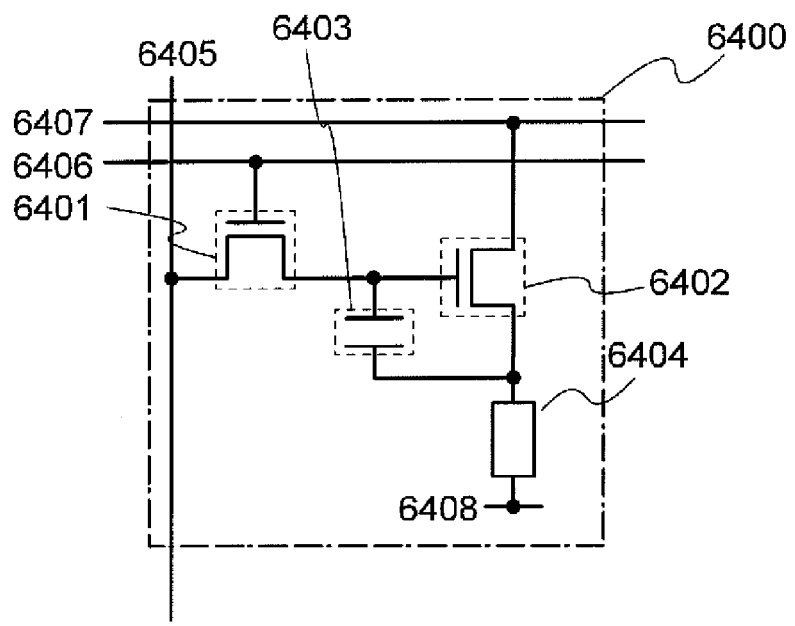

Next, a structure and operation of a pixel to which digital time ratio grayscale driving can be applied are described. FIGS. 22A and 22B each illustrate an example of a pixel structure to which digital time ratio grayscale driving can be applied. Here, one pixel includes two n-channel thin film transistors each having an oxide semiconductor layer (an In—Ga—Zn—O-based non-single-crystal film) for a channel formation region.

In FIG. 22A, pixel 6400 includes a switching thin film transistor 6401, a thin film transistor 6402 for driving a light-emitting element (hereinafter referred to as the driving thin film transistor 6402), a light-emitting element 6404, and a capacitor 6403. A gate of the switching thin film transistor 6401 is connected to a scan line 6406. A first electrode (one of a source electrode layer and a drain electrode layer) of the switching thin film transistor 6401 is connected to a signal line 6405. A second electrode (the other of the source electrode layer and the drain electrode layer) of the switching thin film transistor 6401 is connected to a gate of the driving thin film transistor 6402. The gate of the driving thin film transistor 6402 is connected to a power supply line 6407 through the capacitor 6403. A first electrode of the driving thin film transistor 6402 is connected to the power supply line 6407. A second electrode of the driving thin film transistor 6402 is connected to a first electrode (a pixel electrode) of the light-emitting element 6404. A second electrode of the light-emitting element 6404 corresponds to a common electrode 6408.

Note that as for the relation of potentials of the second electrode (on the common electrode 6408 side) and the first electrode (on the power supply line 6407 side) of the light-emitting element 6404, one of the potentials may be set higher than the other. In the light-emitting display device, a potential difference between a high potential and a low potential is applied to the light-emitting element 6404 and current flows to the light-emitting element 6404, so that the light-emitting element 6404 emits light. Therefore, each potential is set so that the potential difference between the high potential and the low potential is higher than or equal to the threshold voltage of the light-emitting element 6404.

Note that gate capacitance of the driving thin film transistor 6402 may be used as a substitute for the capacitor 6403, so that the capacitor 6403 can be eliminated. The gate capacitance of the driving thin film transistor 6402 may be formed with a channel region and the gate electrode layer.

Here, in the case of a voltage-input voltage driving method, a video signal is input to the gate of the driving thin film transistor 6402 so that the driving thin film transistor 6402 is sufficiently turned on or turned off. That is, the driving thin film transistor 6402 operates in a linear region.

In addition, by making input signals vary, analog grayscale driving can be performed using the pixel structure illustrated in FIG. 22A. For example, when an analog video signal is used, current corresponding to the video signal can be supplied to the light-emitting element 6404 and analog grayscale driving can be performed. The video signal is preferably a signal with which the driving thin film transistor 6402 operates in a saturation region.

Further, a potential of the power supply line 6407 may be changed in a pulsed manner. In this case, it is preferable to employ a structure illustrated in FIG. 22B.

Further, in the structure in FIG. 22A, the potential of the second electrode of the light-emitting element 6404 in a given pixel is often the same as a potential of a second electrode in another pixel (a potential of the common electrode 6408); alternatively, cathodes may be patterned for each pixel and connected to driving transistors.

Note that one embodiment of the disclosed invention is not construed as being limited to the pixel structures illustrated in FIGS. 22A and 22B. For example, a switch, a resistor, a capacitor, a thin film transistor, a logic circuit, or the like may be added to the pixel illustrated in FIGS. 22A and 22B.

Note that this embodiment can be combined with any of the other embodiments as appropriate.

Embodiment 5

A semiconductor device can be applied to electronic paper. Electronic paper can be used for electronic devices in all fields for displaying data. For example, electronic paper can be used for electronic book readers (e-book readers), posters, advertisement in vehicles such as trains, display portions in a variety of cards such as credit cards, and the like. Examples of such electronic devices are illustrated in FIGS. 23A and 23B and FIG. 24.

Figure 23A:
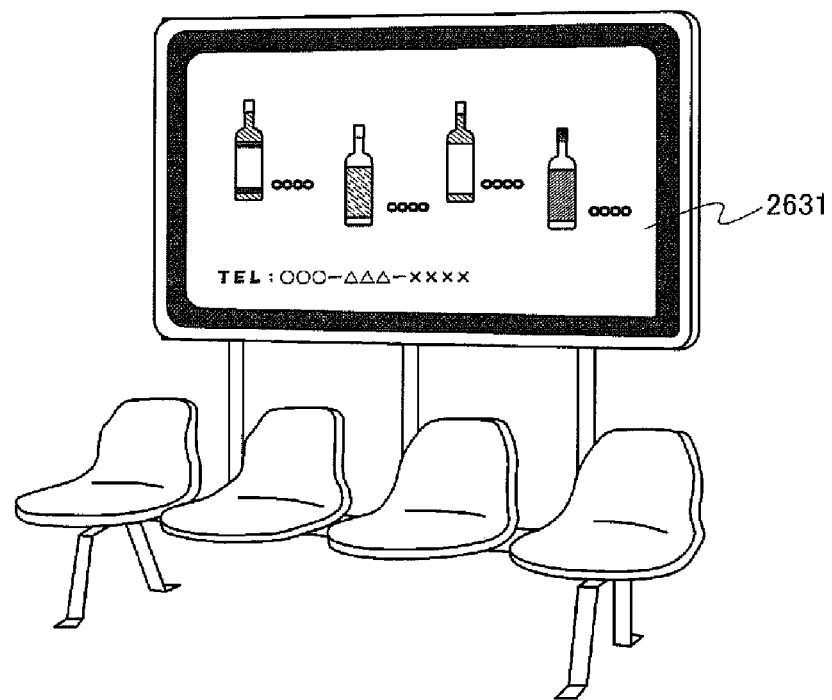
FIGS. 23A and 23B illustrate electronic devices including display devices according to one embodiment of the present invention.

FIG. 23A illustrates a poster 2631 formed using electronic paper. In the case where an advertising medium is printed paper, the advertisement is replaced by hands; however, by using the electronic paper, the advertising display can be changed in a short time. Further, stable images can be obtained without display defects. Note that the poster may transmit and receive data wirelessly.

Figure 23B:
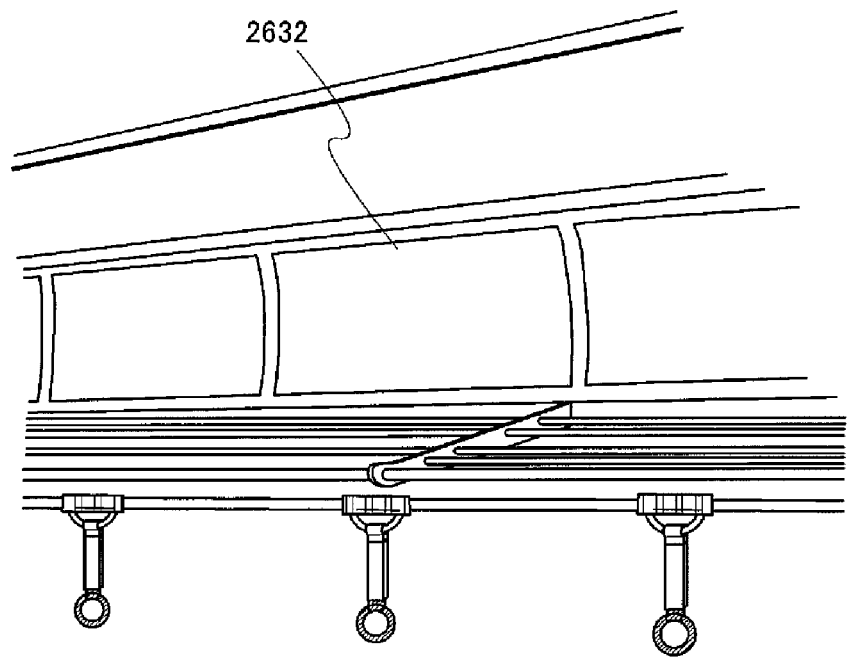

FIG. 23B illustrates an advertisement 2632 in a vehicle such as a train. In the case where an advertising medium is paper, the advertisement is replaced by hands; however, by using the electronic paper, the advertising display can be changed in a short time with less manpower. Further, stable images can be obtained without display defects. Note that the poster may transmit and receive data wirelessly.

Figure 24:
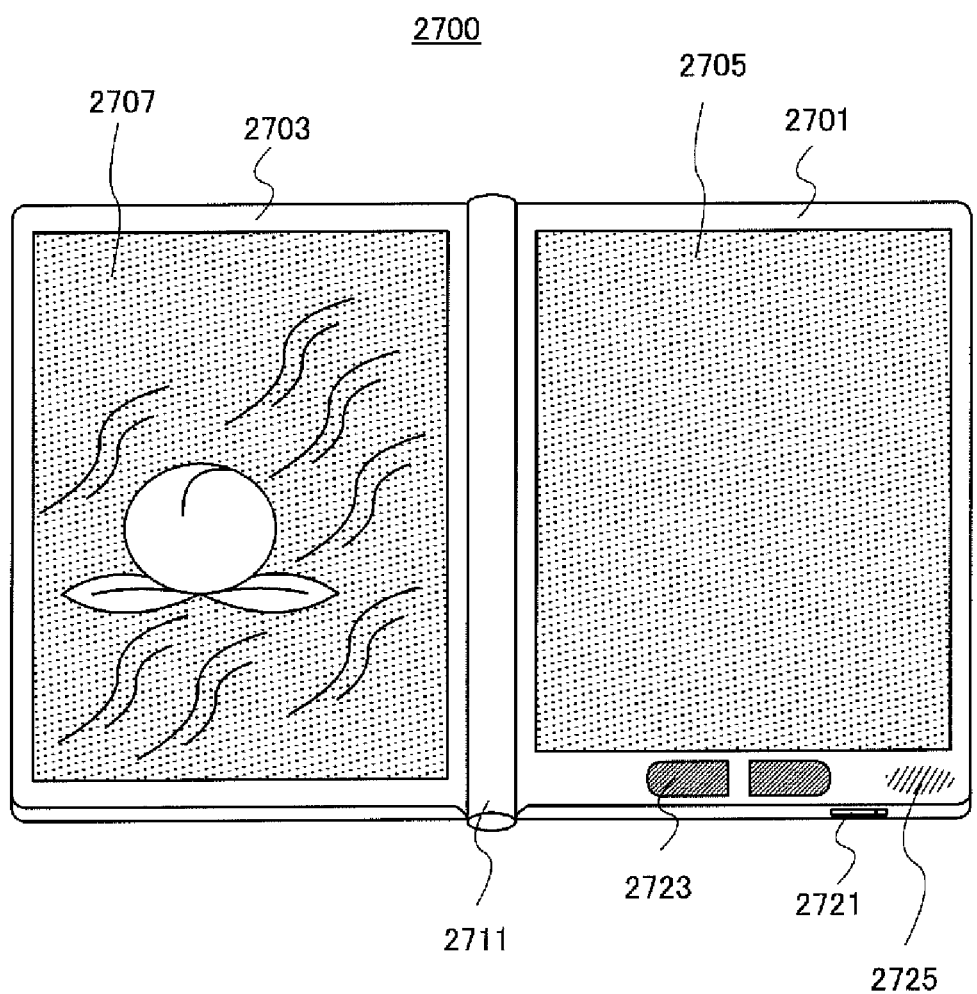
FIG. 24 illustrates an electronic device including a display device according to one embodiment of the present invention.

FIG. 24 illustrates an e-book reader 2700. For example, the e-book reader 2700 includes two housings 2701 and 2703. The housings 2701 and 2703 are combined with each other with a hinge 2711 so that the e-book reader 2700 can be opened and closed with the hinge 2711 as an axis. With such a structure, the e-book reader 2700 can be operated like a paper book.

A display portion 2705 is incorporated in the housing 2701, and a display portion 2707 is incorporated in the housing 2703. The display portions 2705 and 2707 may display one image or different images. In the case where the display portion 2705 and 2707 display different images, for example, a display portion on the right side (the display portion 2705 in FIG. 24) can display text and a display portion on the left side (the display portion 2707 in FIG. 24) can display images.

FIG. 24 illustrates an example in which the housing 2701 includes an operation portion and the like. For example, the housing 2701 includes a power switch 2721, operation keys 2723, a speaker 2725, and the like. With the operation keys 2723, pages can be turned. Note that a keyboard, a pointing device, or the like may be provided on a surface of the housing, on which the display portion is provided. Further, an external connection terminal (e.g., an earphone terminal, a USB terminal, or a terminal which can be connected to a variety of cables such as USB cables), a recording medium insertion portion, or the like may be provided on a back surface or a side surface of the housing. Furthermore, the e-book reader 2700 may function as an electronic dictionary.

Further, the e-book reader 2700 may transmit and receive data wirelessly. Through wireless communication, desired book data or the like can be purchased and downloaded from an electronic book server.

This embodiment can be combined with any of the other embodiments as appropriate.

Embodiment 6

In this embodiment, structures and operation of a pixel which can be used in a liquid crystal display device are described. Note that as the operation mode of a liquid crystal element in this embodiment, a TN (twisted nematic) mode, an IPS (in-plane-switching) mode, an FFS (fringe field switching) mode, an MVA (multi-domain vertical alignment) mode, a PVA (patterned vertical alignment) mode, an ASM (axially symmetric aligned microcell) mode, an OCB (optically compensated birefringence) mode, an FLC (ferroelectric liquid crystal) mode, an AFLC (anti-ferroelectric liquid crystal) mode, or the like can be used.

Figure 25A:
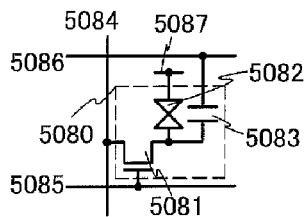
FIGS. 25A, 25B, 25C, 25E, and 25F are circuit diagrams of semiconductor devices according to one embodiment of the present invention.

FIG. 25A illustrates an example of a pixel structure which can be used in the liquid crystal display device. A pixel 5080 includes a transistor 5081, a liquid crystal element 5082, and a capacitor 5083. A gate of the transistor 5081 is electrically connected to a wiring 5085. A first terminal of the transistor 5081 is electrically connected to a wiring 5084. A second terminal of the transistor 5081 is electrically connected to a first terminal of the liquid crystal element 5082. A second terminal of the liquid crystal element 5082 is electrically connected to a wiring 5087. A first terminal of the capacitor 5083 is electrically connected to the first terminal of the liquid crystal element 5082. A second terminal of the capacitor 5083 is electrically connected to a wiring 5086. Note that a first terminal of a thin film transistor is one of a source and a drain, and a second terminal of the thin film transistor is the other of the source and the drain. That is, when the first terminal of the thin film transistor is the source, the second terminal of the thin film transistor is the drain. In a similar manner, when the first terminal of the thin film transistor is the drain, the second terminal of the thin film transistor is the source.

The wiring 5084 can serve as a signal line. The signal line is a wiring for transmitting signal voltage, which is input from the outside of the pixel, to the pixel 5080. The wiring 5085 can serve as a scan line. The scan line is a wiring for controlling on/off of the transistor 5081. The wiring 5086 can serve as a capacitor line. The capacitor line is a wiring for applying predetermined voltage to the second terminal of the capacitor 5083. The transistor 5081 can serve as a switch. The capacitor 5083 can serve as a storage capacitor. The storage capacitor is a capacitor with which the signal voltage is continuously applied to the liquid crystal element 5082 even when the switch is off. The wiring 5087 can serve as a counter electrode. The counter electrode is a wiring for applying predetermined voltage to the second terminal of the liquid crystal element 5082. Note that the function of each wiring is not limited to this, and each wiring can have a variety of functions. For example, by changing voltage applied to the capacitor line, voltage applied to the liquid crystal element can be adjusted. Note that it is acceptable as long as the transistor 5081 serves as a switch, and the transistor 5081 may be either a p-channel transistor or an n-channel transistor.

Figure 25B:
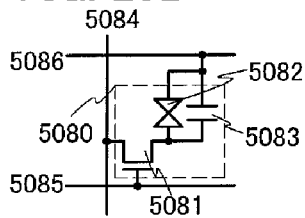

FIG. 25B illustrates an example of a pixel structure which can be used in the liquid crystal display device. The example of the pixel structure illustrated in FIG. 25B is the same as that in FIG. 25A except that the wiring 5087 is eliminated and the second terminal of the liquid crystal element 5082 and the second terminal of the capacitor 5083 are electrically connected to each other. The example of the pixel structure illustrated in FIG. 25B can be particularly used in the case of using a horizontal electric field mode (including an IPS mode and an FFS mode) liquid crystal element. This is because in the horizontal electric field mode liquid crystal element, the second terminal of the liquid crystal element 5082 and the second terminal of the capacitor 5083 can be formed over the same substrate, so that it is easy to electrically connect the second terminal of the liquid crystal element 5082 and the second terminal of the capacitor 5083 to each other. With the pixel structure illustrated in FIG. 25B, the wiring 5087 can be eliminated, so that a manufacturing process can be simplified and manufacturing cost can be reduced.

Figure 25D:
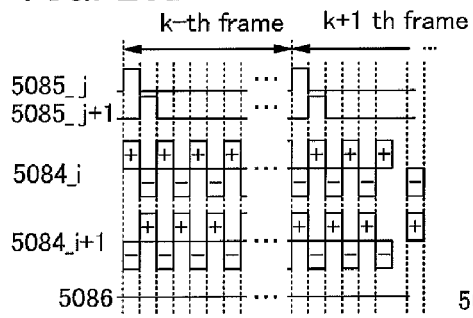
FIGS. 25D and 25G are timing charts of the semiconductor devices.
Figure 25C:
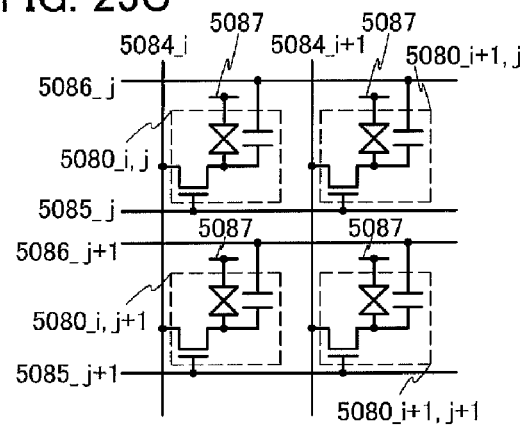

A plurality of pixel structures illustrated in FIG. 25A or FIG. 25B can be arranged in a matrix. Thus, a display portion of a liquid crystal display device is formed, and a variety of images can be displayed. FIG. 25C illustrates a circuit structure in the case where a plurality of pixel structures illustrated in FIG. 25A are arranged in a matrix. FIG. 25C is a circuit diagram illustrating four pixels among a plurality of pixels included in the display portion. A pixel arranged in an i-th column and a j-th row (each of i and j is a natural number) is represented as a pixel 5080_i, j, and a wiring 5084_i, a wiring 5085_j, and a wiring 5086_j are electrically connected to the pixel 5080_i, j. In a similar manner, a wiring 5084_i+1, the wiring 5085_j, and the wiring 5086_j are electrically connected to a pixel 5080_i+1, j. In a similar manner, the wiring 5084_i, a wiring 5085_j+1, and a wiring 5086_j+1 are electrically connected to a pixel 5080_i, j+1. In a similar manner, the wiring 5084_i+1, the wiring 5085_j+1, and the wiring 5086_j+1 are electrically connected to a pixel 5080_j+1, j+1. Note that each wiring can be used in common with a plurality of pixels in the same row or the same column. In the pixel structure illustrated in FIG. 25C, the wiring 5087 is a counter electrode, which is used by all the pixels in common; therefore, the wiring 5087 is not indicated by the natural number i or j. Note that since the pixel structure in FIG. 25B can also be used, the wiring 5087 is not required even in a structure where the wiring 5087 is provided and can be eliminated when another wiring serves as the wiring 5087, for example.

The pixel structure in FIG. 25C can be driven by a variety of methods. In particular, when the pixels are driven by a method called AC drive, deterioration (burn-in) of the liquid crystal element can be suppressed. FIG. 25D is a timing chart of voltage applied to each wiring in the pixel structure in FIG. 25C in the case where dot inversion driving, which is a kind of AC drive, is performed. By the dot inversion driving, flickers seen when the AC drive is performed can be suppressed.

In the pixel structure in FIG. 25C, a switch in a pixel electrically connected to the wiring 5085_j is selected (in an on state) in a j-th gate selection period in one frame period and is not selected (in an off state) in the other periods. Then, a (j+1)th gate selection period is provided after the j-th gate selection period. By performing sequential scanning in this manner, all the pixels are sequentially selected in one frame period. In the timing chart of FIG. 25D, the switch in the pixel is selected when the level of voltage is high (high level), and the switch is not selected when the level of the voltage is low (low level). Note that this is the case where the thin film transistor in each pixel is an n-channel transistor. In the case of using a p-channel thin film transistor, a relationship between voltage and a selection state is opposite to that in the case of using an n-channel thin film transistor.

In the timing chart illustrated in FIG. 25D, in the j-th gate selection period in a k-th frame (k is a natural number), positive signal voltage is applied to the wiring 5084_i used as a signal line, and negative signal voltage is applied to the wiring 5084_i+1. Then, in the (j+1)th gate selection period in the k-th frame, negative signal voltage is applied to the wiring 5084_i, and positive signal voltage is applied to the wiring 5084_i+1. After that, signals whose polarities are inverted every gate selection period are alternately supplied to the signal line. Accordingly, in the k-th frame, the positive signal voltage is applied to the pixels 5080_i, j and 5080i+1, j+1, and the negative signal voltage is applied to the pixels 5080_i+1, j and 5080_i, j+1. Then, in a (k+1)th frame, signal voltage whose polarity is opposite to that of the signal voltage written in the k-th frame is written to each pixel. Accordingly, in the (k+1)th frame, the positive signal voltage is applied to the pixels 5080_i+1, j and 5080_i, j+1, and the negative signal voltage is applied to the pixels 5080_i, j and 5080_i+1, j+1. In this manner, the dot inversion driving is a driving method by which signal voltage whose polarity is different between adjacent pixels is applied in the same frame and the polarity of the signal voltage for the pixel is inverted every one frame. By the dot inversion driving, flickers seen when the entire or part of an image to be displayed is uniform can be suppressed while deterioration of the liquid crystal element is suppressed. Note that voltage applied to all the wirings 5086 including the wirings 5086_j and 5086_j+1 can be fixed voltage. Note that although only the polarity of the signal voltage for the wirings 5084 is illustrated in the timing chart, the signal voltage can actually have a variety of levels in the polarity illustrated. Note that here, the case where the polarity is inverted per dot (per pixel) is described; however, this embodiment is not limited to this, and the polarity can be inverted per a plurality of pixels. For example, the polarity of signal voltage to be written is inverted per two gate selection periods, so that power consumed in writing signal voltage can be reduced. Alternatively, the polarity can be inverted per column (source line inversion) or per row (gate line inversion).

Figure 25E:
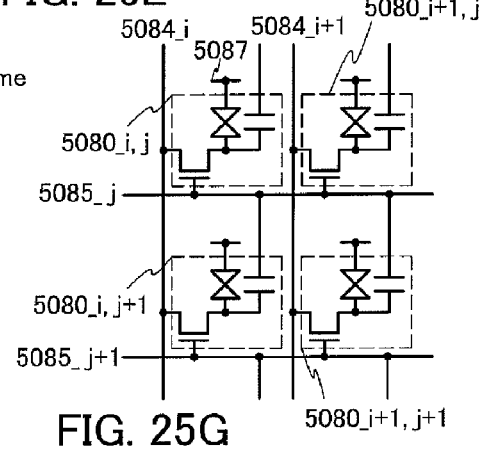

Note that fixed voltage may be applied to the second terminal of the capacitor 5083 in the pixel 5080 in one frame period. Here, since the level of voltage applied to the wiring 5085 used as a scan line is low level in most of one frame period, which means that substantially constant voltage is applied to the wiring 5085; therefore, the second terminal of the capacitor 5083 in the pixel 5080 may be connected to the wiring 5085. FIG. 25E illustrates an example of a pixel structure which can be used in the liquid crystal display device. Compared to the pixel structure in FIG. 25C, a feature of the pixel structure in FIG. 25E lies in that the wiring 5086 is eliminated and the second terminal of the capacitor 5083 in the pixel 5080 and the wiring 5085 in the previous row are electrically connected to each other. Specifically, in the range illustrated in FIG. 25E, the second terminals of the capacitors 5083 in the pixels 5080_i, j+1 and 5080_i+1, j+1 are electrically connected to the wiring 5085_j. By electrically connecting the second terminal of the capacitor 5083 in the pixel 5080 and the wiring 5085 in the previous row to each other in this manner, the wiring 5086 can be eliminated, so that the aperture ratio of the pixel can be increased. Note that the second terminal of the capacitor 5083 may be connected to the wiring 5085 in another row instead of in the previous row.

Note that the pixel structure in FIG. 25E can be driven by a driving method which is similar to that in the pixel structure in FIG. 25C.

Note that voltage applied to the wiring 5084 used as a signal line can be lowered by using the capacitor 5083 and the wiring electrically connected to the second terminal of the capacitor 5083. A pixel structure and a driving method in this case are described with reference to FIGS. 25F and 25G. Compared to the pixel structure in FIG. 25A, a feature of the pixel structure in FIG. 25F lies in that two wirings 5086 are provided per pixel column, and in adjacent pixels, one wiring is electrically connected to every other second terminal of the capacitors 5083 and the other wiring is electrically connected to the remaining every other second terminal of the capacitors 5083 in the pixel 5080. Note that two wirings 5086 are referred to as a wiring 5086-1 and a wiring 5086-2. Specifically, in the range illustrated in FIG. 25F, the second terminal of the capacitor 5083 in the pixel 5080_i, j is electrically connected to a wiring 5086-1_j; the second terminal of the capacitor 5083 in the pixel 5080_i+1, j is electrically connected to a wiring 5086-2_j; the second terminal of the capacitor 5083 in the pixel 5080_i, j+1 is electrically connected to a wiring 5086-2_j+1; and the second terminal of the capacitor 5083 in the pixel 5080_i+1, j+1 is electrically connected to a wiring 5086-1_j+1.

Figure 25F:
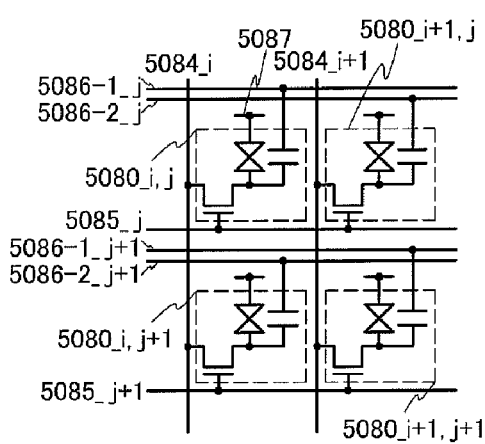
Figure 25G:
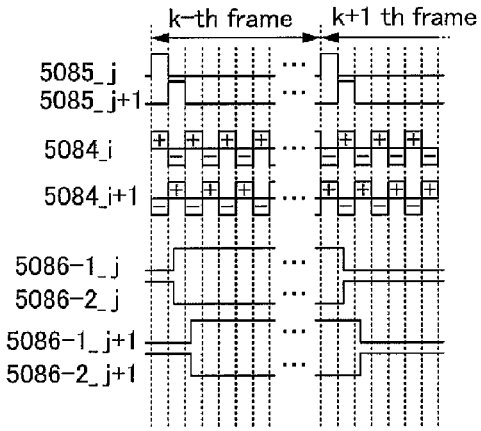

For example, when positive signal voltage is written to the pixel 5080_i, j in the k-th frame as illustrated in FIG. 25G, the wiring 5086-1_j becomes a low level, in the j-th gate selection period and is changed to a high level after the j-th gate selection period. Then, the wiring 5086-1_j is kept at a high level in one frame period, and after negative signal voltage is written in the j-th gate selection period in the (k+1)th frame, the wiring 5086-1_j is changed to a high level. In this manner, voltage of the wiring which is electrically connected to the second terminal of the capacitor 5083 is changed in a positive direction after positive signal voltage is written to the pixel, so that voltage applied to the liquid crystal element can be changed in the positive direction by a predetermined level. That is, signal voltage written to the pixel can be lowered by the predetermined level, so that power consumed in signal writing can be reduced. Note that when negative signal voltage is written in the j-th gate selection period, voltage of the wiring which is electrically connected to the second terminal of the capacitor 5083 is changed in a negative direction after negative signal voltage is written to the pixel. Thus, voltage applied to the liquid crystal element can be changed in the negative direction by a predetermined level, and the signal voltage written to the pixel can be reduced as in the case of the positive polarity. In other words, as for the wiring which is electrically connected to the second terminal of the capacitor 5083, different wirings are preferably used for a pixel to which positive signal voltage is applied and a pixel to which negative signal voltage is applied in the same row of the same frame. FIG. 25F illustrates an example in which the wiring 5086-1 is electrically connected to the pixel to which positive signal voltage is applied in the k-th frame and the wiring 5086-2 is electrically connected to the pixel to which negative signal voltage is applied in the k-th frame. Note that this is just an example, and for example, in the case of using a driving method by which pixels to which positive signal voltage is written and pixels to which negative signal voltage is written appear every two pixels, it is preferable to perform electrical connections with the wirings 5086-1 and 5086-2 alternately every two pixels. Further, in the case where signal voltage of the same polarity is written to all the pixels in one row (gate line inversion), one wiring 5086 may be provided per row. In other words, in the pixel structure in FIG. 25C, the driving method by which signal voltage written to a pixel is lowered as described with reference to FIGS. 25F and 25G can be used.

Figure 26A:
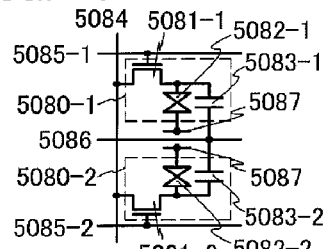
FIGS. 26A, 26B, 26C, 26D, 26E, and 26G are circuit diagrams of semiconductor devices according to one embodiment of the present invention.
Figure 26B:
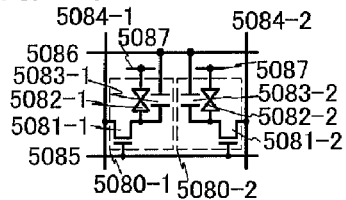

Next, a pixel structure and a driving method which are preferably used particularly in the case where the mode of a liquid crystal element is a vertical alignment (VA) mode typified by an MVA mode and a PVA mode. The VA mode has advantages such as no rubbing step in manufacture, little light leakage at the time of black display, and low driving voltage, but has a problem in that image quality is decreased (the viewing angle is narrower) when a screen is seen from all oblique angle. In order to widen the viewing angle in the VA mode, a pixel structure where one pixel includes a plurality of subpixels as illustrated in FIGS. 26A and 26B is effective. Pixel structures illustrated in FIGS. 26A and 26B are examples of the case where the pixel 5080 includes two subpixels (a subpixel 5080-1 and a subpixel 5080-2). Note that the number of subpixels in one pixel is not limited to two and can be other numbers. The viewing angle can be further widened as the number of subpixels becomes larger. A plurality of subpixels can have the same circuit structure. Here, all the subpixels have the circuit structure illustrated in FIG. 25A. Note that the first subpixel 5080-1 includes a thin film transistor 5081-1, a liquid crystal element 5082-1, and a capacitor 5083-1. The connection relation of each element is the same as that in the circuit structure in FIG. 25A. In a similar manner, the second subpixel 5080-2 includes a transistor 5081-2, a liquid crystal element 5082-2, and a capacitor 5083-2. The connection relation of each element is the same as that in the circuit structure in FIG. 25A.

The pixel structure in FIG. 26A includes, for two subpixels included in one pixel, two wirings 5085 (a wiring 5085-1 and a wiring 5085-2) used as scan lines, one wiring 5084 used as a signal line, and one wiring 5086 used as a capacitor line. When the signal line and the capacitor line are shared between two subpixels in this manner, the aperture ratio can be improved. Further, since a signal line driver circuit can be simplified, manufacturing cost can be reduced. Furthermore, since the number of connections between a liquid crystal panel and a driver circuit IC can be reduced, yield can be improved. The pixel structure in FIG. 26B includes, for two subpixels included in one pixel, one wiring 5085 used as a scan line, two wirings 5084 (a wiring 5084-1 and a wiring 5084-2) used as signal lines, and one wiring 5086 used as a capacitor line. When the scan line and the capacitor line are shared between two subpixels in this manner, the aperture ratio can be improved. Further, since the total number of scan lines can be reduced, the length of each gate line selection period can be sufficiently increased even in a high-definition liquid crystal panel, and appropriate signal voltage can be written to each pixel.

Figure 26C:
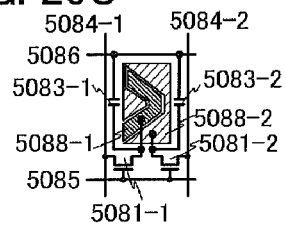
Figure 26D:
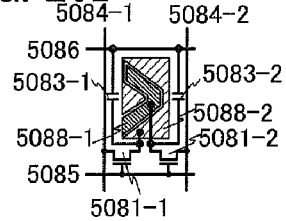

FIGS. 26C and 26D illustrate an example in which the liquid crystal element in the pixel structure in FIG. 26B is replaced with the shape of a pixel electrode and the electrical connection of each element is schematically illustrated. In FIGS. 26C and 26D, an electrode 5088-1 denotes a first pixel electrode, and an electrode 5088-2 denotes a second pixel electrode. In FIG. 26C, the first pixel electrode 5088-1 corresponds to a first terminal of the liquid crystal element 5082-1 in FIG. 26B, and the second pixel electrode 5088-2 corresponds to a first terminal of the liquid crystal element 5082-2 in FIG. 26B. That is, the first pixel electrode 5088-1 is electrically connected to one of a source and a drain of the thin film transistor 5081-1, and the second pixel electrode 5088-2 is electrically connected to one of a source and a drain of the thin film transistor 5081-2. Meanwhile, in FIG. 26D, the connection relation between the pixel electrode and the thin film transistor is opposite to that in FIG. 26C. That is, the first pixel electrode 5088-1 is electrically connected to one of the source and the drain of the thin film transistor 5081-2, and the second pixel electrode 5088-2 is electrically connected to one of the source and the drain of the thin film transistor 5081-1.

Figure 26E:
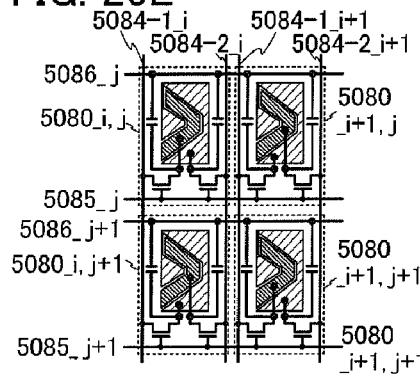
Figure 26F:
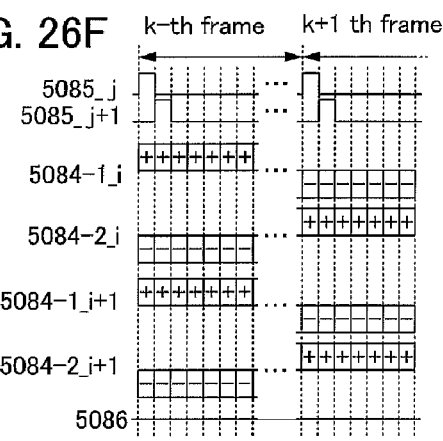
FIGS. 26F and 26H are timing charts of the semiconductor devices.

By alternately arranging a plurality of pixel structures illustrated in FIG. 26C and FIG. 26D in a matrix, special advantageous effects can be obtained. FIGS. 26E and 26F illustrate examples of the pixel structure and a driving method thereof. In the pixel structure in FIG. 26E, a portion corresponding to the pixels 5080_$i, j$ and 5080_$i+1, j+1$ has the structure illustrated in FIG. 26C, and a portion corresponding to the pixels 5080_$i+1, j$ and 5080_$i, j+1$ has the structure illustrated in FIG. 26D. In this structure, by performing driving like the timing chart illustrated in FIG. 26F, in the j-th gate selection period in the k-th frame, positive signal voltage is written to the first pixel electrode in the pixel 5080_$i, j$ and the second pixel electrode in the pixel 5080_$i+1, j$, and negative signal voltage is written to the second pixel electrode in the pixel 5080_$i, j$ and the first pixel electrode in the pixel 5080_$i+1, j$. In the (j+1)th gate selection period in the k-th frame, positive signal voltage is written to the second pixel electrode in the pixel 5080_$i, j+1$ and the first pixel electrode in the pixel 5080_$i+1, j+1$, and negative signal voltage is written to the first pixel electrode in the pixel 5080_$i, j+1$ and the second pixel electrode in the pixel 5080_$i+1, j+1$. In the (k+1)th frame, the polarity of signal voltage is inverted in each pixel. Thus, the polarity of voltage applied to the signal line can be the same in one frame period while driving corresponding to dot inversion driving is realized in the pixel structure including subpixels. Therefore, power consumed in writing signal voltage to the pixels can be drastically reduced. Note that voltage applied to all the wirings 5086 including the wirings 5086_$j$ and 5086_$j+1$ can be fixed voltage.

Figure 26G:
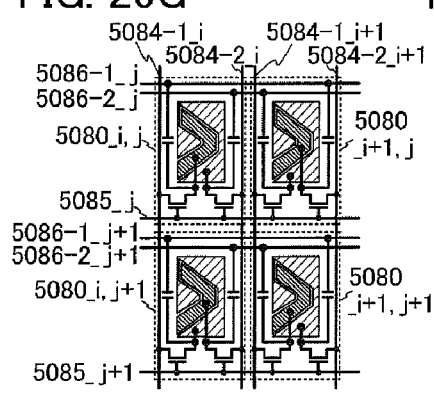
Figure 26H:
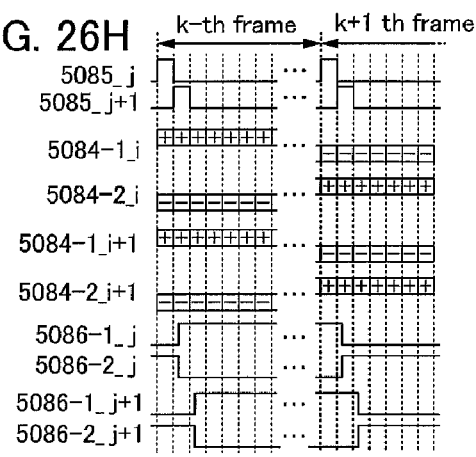

Further, by a pixel structure and a driving method illustrated in FIGS. 26G and 26H, the level of signal voltage written to a pixel can be lowered. In the structure, capacitors lines which are electrically connected to a plurality of subpixels included in each pixel are different between the subpixels. That is, by using the pixel structure and the driving method illustrated in FIGS. 26G and 26H, subpixels to which voltages having the same polarities are written in the same frame share a capacitor line in the same row, and subpixels to which voltages having different polarities are written in the same frame use different capacitor lines in the same row. Then, when writing in each row is terminated, voltage of the capacitor lines is changed in the positive direction in the subpixels to which positive signal voltage is written, and changed in the negative direction in the subpixels to which negative signal voltage is written. Thus, the level of the signal voltage written to the pixel can be lowered. Specifically, two wirings 5086 (the wirings 5086-1 and 5086-2) used as capacitor lines are provided in each row. The first pixel electrode in the pixel 5080_$i, j$ and the wiring 5086-1; are electrically connected to each other through the capacitor. The second pixel electrode in the pixel 5080_$i, j$ and the wiring 5086-2_$j$ are electrically connected to each other through the capacitor. The first pixel electrode in the pixel 5080_$i+1, j$ and the wiring 5086-2_$j$ are electrically connected to each other through the capacitor. The second pixel electrode in the pixel 5080_$i+1, j$ and the wiring 5086-1_$j$ are electrically connected to each other through the capacitor. The first pixel electrode in the pixel 5080_$i, j+1$ and the wiring 5086-2_$j+1$ are electrically connected to each other through the capacitor. The second pixel electrode in the pixel 5080_$i, j+1$ and the wiring 5086-1_$j+1$ are electrically connected to each other through the capacitor. The first pixel electrode in the pixel 5080_$i$+1, $j$+1 and the wiring 5086-1_$j$+1 are electrically connected to each other through the capacitor. The second pixel electrode in the pixel 5080_$i$+1, $j$+1 and the wiring 5086-2_$j$+1 are electrically connected to each other through the capacitor. Note that this is just an example, and for example, in the case of using a driving method by which pixels to which positive signal voltage is written and pixels to which negative signal voltage is written appear every two pixels, it is preferable to perform electrical connections with the wirings 5086-1 and 5086-2 alternately every two pixels. Further, in the case where signal voltage of the same polarity is written in all the pixels in one row (gate line inversion), one wiring 5086 may be provided per row. In other words, in the pixel structure in FIG. 26E, the driving method by which signal voltage written to a pixel is lowered as described with reference to FIGS. 26G and 26H can be used.

Embodiment 7

Next, another structure example and a driving method of a display device are described. In this embodiment, the case of using a display device including a display element whose luminance response with respect to signal writing is slow (response time is long) is described. In this embodiment, a liquid crystal element is described as an example of the display element with long response time. In this embodiment, a liquid crystal element is illustrated as an example of the display element with long response time. However, a display element in this embodiment is not limited to this, and a variety of display elements whose luminance response with respect to signal writing is slow can be used.

In a general liquid crystal display device, luminance response with respect to signal writing is slow, and it sometimes takes more than one frame period to complete the response even when signal voltage is continuously applied to a liquid crystal element. Moving images cannot be displayed precisely by such a display element. Further, in the case of active matrix driving, time for signal writing to one liquid crystal element is only a period (one scan line selection period) obtained by dividing a signal writing cycle (one frame period or one subframe period) by the number of scan lines, and the liquid crystal element cannot respond in such a short time in many cases. Therefore, most of the response of the liquid crystal element is performed in a period during which signal writing is not performed. Here, the dielectric constant of the liquid crystal element is changed in accordance with the transmittance of the liquid crystal element, and the response of the liquid crystal element in a period during which signal writing is not performed means that the dielectric constant of the liquid crystal element is changed in a state where electric charge is not exchanged with the outside of the liquid crystal element (in a constant charge state). In other words, in a formula where charge=(capacitance)·(voltage), the capacitance is changed in a state where the charge is constant. Accordingly, voltage applied to the liquid crystal element is changed from voltage in signal writing, in accordance with the response of the liquid crystal element. Therefore, in the case where the liquid crystal element whose luminance response with respect to signal writing is slow is driven by active matrix driving, voltage applied to the liquid crystal element cannot theoretically reach the voltage in signal writing.

In the display device in this embodiment, a signal level in signal writing is corrected in advance (a correction signal is used) so that a display element can reach desired luminance within a signal writing cycle. Thus, the above problem can be solved. Further, since the response time of the liquid crystal element becomes shorter as the signal level becomes higher, the response time of the liquid crystal element can also be shorter by writing a correction signal. A driving method by which such a correction signal is added is referred to as overdrive. By overdrive in this embodiment, even when a signal writing cycle is shorter than a cycle for an image signal input to the display device (an input image signal cycle $T_{in}$), the signal level is corrected in accordance with the signal writing cycle, so that the display element can reach desired luminance within the signal writing cycle. The case where the signal writing cycle is shorter than the input image signal cycle $T_{in}$ is, for example, the case where one original image is divided into a plurality of subimages and the plurality of subimages are sequentially displayed in one frame period.

Figure 27A:
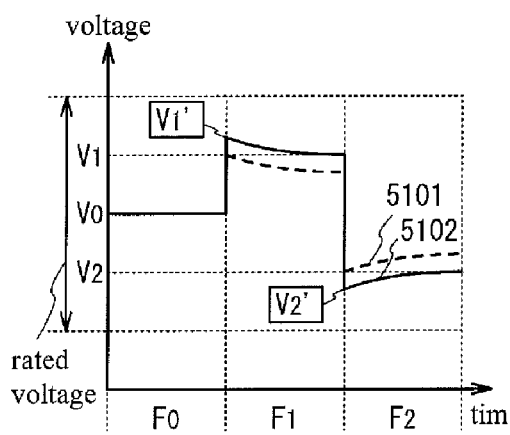
FIGS. 27A to 27F illustrate potentials of display elements of a semiconductor device according to one embodiment of the present invention.
Figure 27B:
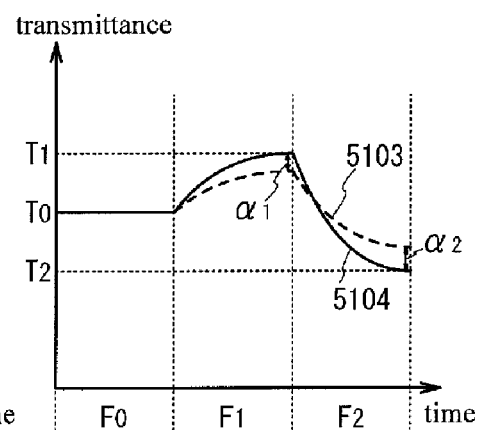

Next, an example of correcting a signal level in signal writing in a display device driven by active matrix driving is described with reference to FIGS. 27A and 27B. FIG. 27A is a graph schematically illustrating a time change in signal level in signal writing in one display element, with the time as the horizontal axis and the signal level in signal writing as the vertical axis. FIG. 27B is a graph schematically illustrating a time change in display level in one display element, with the time as the horizontal axis and the display level as the vertical axis. Note that when the display element is a liquid crystal element, the signal level in signal writing can be voltage, and the display level can be the transmittance of the liquid crystal element. In the following description, the vertical axis in FIG. 27A is regarded as the voltage, and the vertical axis in FIG. 27B is regarded as the transmittance. Note that in the overdrive in this embodiment, the signal level may be other than the voltage (may be a duty ratio or current, for example). Note that in the overdrive in this embodiment, the display level may be other than the transmittance (may be luminance or current, for example). Liquid crystal elements are classified into two modes: a normally black mode in which black is displayed when voltage is 0 (e.g., a VA mode and an IPS mode), and a normally white mode in which white is displayed when voltage is 0 (e.g., a TN mode and an OCB mode). The graph illustrated in FIG. 27B corresponds to both of the modes. The transmittance increases in the upper part of the graph in the normally black mode, and the transmittance increases in the lower part of the graph in the normally white mode. That is, a liquid crystal mode in this embodiment may be either a normally black mode or a normally white mode. Note that timing of signal writing is represented on the time axis by dotted lines, and a period after signal writing is performed until the next signal writing is performed is referred to as a retention period $F_i$. In this embodiment, i is an integer and an index for representing each retention period. In FIGS. 27A and 27B, i is 0 to 2; however, i can be an integer other than 0 to 2 (only the case where i is 0 to 2 is illustrated). Note that in the retention period $F_i$, transmittance for realizing luminance corresponding to an image signal is denoted by $T_i$, and voltage for providing the transmittance $T_i$ in a constant state is denoted by $V_i$. In FIG. 27A, a dashed line 5101 represents a time change in voltage applied to the liquid crystal element in the case where overdrive is not performed, and a solid line 5102 represents a time change in voltage applied to the liquid crystal element in the case where the overdrive in this embodiment is performed. In a similar manner, in FIG. 27B, a dashed line 5103 represents a time change in transmittance of the liquid crystal element in the case where overdrive is not performed, and a solid line 5104 represents a time change in transmittance of the liquid crystal element in the case where the overdrive in this embodiment is performed. Note that a difference between the desired transmittance $T_i$ and the actual transmittance at the end of the retention period $F_i$ is referred to as an error $\alpha_i$.

It is assumed that, in the graph illustrated in FIG. 27A, both the dashed line 5101 and the solid line 5102 represent the case where desired voltage $V_0$ is applied in a retention period $F_0$; and in the graph illustrated in FIG. 27B, both the dashed line 5103 and the solid line 5104 represent the case where desired transmittance $T_0$ is obtained. In the case where overdriving is not performed, desired voltage $V_1$ is applied at the beginning of a retention period $F_1$ as shown by the dashed line 5101. As has been described above, a period for signal writing is much shorter than a retention period, and the liquid crystal element is in a constant charge state in most of the retention period. Accordingly, voltage applied to the liquid crystal element in the retention period $F_1$ is changed along with a change in transmittance and is greatly different from the desired voltage $V_1$ at the end of the retention period $F_1$. In this case, the dashed line 5103 in the graph of FIG. 27B is greatly different from desired transmittance $T_1$. Accordingly, accurate display of an image signal cannot be performed, so that image quality is decreased. On the other hand, in the case where the overdrive in this embodiment is performed, voltage $V_1'$ which is higher than the desired voltage $V_1$ is applied to the liquid crystal element at the beginning of the retention period $F_1$ as shown by the solid line 5102. That is, the voltage $V_1'$ which is corrected from the desired voltage $V_1$ is applied to the liquid crystal element at the beginning of the retention period $F_1$ so that the voltage applied to the liquid crystal element at the end of the retention period $F_1$ is close to the desired voltage $V_1$ in anticipation of a gradual change in voltage applied to the liquid crystal element in the retention period $F_1$. Thus, the desired voltage $V_1$ can be accurately applied to the liquid crystal element. In this case, as shown by the solid line 5104 in the graph of FIG. 27B, the desired transmittance $T_1$ can be obtained at the end of the retention period $F_1$. In other words, the response of the liquid crystal element within the signal writing cycle can be realized, despite the fact that the liquid crystal element is in a constant charge state in most of the retention period. Then, in a retention period $F_2$, the case where desired voltage $V_2$ is lower than $V_1$ is described. Also in that case, as in the retention period $F_1$, voltage $V_2'$ which is corrected from the desired voltage $V_2$ may be applied to the liquid crystal element at the beginning of the retention period $F_2$ so that the voltage applied to the liquid crystal element at the end of the retention period $F_2$ is close to the desired voltage $V_2$ in anticipation of a gradual change in voltage applied to the liquid crystal element in the retention period $F_2$. Thus, as shown by the solid line 5104 in the graph of FIG. 27B, desired transmittance $T_2$ can be obtained at the end of the retention period $F_2$. Note that in the case where $V_i$ is higher than $V_{i-1}$ as in the retention period $F_1$, the corrected voltage $V_i'$ is preferably corrected so as to be higher than desired voltage $V_i$. Further, when $V_i$ is lower than $V_{i-1}$ as in the retention period $F_2$, the corrected voltage $V_i'$ is preferably corrected so as to be lower than the desired voltage $V_i$. Note that a specific correction value can be derived by measuring response characteristics of the liquid crystal element in advance. As a method of realizing overdrive in a device, a method by which a correction formula is formulated and included in a logic circuit, a method by which a correction value is stored in a memory as a look-up table and is read as necessary, or the like can be used.

Figure 27C:
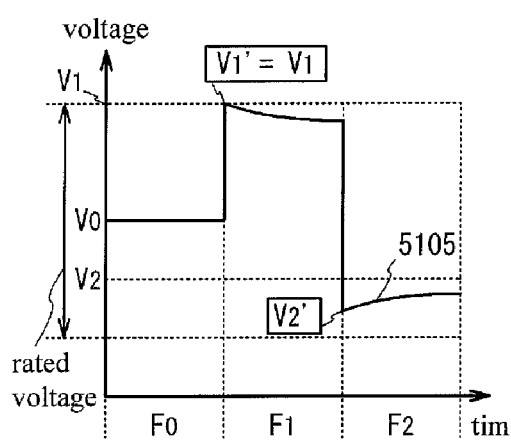
Figure 27D:
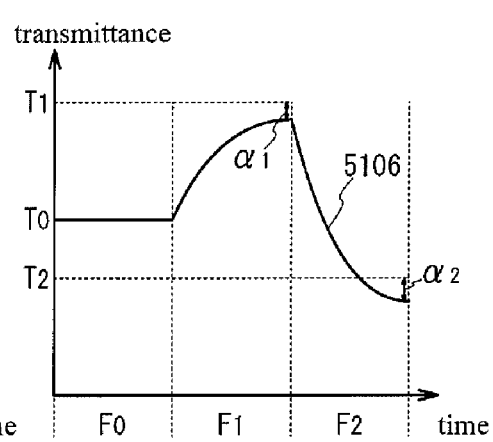
Figure 27E:
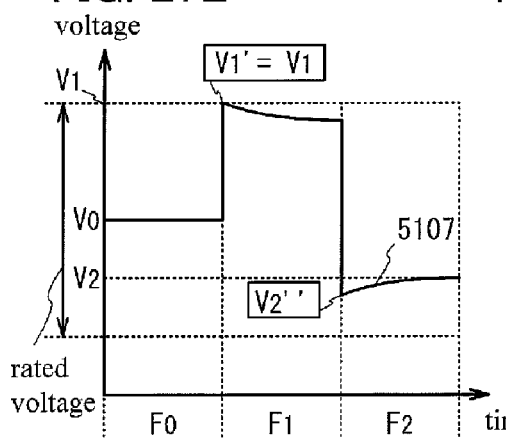
Figure 27F:
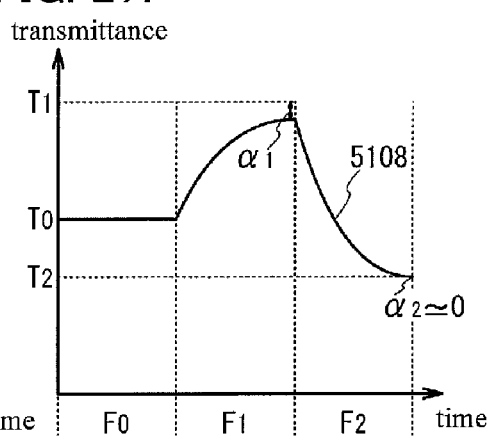

Note that there are several limitations on realization of the overdrive in this embodiment in a device. For example, voltage correction has to be performed in the range of the rated voltage of a source driver. That is, in the case where desired voltage is originally high and ideal correction voltage exceeds the rated voltage of the source driver, not all the correction can be performed. Problems in such a case are described with reference to FIGS. 27C and 27D. As in FIG. 27A, FIG. 27C is a graph in which a time change in voltage in one liquid crystal element is schematically illustrated as a solid line 5105 with the time as the horizontal axis and the voltage as the vertical axis. As in FIG. 27B, FIG. 27D is a graph in which a time change in transmittance of one liquid crystal element is schematically illustrated as a solid line 5106 with the time as the horizontal axis and the transmittance as the vertical axis. Note that since other references are similar to those in FIGS. 27A and 27B, description thereof is omitted. FIGS. 27C and 27D illustrate a state where sufficient correction cannot be performed because the correction voltage $V_1'$ for realizing the desired transmittance $T_1$ in the retention period $F_1$ exceeds the rated voltage of the source driver; thus $V_1'=V_1$ has to be given. In this case, the transmittance at the end of the retention period $F_1$ is deviated from the desired transmittance $T_1$ by the error $\alpha_1$. Note that the error $\alpha_1$ is increased only when the desired voltage is originally high; therefore, a decrease in image quality due to occurrence of the error $\alpha_1$ is in the allowable range in many cases. However, as the error $\alpha_1$ is increased, an error in algorithm for voltage correction is also increased. In other words, in the algorithm for voltage correction, when it is assumed that the desired transmittance is obtained at the end of the retention period, even though the error $\alpha_1$ is increased, voltage correction is performed on the basis that the error $\alpha_1$ is small. Accordingly, the error is included in correction in the following retention period $F_2$; thus, an error $\alpha_2$ is also increased. Further, in the case where the error $\alpha_2$ is increased, the following error $\alpha_3$ is further increased, for example, and the error is increased, which results in a significant decrease in image quality. In the overdrive in this embodiment, in order to prevent the increase of errors in such a manner, when the correction voltage $V_i'$ exceeds the rated voltage of the source driver in the retention period $F_i$, an error $\alpha_i$ at the end of the retention period $F_i$ is estimated, and the correction voltage in a retention period $F_{i+1}$ can be adjusted in consideration of the amount of the error $\alpha_i$. Thus, even when the error $\alpha_i$ is increased, the effect of the error $\alpha_i$ on the error $\alpha_{i+1}$ can be minimized, so that the increase of errors can be prevented. An example where the error $\alpha_2$ is minimized in the overdrive in this embodiment is described with reference to FIGS. 27E and 27F. In a graph of FIG. 27E, a solid line 5107 represents a time change in voltage in the case where the correction voltage $V_2'$ in the graph of FIG. 27C is further adjusted to be correction voltage $V_2''$. A graph of FIG. 27F illustrates a time change in transmittance in the case where voltage is corrected in accordance with the graph of FIG. 27E. The solid line 5106 in the graph of FIG. 27D indicates that excessive correction (correction in the case where an error is large) is caused by the correction voltage $V_2'$. On the other hand, the solid line 5108 in the graph of FIG. 27F indicates that excessive correction is suppressed by the correction voltage $V_2''$ which is adjusted in consideration of the error $\alpha_1$ and the error $\alpha_2$ is minimized. Note that a specific correction value can be derived from measuring response characteristics of the liquid crystal element in advance. As a method of realizing overdrive in a device, a method by which a correction formula is formulated and included in a logic circuit, a method by which a correction value is stored in a memory as a look-up table and read as necessary, or the like can be used. Further, such a method can be added separately from a portion for calculating correction voltage $V_i'$ or can be included in the portion for calculating correction voltage $V_i'$. Note that the amount of correction of correction voltage $V_i'$ which is adjusted in consideration of an error $\alpha_{i-1}$ (a difference with the desired voltage $V_i$) is preferably smaller than that of $V_i'$. That is, $|V_i'''-V_i|<|V_i'-V_i|$ is preferable.

Note that the error $\alpha_i$ which is caused because ideal correction voltage exceeds the rated voltage of the source driver is increased as a signal writing cycle becomes shorter. This is because the response time of the liquid crystal element needs to be shorter as the signal writing cycle becomes shorter, so that higher correction voltage is necessary. Further, as a result of an increase in correction voltage needed, the correction voltage exceeds the rated voltage of the source driver more frequently, so that the large error $\alpha_i$ occurs more frequently. Therefore, it can be said that the overdrive in this embodiment becomes more effective as the signal writing cycle becomes shorter. Specifically, the overdrive in this embodiment is significantly effective in the case of performing the following driving methods: a driving method by which one original image is divided into a plurality of subimages and the plurality of subimages are sequentially displayed in one frame period, a driving method by which motion of an image is detected from a plurality of images and an intermediate image of the plurality of images is generated and inserted between the plurality of images (so-called motion compensation frame rate doubling), and a driving method in which such driving methods are combined, for example.

Note that the rated voltage of the source driver has the lower limit in addition to the upper limit described above. An example of the lower limit is the case where voltage which is lower than the voltage 0 cannot be applied. In this case, since ideal correction voltage cannot be applied as in the case of the upper limit described above, the error $\alpha_i$ is increased. However, also in that case, the error $\alpha_i$ at the end of the retention period $F_i$ is estimated, and the correction voltage in the retention period $F_{i+1}$ can be adjusted in consideration of the amount of the error $\alpha_i$ in a manner similar to the above method. Note that in the case where voltage which is lower than the voltage 0 (negative voltage) can be applied as the rated voltage of the source driver, the negative voltage may be applied to the liquid crystal element as correction voltage. Thus, the voltage applied to the liquid crystal element at the end of retention period $F_i$ can be adjusted so as to be close to the desired voltage $V_i$ in anticipation of a change in potential due to a constant charge state.

Note that in order to suppress deterioration of the liquid crystal element, so-called inversion driving by which the polarity of voltage applied to the liquid crystal element is periodically inverted can be performed in combination with the overdrive. That is, the overdrive in this embodiment includes the case where the overdrive is performed at the same time as the inversion driving. For example, in the case where the length of the signal writing cycle is half of that of the input image signal cycle $T_{in}$, when the length of a cycle for inverting polarity is the same or substantially the same as that of the input image signal cycle $T_{in}$, two sets of writing of a positive signal and two sets of writing of a negative signal are alternately performed. The length of the cycle for inverting polarity is made larger than that of the signal writing cycle in this manner, so that the frequency of charge and discharge of a pixel can be reduced. Thus, power consumption can be reduced. Note that when the cycle for inverting polarity is made too long, a defect in which luminance difference due to the difference of polarity is recognized as a flicker occurs in some cases; therefore, it is preferable that the length of the cycle for inverting polarity be substantially the same as or smaller than that of the input image signal cycle $T_{in}$.

Embodiment 8

Next, another structure example and a driving method of a display device are described. In this embodiment, a method is described by which an image for interpolating motion of an image input from the outside of a display device (an input image) is generated inside the display device based on a plurality of input images and the generated image (the generation image) and the input image are sequentially displayed. Note that when an image for interpolating motion of an input image is a generation image, motion of moving images can be made smooth, and a decrease in quality of moving images because of afterimages or the like due to hold driving can be suppressed. Here, moving image interpolation is described below. Ideally, display of moving images is realized by controlling the luminance of each pixel in real time; however, individual control of pixels in real time has problems such as the enormous number of control circuits, space for wirings, and the enormous amount of input image data. Thus, it is difficult to realize the individual control of pixels. Therefore, for display of moving images by a display device, a plurality of still images are sequentially displayed in a certain cycle so that display appears to be moving images. The cycle (in this embodiment, referred to as an input image signal cycle and denoted by $T_{in}$) is standardized, and for example, $\frac{1}{60}$ second in NTSC and $\frac{1}{50}$ second in PAL. Such a cycle does not cause a problem of moving image display in a CRT, which is an impulsive display device. However, in a hold-type display device, when moving images conforming to these standards are displayed without change, a defect in which display is blurred because of afterimages or the like due to hold driving (hold blur) occurs. Since hold blur is recognized by discrepancy between unconscious motion interpolation due to human eyes tracking and hold-type display, the hold blur can be reduced by making the input image signal cycle shorter than that in conventional standards (by making the control closer to individual control of pixels in real time). However, it is difficult to reduce the length of the input image signal cycle because the standard needs to be changed and the amount of data is increased. However, an image for interpolating motion of an input image is generated inside the display device in response to a standardized input image signal, and display is performed while the generation image interpolates the input image, so that hold blur can be reduced without a change in the standard or an increase in the amount of data. Operation such that an image signal is generated inside the display device in response to an input image signal to interpolate motion of the input image is referred to as moving image interpolation.

Figure 28A:
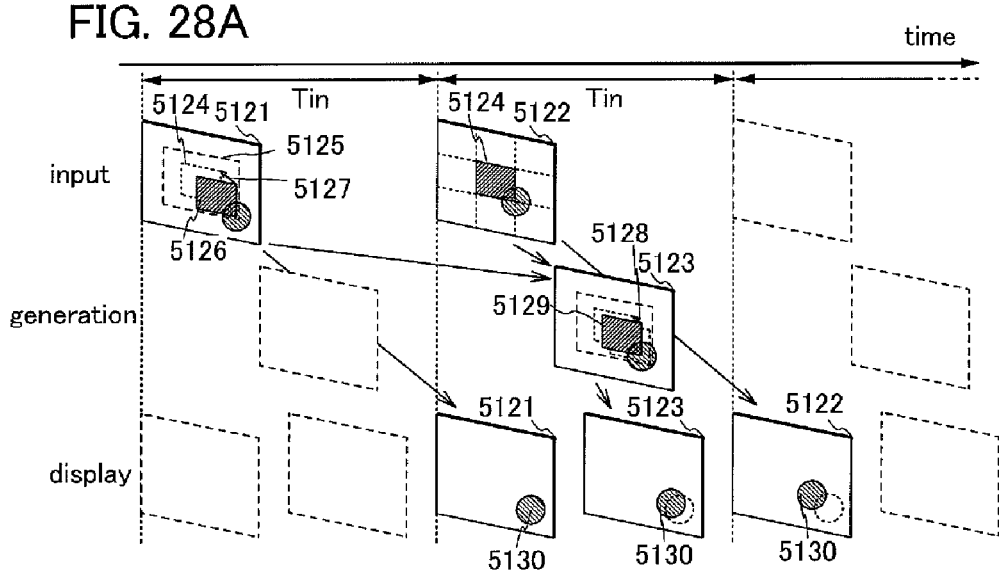
FIGS. 28A to 28C illustrate display screens of a semiconductor device according to one embodiment of the present invention.
Figure 28B:
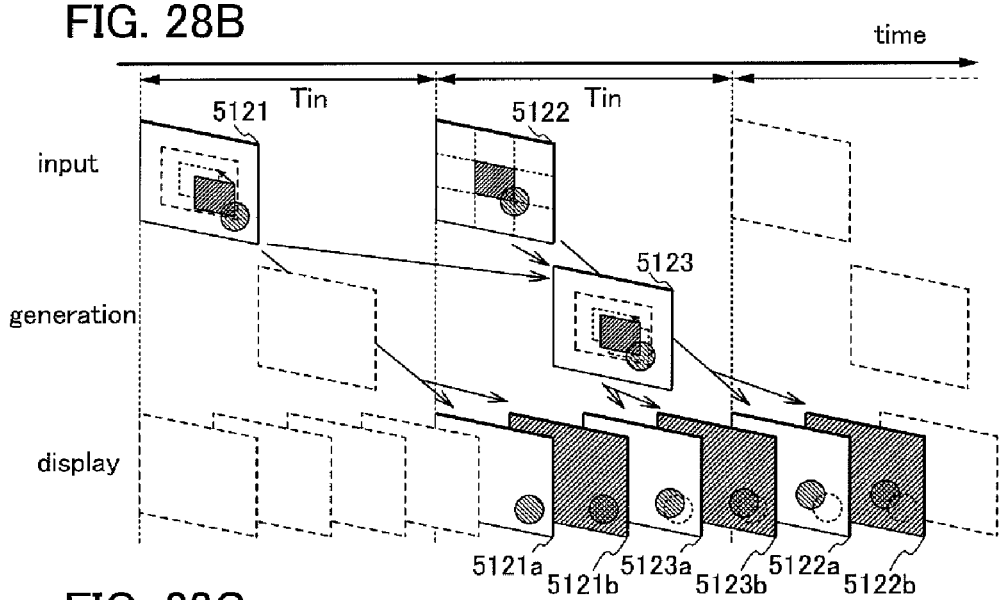

By a method for interpolating moving images in this embodiment, motion blur can be reduced. The method for interpolating moving images in this embodiment can include an image generation method and an image display method. Further, by using a different image generation method and/or a different image display method for motion with a specific pattern, motion blur can be effectively reduced. FIGS. 28A and 28B are schematic diagrams each illustrating an example of a method for interpolating moving images in this embodiment. FIGS. 28A and 28B each illustrate timing of treating each image by using the position of the horizontal direction, with the time as the horizontal axis. A portion represented as "input" indicates timing at which an input image signal is input. Here, images 5121 and 5122 are focused as two images that are temporally adjacent. An input image is input at an interval of the cycle $T_{in}$. Note that the length of one cycle $T_{in}$ is referred to as one frame or one frame period in some cases. A portion represented as "generation" indicates timing at which a new image is generated from an input image signal. Here, an image 5123 which is a generation image generated based on the images 5121 and 5122 is focused. A portion represented as "display" indicates timing at which an image is displayed in the display device. Note that images other than the focused images are only represented by dashed lines, and by treating such images in a manner similar to that of the focused images, the example of the method for interpolating moving images in this embodiment can be realized.

In the example of the method for interpolating moving images in this embodiment, as illustrated in FIG. 28A, a generation image which is generated based on two input images that are temporally adjacent is displayed in a period after one image is displayed until the other image is displayed, so that moving image interpolation can be performed. In this case, a display cycle of a display image is preferably half of an input cycle of the input image. Note that the display cycle is not limited to this and can be a variety of display cycles. For example, in the case where the length of the display cycle is shorter than half of that of the input cycle, moving images can be displayed more smoothly. Alternatively, in the case where the length of the display cycle is longer than half of that of the input cycle, power consumption can be reduced. Note that here, an image is generated based on two input images which are temporally adjacent; however, the number of input images serving as a basis is not limited to two and can be other numbers. For example, when an image is generated based on three (may be more than three) input images which are temporally adjacent, a generation image with higher accuracy can be obtained as compared to the case where an image is generated based on two input images. Note that the display timing of the image 5121 is the same as the input timing of the image 5122, that is, the display timing is one frame later than the input timing. However, display timing in the method for interpolating moving images in this embodiment is not limited to this and can be a variety of display timings. For example, the display timing can be delayed with respect to the input timing by more than one frame. Thus, the display timing of the image 5123 which is the generation image can be delayed, which allows enough time to generate the image 5123 and leads to reduction in power consumption and manufacturing cost. Note that when the display timing is delayed with respect to the input timing for a long time, a period for holding an input image becomes longer, and the memory capacity which is necessary for holding the input image is increased. Therefore, the display timing is preferably delayed with respect to the input timing by approximately one to two frames.

Here, an example of a specific generation method of the image 5123 which is generated based on the images 5121 and 5122 is described. It is necessary to detect motion of an input image in order to interpolate moving images. In this embodiment, a method called a block matching method can be used in order to detect motion of an input image. Note that this embodiment is not limited to this, and a variety of methods (e.g., a method for obtaining a difference of image data or a method of using Fourier transformation) can be used. In the block matching method, first, image data for one input image (here, image data of the image 5121) is stored in a data storage means (e.g., a memory circuit such as a semiconductor memory or a RAM). Then, an image in the next frame (here, the image 5122) is divided into a plurality of regions. Note that the divided regions can have the same rectangular shapes as illustrated in FIG. 28A; however, the divided regions are not limited to them and can have a variety of shapes (e.g., the shape or size varies depending on images). After that, in each divided region, data is compared to the image data in the previous frame (here, the image data of the image 5121), which is stored in the data storage means, so that a region where the image data is similar to each other is searched. The example of FIG. 28A illustrates that the image 5121 is searched for a region where data is similar to that of a region 5124 in the image 5122, and a region 5126 is found. Note that a search range is preferably limited when the image 5121 is searched. In the example of FIG. 28A, a region 5125 which is approximately four times larger than the region 5124 is set as the search range. By making the search range larger than this, detection accuracy can be increased even in a moving image with high-speed motion. Note that search in an excessively wide range needs an enormous amount of time, which makes it difficult to realize detection of motion. Thus, the region 5125 has preferably approximately two to six times larger than the area of the region 5124. After that, a difference of the position between the searched region 5126 and the region 5124 in the image 5122 is obtained as a motion vector 5127. The motion vector 5127 represents motion of image data in the region 5124 in one frame period. Then, in order to generate an image illustrating the intermediate state of motion, an image generation vector 5128 obtained by changing the size of the motion vector without a change in the direction thereof is generated, and image data included in the region 5126 of the image 5121 is moved in accordance with the image generation vector 5128, so that image data in a region 5129 of the image 5123 is generated. By performing a series of processings on the entire region of the image 5122, the image 5123 can be generated. Then, by sequentially displaying the input image 5121, the generated image 5123, and the input image 5122, moving images can be interpolated. Note that the position of an object 5130 in the image is different (i.e., the object is moved) between the images 5121 and 5122. In the generated image 5123, the object is located at the midpoint between the images 5121 and 5122. By displaying such images, motion of moving images can be made smooth, and blur of moving images due to afterimages or the like can be reduced.

Note that the size of the image generation vector 5128 can be determined in accordance with the display timing of the image 5123. In the example of FIG. 28A, since the display timing of the image 5123 is the midpoint (½) between the display timings of the images 5121 and 5122, the size of the image generation vector 5128 is half of that of the motion vector 5127. Alternatively, for example, when the display timing is ⅓ between the display timings of the images 5121 and 5122, the size of the image generation vector 5128 can be ⅓, and when the display timing is ⅔ between the display timings of the images 5121 and 5122, the size can be ⅔.

Note that in the case where a new image is generated by moving a plurality of regions having different motion vectors in this manner, a portion where one region has already been moved to a region that is a destination for another region or a portion to which any region is not moved is generated in some cases (i.e., overlap or blank occurs in some cases). For such portions, data can be compensated. As a method for compensating an overlap portion, a method by which overlap data is averaged; a method by which data is arranged in order of priority according to the direction of motion vectors or the like, and high-priority data is used as data in a generation image; or a method by which one of color and brightness is arranged in order of priority and the other thereof is averaged can be used, for example. As a method for compensating a blank portion, a method by which image data of the portion of the image 5121 or the image 5122 is used as data in a generation image without modification, a method by which image data of the portion of the image 5121 or the image 5122 is averaged, or the like can be used. Then, the generated image 5123 is displayed in accordance with the size of the image generation vector 5128, so that motion of moving images can be made smooth, and the decrease in quality of moving images because of afterimages or the like due to hold driving can be suppressed.

In another example of the method for interpolating moving images in this embodiment, as illustrated in FIG. 28B, when a generation image which is generated based on two input images which are temporally adjacent is displayed in a period after one image is displayed until the other image is displayed, each display image is divided into a plurality of subimages to be displayed. Thus, moving images can be interpolated. This case can have advantages of displaying a dark image at regular intervals (advantages when a display method is made closer to impulsive display) in addition to advantages of a shorter image display cycle. That is, blur of moving images due to afterimages or the like can be further reduced as compared to the case where the length of the image display cycle is just made to half of that of the image input cycle. In the example of FIG. 28B, "input" and "generation" can be similar to the processings in the example of FIG. 28A; therefore, description thereof is omitted. For "display" in the example of FIG. 28B, one input image and/or one generation image can be divided into a plurality of subimages to be displayed. Specifically, as illustrated in FIG. 28B, the image 5121 is divided into subimages 5121a and 5121b and the subimages 5121a and 5121b are sequentially displayed so as to make human eyes perceive that the image 5121 is displayed; the image 5123 is divided into subimages 5123a and 5123b and the subimages 5123a and 5123b are sequentially displayed so as to make human eyes perceive that the image 5123 is displayed; and the image 5122 is divided into subimages 5122a and 5122b and the subimages 5122a and 5122b are sequentially displayed so as to make human eyes perceive that the image 5122 is displayed. That is, the display method can be made closer to impulsive display while the image perceived by human eyes is similar to that in the example of FIG. 28A, so that blur of moving images due to afterimages or the like can be further reduced. Note that the number of division of subimages is two in FIG. 28B; however, the number of division of subimages is not limited to this and can be other numbers. Note that subimages are displayed at regular intervals (½) in FIG. 28B; however, timing of displaying subimages is not limited to this and can be a variety of timings. For example, when timing of displaying dark subimages 5121b, 5122b, and 5123b is made earlier (specifically, timing at ¼ to ½), the display method can be made much closer to impulsive display, so that blur of moving images due to afterimages or the like can be further reduced. Alternatively, when the timing of displaying dark subimages is delayed (specifically, timing at ½ to ¾), the length of a period for displaying a bright image can be increased, so that display efficiency can be increased and power consumption can be reduced.

Figure 28C:
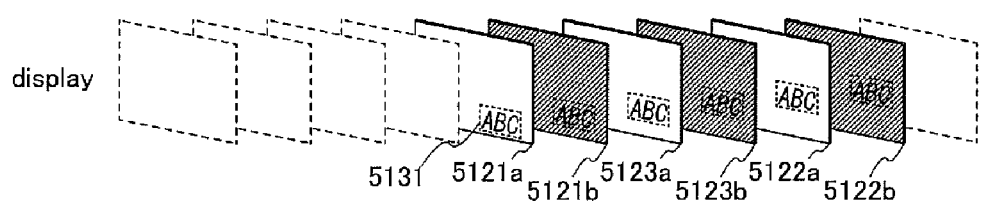

Another example of the method for interpolating moving images in this embodiment is an example in which the shape of an object which is moved in an image is detected and different processings are performed depending on the shape of the moving object. FIG. 28C illustrates display timing as in the example of FIG. 28B and the case where moving characters (also referred to as scrolling texts, subtitles, captions, or the like) are displayed. Note that since terms "input" and "generation" may be similar to those in FIG. 28B, they are not illustrated in FIG. 28C. The amount of blur of moving images by hold driving varies depending on properties of a moving object in some cases. In particular, blur is recognized remarkably when characters are moved in many cases. This is because eyes track moving characters to read the characters, so that hold blur easily occur. Further, since characters have clear outlines in many cases, blur due to hold blur is further emphasized in some cases. That is, determining whether an object which is moved in an image is a character and performing special processing when the object is the character are effective in reducing hold blur. Specifically, when edge detection, pattern detection, and/or the like are/is performed on an object which is moved in an image and the object is determined to be a character, motion compensation is performed even on subimages generated by division of one image so that an intermediate state of motion is displayed. Thus, motion can be made smooth. In the case where the object is determined not to be a character, when subimages are generated by division of one image as illustrated in FIG. 28B, the subimages can be displayed without a change in the position of the moving object. The example of FIG. 28C illustrates the case where a region 5131 determined to be characters is moved upward, and the position of the region 5131 is different between the subimages 5121a and 5121b. In a similar manner, the position of the region 5131 is different between the subimages 5123a and 5123b, and between the subimages 5122a and 5122b. Thus, motion of characters for which hold blur is particularly easily recognized can be made smoother than that by normal motion compensation frame rate doubling, so that blur of moving images due to afterimages or the like can be further reduced.

Embodiment 9

A semiconductor device can be used in a variety of electronic devices (including game machines). Examples of electronic devices are a television set (also referred to as a television or a television receiver), a monitor of a computer or the like, a camera such as a digital camera or a digital video camera, a digital photo frame, a mobile phone handset (also referred to as a mobile phone or a mobile phone device), a portable game machine, a portable information terminal, an audio reproducing device, a large game machine such as a pinball machine, and the like.

Figure 29A:
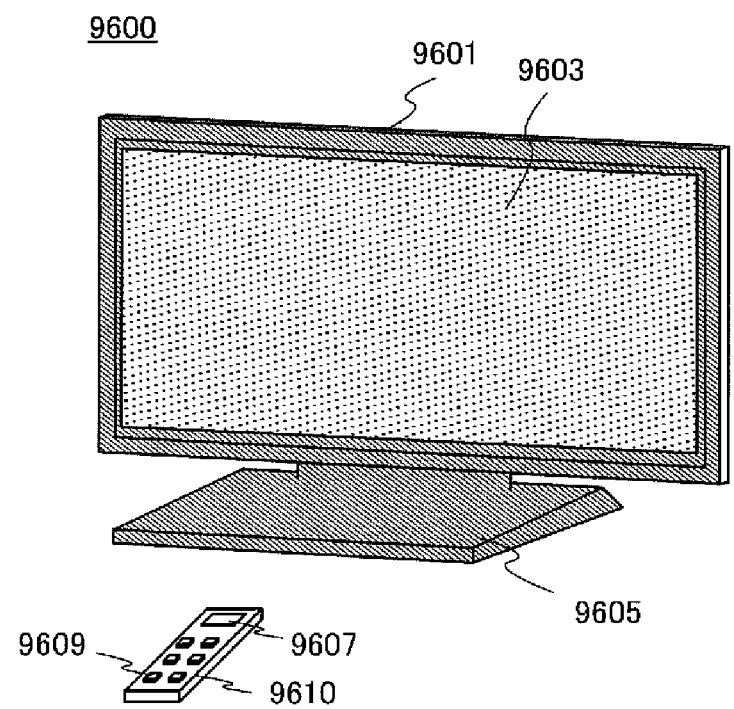
FIGS. 29A and 29B illustrate electronic devices including display devices according to one embodiment of the present invention.

FIG. 29A illustrates an example of a television set. In a television set 9600, a display portion 9603 is incorporated in a housing 9601. The display portion 9603 can display images. Here, the housing 9601 is supported by a stand 9605.

The television set 9600 can be operated with an operation switch of the housing 9601 or a separate remote controller 9610. Channels and volume can be controlled with operation keys 9609 of the remote controller 9610, so that images displayed on the display portion 9603 can be controlled. Further, the remote controller 9610 may be provided with a display portion 9607 for displaying data output from the remote controller 9610.

Note that the television set 9600 includes a receiver, a modem, and the like. With the receiver, general television broadcastings can be received. Further, when the television set is connected to a wire or wireless communication network through the modem, one-way (from a transmitter to a receiver) or two-way (between a transmitter and a receiver or between receivers) data communication can be performed.

Figure 29B:
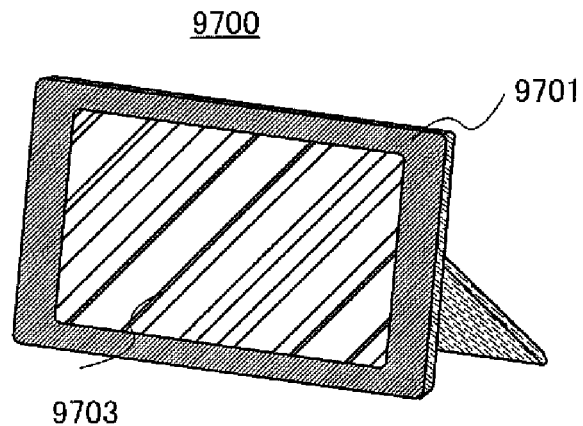

FIG. 29B illustrates an example of a digital photo frame. For example, in a digital photo frame 9700, a display portion 9703 is incorporated in a housing 9701. The display portion 9703 can display a variety of images. For example, the display portion 9703 can display data of an image photographed with a digital camera or the like and can function in a manner similar to that of a normal photo frame.

Note that the digital photo frame 9700 includes an operation portion, an external connection terminal (e.g., a USB terminal or a terminal which can be connected to a variety of cables such as USB cables), a recording medium insertion portion, and the like. Although these components may be provided on a surface on which the display portion is provided, it is preferable to provide them on a side surface or a back surface because the design of the digital photo frame is improved. For example, a memory which stores data of an image photographed with a digital camera is inserted in the recording medium insertion portion of the digital photo frame, so that the image data can be transferred and displayed on the display portion 9703.

Alternatively, the digital photo frame 9700 may transmit and receive data wirelessly. Through wireless communication, desired image data can be transferred and displayed.

Figure 30A:
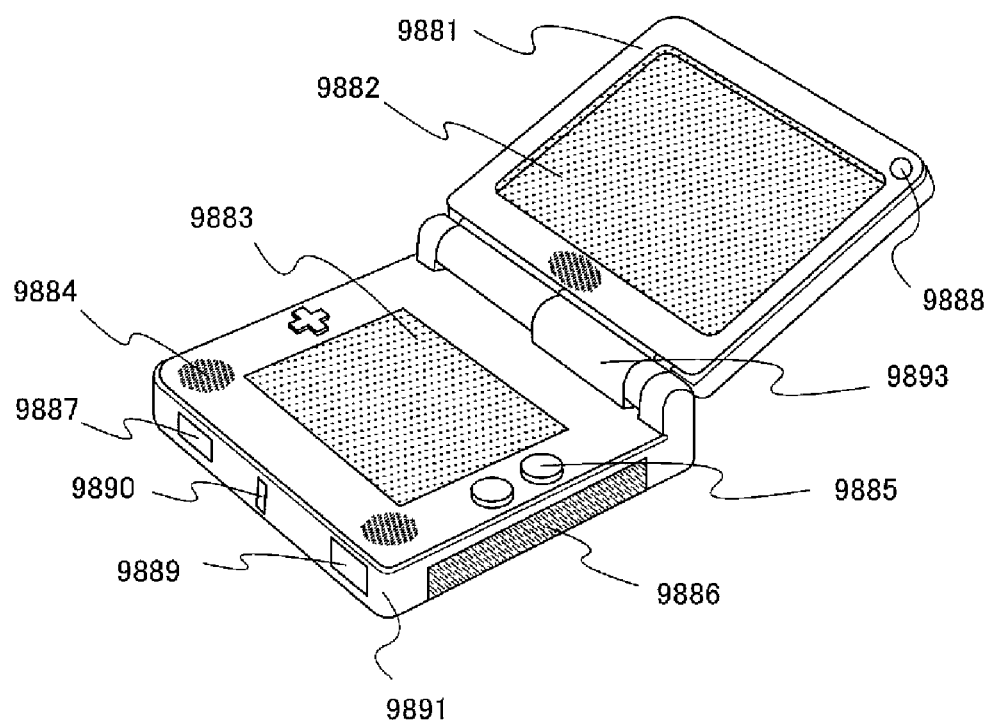
FIGS. 30A and 30B illustrate electronic devices including display devices according to one embodiment of the present invention.

FIG. 30A is a portable game machine, which includes two housings 9881 and 9891 connected to each other with a joint portion 9893 so that the portable game machine can be opened or folded. A display portion 9882 and a display portion 9883 are incorporated in the housing 9881 and the housing 9891, respectively. In addition, the portable game machine illustrated in FIG. 30A further includes a speaker portion 9884, a recording medium insertion portion 9886, an LED lamp 9890, input means (operation keys 9885, a connection terminal 9887, a sensor 9888 (having a function of measuring force, displacement, position, speed, acceleration, angular velocity, rotation number, distance, light, liquid, magnetism, temperature, chemical substance, sound, time, hardness, electric field, current, voltage, electric power, radial ray, flow rate, humidity, gradient, vibration, smell, or infrared ray), and a microphone 9889), and the like. Needless to say, the structure of the portable game machine is not limited to the above and other structures provided with at least a semiconductor device may be employed. The portable game machine can include other accessories as appropriate. The portable game machine illustrated in FIG. 30A has a function of reading a program or data stored in a recording medium to display it on the display portion, and a function of sharing information with another portable game machine through wireless communication. Note that the function of the portable game machine illustrated in FIG. 30A is not limited to those described above, and the portable game machine can have a variety of functions.

Figure 30B:
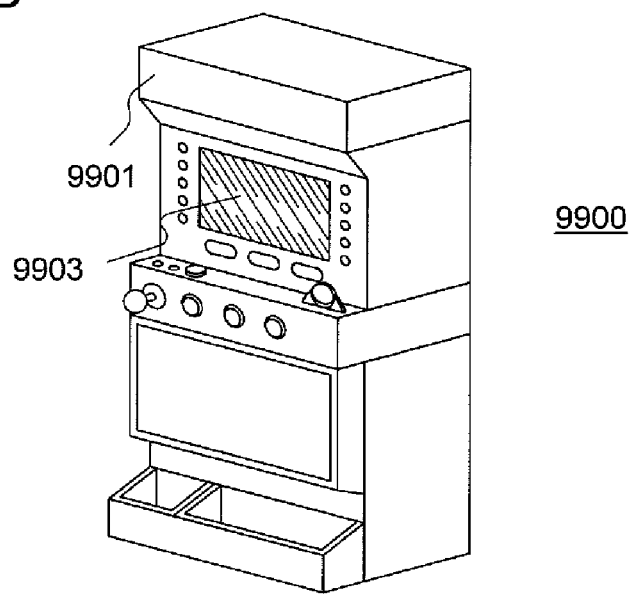

FIG. 30B illustrates an example of a slot machine, which is a large game machine. In a slot machine 9900, a display portion 9903 is incorporated in a housing 9901. In addition, the slot machine 9900 further includes an operation means such as a start lever or a stop switch, a coin slot, a speaker, and the like. Needless to say, the structure of the slot machine 9900 is not limited to the above and other structures provided with at least a semiconductor device may be employed. The slot machine 9900 can include other accessories as appropriate.

Figure 31A:
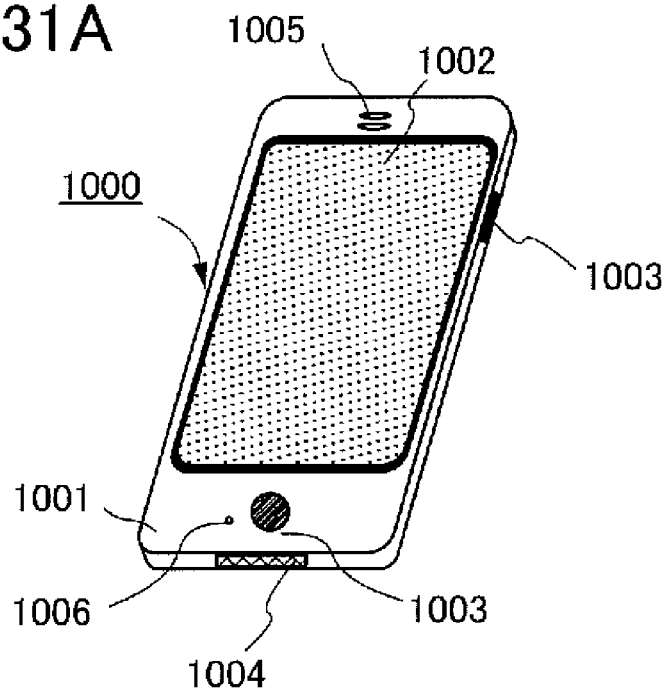
FIGS. 31A and 31B illustrate electronic devices including display devices according to one embodiment of the present invention.

FIG. 31A illustrates an example of a mobile phone. A mobile phone 1000 includes a display portion 1002 incorporated in a housing 1001, an operation button 1003, an external connection port 1004, a speaker 1005, a microphone 1006, and the like.

In the mobile phone 1000 illustrated in FIG. 31A, data can be input when a person touches the display portion 1002 with his/her finger or the like. In addition, operations such as making calls and composing mails can be performed when a person touches the display portion 1002 with his/her finger or the like.

The display portion 1002 has mainly three screen modes. The first mode is a display mode mainly for displaying images. The second mode is an input mode mainly for inputting data such as text. The third mode is a display-and-input mode in which two modes of the display mode and the input mode are combined.

For example, in the case of making a call or composing a mail, a text input mode mainly for inputting text is selected for the display portion 1002 so that text displayed on a screen can be input. In this case, it is preferable to display a keyboard or number buttons on substantially all the area of the screen of the display portion 1002.

By providing a detection device including a sensor for detecting inclination, such as a gyroscope or an acceleration sensor, inside the mobile phone 1000, display on the screen of the display portion 1002 can be automatically changed by determining the orientation of the mobile phone 1000 (whether the mobile phone 1000 is placed horizontally or vertically).

Further, the screen modes are changed by touching the display portion 1002 or operating the operation button 1003 of the housing 1001. Alternatively, the screen modes may be changed depending on the kind of an image displayed on the display portion 1002. For example, when a signal of an image displayed on the display portion is a signal of moving image data, the screen mode is changed into the display mode. When the signal is a signal of text data, the screen mode is changed into the input mode.

Further, in the input mode, when input by touching the display portion 1002 is not performed for a certain period while a signal detected by the optical sensor in the display portion 1002 is detected, the screen mode may be controlled so as to be changed from the input mode into the display mode.

The display portion 1002 can function also as an image sensor. For example, the image of a palm print, a fingerprint, or the like is taken when the display portion 1002 is touched with the palm or the finger, so that authentication can be performed. Further, by using a backlight which emits near-infrared light or a sensing light source which emits near-infrared light in the display portion, the image of a finger vein, a palm vein, or the like can be taken.

Figure 31B:
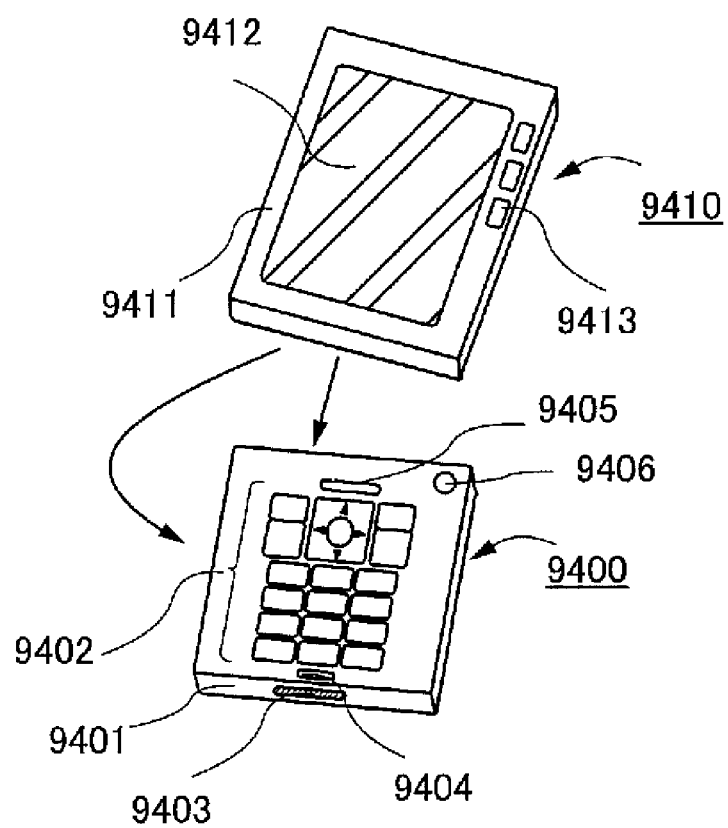

FIG. 31B illustrates an example of a mobile phone. The mobile phone in FIG. 31B includes a display device 9410 in a housing 9411, which has a display portion 9412 and operation buttons 9413, and a communication device 9400 in a housing 9401, which has operation buttons 9402, an external input terminal 9403, a microphone 9404, a speaker 9405, and a light-emitting portion 9406 which emits light when a phone call is received. The display device 9410 which has a display function can be detached from or attached to the communication device 9400 which has a phone function, in two directions represented by arrows. Thus, the display device 9410 and the communication device 9400 can be attached to each other along their short sides or long sides. Alternatively, in the case where only the display function is needed, the display device 9410 can be detached from the communication device 9400 and used alone. Images or input data can be transmitted and received by wireless or wire communication between the communication device 9400 and the display device 9410 each having a rechargeable battery.

Note that this embodiment can be combined with any of the other embodiments as appropriate.

This application is based on Japanese Patent Application serial no. 2009-184323 filed with Japan Patent Office on Aug. 7, 2009, the entire contents of which are hereby incorporated by reference.

What is claimed is:
1. A semiconductor device comprising:
   a pixel portion including a first thin film transistor over a substrate; and
   a driver circuit portion including a second thin film transistor over the substrate, the first thin film transistor comprising:
  a first gate electrode layer;
  a first gate insulating layer over the first gate electrode layer;
  a first semiconductor layer over the first gate insulating layer; and
  a first source electrode layer and a first drain electrode layer over the first semiconductor layer,
the second thin film transistor comprising:
  a second gate electrode layer;
  a second gate insulating layer over the second gate electrode layer;
  a second semiconductor layer over the second gate insulating layer; and
  a second source electrode layer and a second drain electrode layer over the second semiconductor layer,
wherein each of the first gate electrode layer, the first gate insulating layer, the first semiconductor layer, the first source electrode layer, and the first drain electrode layer is capable of transmitting light,
wherein a material of the first gate electrode layer is different from a material of the second gate electrode layer,
wherein resistance of the second gate electrode layer is lower than that of the first gate electrode layer,
wherein a material of the first source electrode layer and the first drain electrode layer is different from a material of the second source electrode layer and the second drain electrode layer, and
wherein resistance of the second source electrode layer and the second drain electrode layer is lower than that of the first source electrode layer and the first drain electrode layer.

2. The semiconductor device according to claim 1, wherein the second source electrode layer and the second drain electrode layer contain a metal material.

3. The semiconductor device according to claim 1, further comprising a capacitor portion over the substrate,
  wherein the capacitor portion includes a capacitor wiring and a capacitor electrode overlapping with the capacitor wiring, and
  wherein each of the capacitor wiring and the capacitor electrode is capable of transmitting light.

4. The semiconductor device according to claim 1, wherein resistance of a first region in the second semiconductor layer overlapping with the second source electrode layer and the second drain electrode layer is lower than that of a second region of the second semiconductor layer which is other than the first region.

5. The semiconductor device according to claim 1,
  wherein the semiconductor device further includes an insulating layer over the second semiconductor layer, and
  wherein a conductive layer which is provided over the insulating layer and overlaps with the second semiconductor layer.

6. The semiconductor device according to claim 5,
  wherein a material of the conductive layer is different from the material of the first gate electrode layer, and
  wherein resistance of the conductive layer is lower than that of the first gate electrode layer.

7. A semiconductor device comprising:
a pixel portion including a first thin film transistor over a substrate; and
a driver circuit portion including a second thin film transistor over the substrate,
the first thin film transistor comprising:
  a first gate electrode layer;
  a first gate insulating layer over the first gate electrode layer;
  a first semiconductor layer over the first gate insulating layer; and
  a first source electrode layer and a first drain electrode layer over the first semiconductor layer,
the second thin film transistor comprising:
  a second gate electrode layer;
  a second gate insulating layer over the second gate electrode layer;
  a second semiconductor layer over the second gate insulating layer; and
  a second source electrode layer and a second drain electrode layer over the second semiconductor layer,
wherein each of the first gate electrode layer, the first gate insulating layer, the first semiconductor layer, the first source electrode layer, and the first drain electrode layer is capable of transmitting light,
wherein a material of the first gate electrode layer is different from a material of the second gate electrode layer,
wherein resistance of the second gate electrode layer is lower than that of the first gate electrode layer,
wherein a material of the first source electrode layer and the first drain electrode layer is different from a material of the second source electrode layer and the second drain electrode layer,
wherein resistance of the second source electrode layer and the second drain electrode layer is lower than that of the first source electrode layer and the first drain electrode layer, and
wherein the first semiconductor layer includes an oxide semiconductor.

8. The semiconductor device according to claim 7, wherein the second source electrode layer and the second drain electrode layer contain a metal material.

9. The semiconductor device according to claim 7, further comprising a capacitor portion over the substrate,
  wherein the capacitor portion includes a capacitor wiring and a capacitor electrode overlapping with the capacitor wiring, and
  wherein each of the capacitor wiring and the capacitor electrode is capable of transmitting light.

10. The semiconductor device according to claim 7, wherein resistance of a first region in the second semiconductor layer overlapping with the second source electrode layer and the second drain electrode layer is lower than that of a second region of the second semiconductor layer which is other than the first region.

11. The semiconductor device according to claim 7,
  wherein the semiconductor device further includes an insulating layer over the second semiconductor layer, and
  wherein a conductive layer which is provided over the insulating layer and overlaps with the second semiconductor layer.

12. The semiconductor device according to claim 11,
  wherein a material of the conductive layer is different from the material of the first gate electrode layer, and
  wherein resistance of the conductive layer is lower than that of the first gate electrode layer.

13. A semiconductor device comprising:
a pixel portion including a first thin film transistor over a substrate; and
a driver circuit portion including a second thin film transistor over the substrate, the first thin film transistor comprising:
- a first gate electrode layer;
- a first gate insulating layer over the first gate electrode layer;
- a first semiconductor layer over the first gate insulating layer; and
- a first source electrode layer and a first drain electrode layer over the first semiconductor layer, the second thin film transistor comprising:
- a second gate electrode layer;
- a second gate insulating layer over the second gate electrode layer;
- a second semiconductor layer over the second gate insulating layer; and
- a second source electrode layer and a second drain electrode layer over the second semiconductor layer, wherein each of the first gate electrode layer, the first gate insulating layer, the first semiconductor layer, the first source electrode layer, and the first drain electrode layer is capable of transmitting light, wherein a material of the first gate electrode layer is different from a material of the second gate electrode layer, wherein resistance of the second gate electrode layer is lower than that of the first gate electrode layer, wherein a material of the first source electrode layer and the first drain electrode layer is different from a material of the second source electrode layer and the second drain electrode layer, wherein resistance of the second source electrode layer and the second drain electrode layer is lower than that of the first source electrode layer and the first drain electrode layer, and wherein the second semiconductor layer includes an oxide semiconductor.

14. The semiconductor device according to claim 13, wherein the second source electrode layer and the second drain electrode layer contain a metal material.

15. The semiconductor device according to claim 13, further comprising a capacitor portion over the substrate,
- wherein the capacitor portion includes a capacitor wiring and a capacitor electrode overlapping with the capacitor wiring, and
- wherein each of the capacitor wiring and the capacitor electrode is capable of transmitting light.

16. The semiconductor device according to claim 13, wherein resistance of a first region in the second semiconductor layer overlapping with the second source electrode layer and the second drain electrode layer is lower than that of a second region of the second semiconductor layer which is other than the first region.

17. The semiconductor device according to claim 13,
- wherein the semiconductor device further includes an insulating layer over the second semiconductor layer, and
- wherein a conductive layer which is provided over the insulating layer and overlaps with the second semiconductor layer.

18. The semiconductor device according to claim 17,
- wherein a material of the conductive layer is different from the material of the first gate electrode layer, and
- wherein resistance of the conductive layer is lower than that of the first gate electrode layer.

19. A method for manufacturing a semiconductor device comprising a pixel portion including a first thin film transistor and a driver circuit portion including a second thin film transistor, comprising the steps of:
- forming a first light-transmitting conductive film over a substrate;
- forming a second conductive film over the first light-transmitting conductive film, wherein resistance of the second conductive film is lower than that of the first light-transmitting conductive film;
- forming a first resist mask including a first region and a second region whose thickness is smaller than that of the first region over the second conductive film;
- etching with the use of the first resist mask so that the second conductive film and part of the first light-transmitting conductive film in the pixel portion, and part of the second conductive film and part of the first light-transmitting conductive film in the driver circuit portion are removed, thereby forming a first gate electrode layer of the first thin film transistor and a second gate electrode layer of the second thin film transistor;
- forming a first gate insulating film over the first gate electrode layer and a second gate insulating film over the second gate electrode layer;
- forming a first semiconductor layer over the first gate insulating film and a second semiconductor layer over the second gate insulating film;
- forming a third light-transmitting conductive film over the first semiconductor layer and the second semiconductor layer;
- forming a fourth conductive film over the third light-transmitting conductive film, wherein resistance of the fourth conductive film is lower than that of the third light-transmitting conductive film;
- forming a second resist mask including a third region and a fourth region whose thickness is smaller than that of the third region over the fourth conductive film; and
- etching with the use of the second resist mask so that part of the third light-transmitting conductive film and the fourth conductive film and in the pixel portion, and part of the fourth conductive film and part of the third light-transmitting conductive film in the driver circuit portion are removed, thereby forming a first source electrode layer and a first drain electrode layer over the first gate insulating film, and a second source electrode layer and a second drain electrode layer over the second gate insulating film.

20. The method for manufacturing a semiconductor device according to claim 19, wherein the first resist mask and the second resist mask are formed using a multi-tone mask.

21. The method for manufacturing a semiconductor device, according to claim 19, further comprising the steps of:
- forming an insulating layer over the first source electrode layer, the first drain electrode layer, the second source electrode layer and the second drain electrode layer;
- forming a fifth light-transmitting conductive film over the insulating layer;
- forming a sixth conductive film over the fifth light-transmitting conductive film, wherein resistance of the sixth conductive film is lower than that of the fifth light-transmitting conductive film;
- forming a third resist mask including a fifth region and a sixth region whose thickness is smaller than that of the fifth region over the sixth conductive film; and
- etching with the use of the third resist mask so that the sixth conductive film and part of the fifth light-transmitting conductive film in the pixel portion, and part of the fifth light-transmitting conductive film and part of the sixth conductive film in the driver circuit portion are removed thereby forming a first conductive layer overlapping with a first channel formation region of the first thin film transistor and a second conductive layer overlapping with a second channel formation region of the second thin film transistor.

22. The method for manufacturing a semiconductor device, according to claim 21, wherein the third resist mask is formed using a multi-tone mask.

* * * * *

UNITED STATES PATENT AND TRADEMARK OFFICE
CERTIFICATE OF CORRECTION

PATENT NO. : 8,324,626 B2
APPLICATION NO. : 12/851006
DATED : December 4, 2012
INVENTOR(S) : Hajime Kimura et al.

Page 1 of 1

It is certified that error appears in the above-identified patent and that said Letters Patent is hereby corrected as shown below:

Column 15, line 52, replace "A" with --Al--;

Column 18, line 52, replace "11013" with --110b--;

Column 20, line 5, replace "A" with --Al--;

Column 33, line 5, replace "all" with --an--;

Column 47, line 11, replace "all" with --an--;

Column 48, line 54, replace "5086-1" with --5086-1_$j$--.

Signed and Sealed this
Fifth Day of March, 2013

Teresa Stanek Rea
*Acting Director of the United States Patent and Trademark Office*